United States Patent
Izuha et al.

(10) Patent No.: US 10,381,395 B2
(45) Date of Patent: Aug. 13, 2019

(54) LIGHT CONTROL DEVICE WITH STACKED LIGHT CONTROL LAYERS

(71) Applicant: SONY CORPORATION, Tokyo (JP)

(72) Inventors: Kyoko Izuha, Kanagawa (JP); Tomoo Mitsunaga, Kanagawa (JP); Kouichi Harada, Kanagawa (JP); Koji Kadono, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 15/105,183

(22) PCT Filed: Nov. 12, 2014

(86) PCT No.: PCT/JP2014/079982
§ 371 (c)(1),
(2) Date: Jun. 16, 2016

(87) PCT Pub. No.: WO2015/098334
PCT Pub. Date: Jul. 2, 2015

(65) Prior Publication Data
US 2016/0315115 A1    Oct. 27, 2016

(30) Foreign Application Priority Data
Dec. 24, 2013  (JP) .................... 2013-265299

(51) Int. Cl.
*H01L 27/146*  (2006.01)
*H01L 27/14*  (2006.01)
(Continued)

(52) U.S. Cl.
CPC ...... *H01L 27/14649* (2013.01); *G02F 1/1347* (2013.01); *G02F 1/13439* (2013.01);
(Continued)

(58) Field of Classification Search
CPC ... G02F 1/13439; G02F 1/1347; H01L 27/14; H01L 27/14621; H01L 27/1464;
(Continued)

(56) References Cited

U.S. PATENT DOCUMENTS 8,792,525 B2 * 7/2014 Fermann ............. H01S 3/08059
372/26
2012/0025061 A1  2/2012  Izuha et al.
(Continued)

FOREIGN PATENT DOCUMENTS

CN    102347341 A    2/2012
CN    102738187 A    10/2012
(Continued)

OTHER PUBLICATIONS

International Search Report received for PCT Application No. PCT/JP2014/079982, dated Dec. 9, 2014, pp. 2.
(Continued)

*Primary Examiner* — Matthew L Reames
*Assistant Examiner* — Benjamin Tzu-Hung Liu
(74) *Attorney, Agent, or Firm* — Chip Law Group

(57) ABSTRACT

A light control device according to the present disclosure includes: stacked M (provided that M≥1) light control layers 113M in each of which a first nanocarbon film 114, a first intermediate layer 117A, a dielectric material layer 116, and a second intermediate layer 117B are stacked; and a second nanocarbon film 115 formed on the second intermediate layer 117B included in an M-th light control layer 113M. A voltage is applied to the first nanocarbon film 114 and the second nanocarbon film 115.

20 Claims, 31 Drawing Sheets

(51) Int. Cl.
   *H04N 5/355*   (2011.01)
   *H04N 9/04*    (2006.01)
   *G02F 1/1343*  (2006.01)
   *G02F 1/1347*  (2006.01)
   *H04N 5/225*   (2006.01)
   *H01L 27/30*   (2006.01)
   *H01L 27/32*   (2006.01)

(52) U.S. Cl.
   CPC .......... *H01L 27/14* (2013.01); *H01L 27/1464* (2013.01); *H01L 27/14621* (2013.01); *H01L 27/307* (2013.01); *H01L 27/3234* (2013.01); *H04N 5/2256* (2013.01); *H04N 5/355* (2013.01); *H04N 9/045* (2013.01)

(58) Field of Classification Search
   CPC ......... H01L 27/14649; H01L 27/14625; H01L 27/3234; H01L 27/307; H04N 5/2256; H04N 5/355; H04N 9/045
   See application file for complete search history.

(56) References Cited

U.S. PATENT DOCUMENTS

| | | | | |
|---|---|---|---|---|
| 2012/0249829 | A1* | 10/2012 | Izuha | H01L 27/14621 348/229.1 |
| 2012/0327959 | A1  | 12/2012 | Fermann et al. | |
| 2013/0334402 | A1  | 12/2013 | Izuha et al. | |
| 2014/0023321 | A1* | 1/2014  | Lu | G02B 6/10 385/40 |
| 2014/0056551 | A1* | 2/2014  | Liu | G02F 1/025 385/2 |
| 2014/0105553 | A1* | 4/2014  | Kim | G02F 1/011 385/123 |
| 2014/0160552 | A1* | 6/2014  | Seong | G02F 1/167 359/296 |

FOREIGN PATENT DOCUMENTS

| | | |
|---|---|---|
| CN | 103515403 A | 1/2014 |
| CN | 103563189 A | 2/2014 |
| EP | 2413182 A1 | 2/2012 |
| EP | 2506304 A2 | 10/2012 |
| JP | 2012-049485 A | 3/2012 |
| JP | 2012-216760 A | 11/2012 |
| JP | 2013-257482 A | 12/2013 |
| JP | 2014-017468 A | 1/2014 |
| JP | 2014-519205 A | 8/2014 |
| KR | 10-2012-0012390 A | 2/2012 |
| KR | 10-2012-0112016 A | 10/2012 |
| WO | 2012/166572 A | 12/2012 |
| WO | 2013/186985 A | 12/2013 |

OTHER PUBLICATIONS

Written Opinion received for PCT Application No. PCT/JP2014/079982, dated Dec. 9, 2014, pp. 7.

International preliminary report on patentability for PCT Application No. PCT/JP2014/079982, dated Jun. 28, 2016, 6 pages.

Oike Y. et al., CMOS Image Sensor with Per Column ADC and Programmable Compressed Sensing, IEEE Journal of Solid-State Circuit, Jan. 1, 2013, vol. 48, No. 1, p. 318-328.

Chen Chi-Fan et al., Contolling inelastic light scattering quantum pathways in graphene, Nature, Mar. 31, 2011, vol. 471, p. 617-620.

Emre o. et al., Broadband Optical Modulators Based on Graphene Supercapacitors, Nano Letters, Nov. 11, 2013, vol. 13, No. 12, p. 5851-5857.

* cited by examiner

FIG. 7A

| $R_1$ | $G_1$ | $R_0$ | $G_1$ | $R_1$ | $G_1$ | $R_0$ | $G_1$ |
|---|---|---|---|---|---|---|---|
| $G_0$ | $B_0$ | $G_0$ | $B_1$ | $G_0$ | $B_0$ | $G_0$ | $B_1$ |
| $R_0$ | $G_1$ | $R_1$ | $G_1$ | $R_0$ | $G_1$ | $R_1$ | $G_1$ |
| $G_0$ | $B_1$ | $G_0$ | $B_0$ | $G_0$ | $B_1$ | $G_0$ | $B_0$ |
| $R_1$ | $G_1$ | $R_0$ | $G_1$ | $R_1$ | $G_1$ | $R_0$ | $G_1$ |
| $G_0$ | $B_0$ | $G_0$ | $B_1$ | $G_0$ | $B_0$ | $G_0$ | $B_1$ |
| $R_0$ | $G_1$ | $R_1$ | $G_1$ | $R_0$ | $G_1$ | $R_1$ | $G_1$ |
| $G_0$ | $B_1$ | $G_0$ | $B_0$ | $G_0$ | $B_1$ | $G_0$ | $B_0$ |

FIG. 7B

| $R_1$ | $G_1$ | $B_1$ | $G_1$ | $R_1$ | $G_1$ | $B_1$ | $G_1$ |
|---|---|---|---|---|---|---|---|
| $G_0$ | $B_0$ | $G_0$ | $R_0$ | $G_0$ | $B_0$ | $G_0$ | $R_0$ |
| $B_1$ | $G_1$ | $R_1$ | $G_1$ | $B_1$ | $G_1$ | $R_1$ | $G_1$ |
| $G_0$ | $R_0$ | $G_0$ | $B_0$ | $G_0$ | $R_0$ | $G_0$ | $B_0$ |
| $R_1$ | $G_1$ | $B_1$ | $G_1$ | $R_1$ | $G_1$ | $B_1$ | $G_1$ |
| $G_0$ | $B_0$ | $G_0$ | $R_0$ | $G_0$ | $B_0$ | $G_0$ | $R_0$ |
| $B_1$ | $G_1$ | $R_1$ | $G_1$ | $B_1$ | $G_1$ | $R_1$ | $G_1$ |
| $G_0$ | $R_0$ | $G_0$ | $B_0$ | $G_0$ | $R_0$ | $G_0$ | $B_0$ |

FIG. 8A

| $G_1$ | $B_0$ | $G_1$ | $R_0$ | $G_1$ | $B_0$ | $G_1$ | $R_0$ |
|---|---|---|---|---|---|---|---|
| $G_0$ | $R_1$ | $G_0$ | $B_1$ | $G_0$ | $R_1$ | $G_0$ | $B_1$ |
| $G_1$ | $R_0$ | $G_1$ | $B_0$ | $G_1$ | $R_0$ | $G_1$ | $B_0$ |
| $G_0$ | $B_1$ | $G_0$ | $R_1$ | $G_0$ | $B_1$ | $G_0$ | $R_1$ |
| $G_1$ | $B_0$ | $G_1$ | $R_0$ | $G_1$ | $B_0$ | $G_1$ | $R_0$ |
| $G_0$ | $R_1$ | $G_0$ | $B_1$ | $G_0$ | $R_1$ | $G_0$ | $B_1$ |
| $G_1$ | $R_0$ | $G_1$ | $B_0$ | $G_1$ | $R_0$ | $G_1$ | $B_0$ |
| $G_0$ | $B_1$ | $G_0$ | $R_1$ | $G_0$ | $B_1$ | $G_0$ | $R_1$ |

FIG. 8B

| $G_0$ | $B_1$ | $G_1$ | $B_0$ | $G_0$ | $B_1$ | $G_1$ | $B_0$ |
|---|---|---|---|---|---|---|---|
| $R_1$ | $G_0$ | $R_0$ | $G_1$ | $R_1$ | $G_0$ | $R_0$ | $G_1$ |
| $G_0$ | $B_1$ | $G_1$ | $B_0$ | $G_0$ | $B_1$ | $G_1$ | $B_0$ |
| $R_1$ | $G_0$ | $R_0$ | $G_1$ | $R_1$ | $G_0$ | $R_0$ | $G_1$ |
| $G_0$ | $B_1$ | $G_1$ | $B_0$ | $G_0$ | $B_1$ | $G_1$ | $B_0$ |
| $R_1$ | $G_0$ | $R_0$ | $G_1$ | $R_1$ | $G_0$ | $R_0$ | $G_1$ |
| $G_0$ | $B_1$ | $G_1$ | $B_0$ | $G_0$ | $B_1$ | $G_1$ | $B_0$ |
| $R_1$ | $G_0$ | $R_0$ | $G_1$ | $R_1$ | $G_0$ | $R_0$ | $G_1$ |

FIG. 9A

| $G_1$ | $B_1$ | $G_0$ | $B_0$ | $G_1$ | $B_1$ | $G_0$ | $B_0$ |
|---|---|---|---|---|---|---|---|
| $R_0$ | $G_0$ | $R_1$ | $G_1$ | $R_0$ | $G_0$ | $R_1$ | $G_1$ |
| $G_0$ | $B_0$ | $G_1$ | $B_1$ | $G_0$ | $B_0$ | $G_1$ | $B_1$ |
| $R_1$ | $G_1$ | $R_0$ | $G_0$ | $R_1$ | $G_1$ | $R_0$ | $G_0$ |
| $G_1$ | $B_1$ | $G_0$ | $B_0$ | $G_1$ | $B_1$ | $G_0$ | $B_0$ |
| $R_0$ | $G_0$ | $R_1$ | $G_1$ | $R_0$ | $G_0$ | $R_1$ | $G_1$ |
| $G_0$ | $B_0$ | $G_1$ | $B_1$ | $G_0$ | $B_0$ | $G_1$ | $B_1$ |
| $R_1$ | $G_1$ | $R_0$ | $G_0$ | $R_1$ | $G_1$ | $R_0$ | $G_0$ |

FIG. 9B

| $B_0$ | $IR_1$ | $B_0$ | $IR_1$ |
|---|---|---|---|
| $G_0$ | $R_0$ | $G_0$ | $R_0$ |
| $B_0$ | $IR_1$ | $B_0$ | $IR_1$ |
| $G_0$ | $R_0$ | $G_0$ | $R_0$ |

FIG. 12

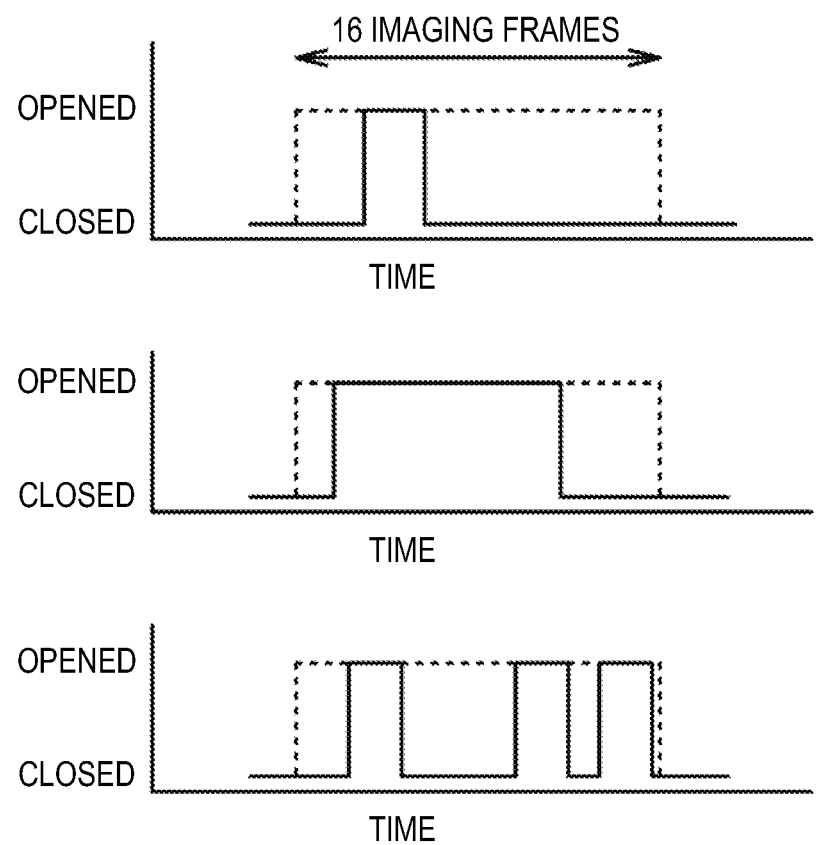

EXAMPLES OF SPECTRAL TRANSMITTANCE
CHARACTERISTICS OF ELECTROCHROMIC FILM

LIGHT CONTROL DEVICE WITH STACKED LIGHT CONTROL LAYERS

CROSS REFERENCE TO RELATED APPLICATIONS

This application is a U.S. National Phase of International Patent Application No. PCT/JP2014/079982 filed on Nov. 12, 2014, which claims priority benefit of Japanese Patent Application No. JP 2013-265299 filed in the Japan Patent Office on Dec. 24, 2013. Each of the above-referenced applications is hereby incorporated herein by reference in its entirety.

TECHNICAL FIELD

The present disclosure relates to a light control device, an imaging element, and an imaging device.

BACKGROUND ART

There is known a technology in which, in an imaging element, the dynamic range is expanded by controlling the quantity of incident light. For example, in JP 2012-049485A, a solid state imaging device including a semiconductor substrate having a light receiving surface on which photoelectric conversion units are formed to be partitioned in pixels arranged in a matrix configuration, an electrochromic film that is formed on the semiconductor substrate on the light incidence path for the photoelectric conversion unit in partial pixels selected from the pixels and of which the light transmittance changes from a first transmittance to a second transmittance in accordance with the applied voltage, a lower electrode formed on the lower side of the electrochromic film, and an upper electrode formed on the upper side of the electrochromic film is disclosed. Here, the upper electrode and the lower electrode are made of a nanocarbon material containing graphene or carbon nanotubes, or indium tin oxide.

CITATION LIST

Patent Literature

Patent Literature 1: JP 2012-049485A

SUMMARY OF INVENTION

Technical Problem

As shown in the schematic diagram in FIG. 31, the light transmittance of an electrochromic film has a wavelength dependence. Therefore, there is a problem that the light transmittance changes depending on the wavelength of the light incident on the electrochromic film.

Thus, an object of the present disclosure is to provide a light control device (light control element) in which there is no wavelength dependence of light transmittance and the time required for the change in light transmittance is short, and an imaging element and an imaging device including the light control device (light control element).

Solution to Problem

In order to achieve the above object, according to a first aspect of the present disclosure, there is provided a light control device (light control element) including:

stacked M (provided that M≥1) light control layers in each of which a first nanocarbon film, a first intermediate layer, a dielectric material layer, and a second intermediate layer are stacked; and a second nanocarbon film formed on the second intermediate layer included in an M-th light control layer.

A voltage is applied to the first nanocarbon film and the second nanocarbon film.

In order to achieve the above object, according to a second aspect of the present disclosure, there is provided a light control device (light control element) including:

a pair of electrodes; and a light control layer sandwiched by the pair of electrodes.

The light control layer has a stacked structure of a first dielectric material layer, a first intermediate layer, a first nanocarbon film doped with an impurity of a first conductivity type or not doped with an impurity, a second nanocarbon film doped with an impurity of a second conductivity type different from the first conductivity type or not doped with an impurity, a second intermediate layer, and a second dielectric material layer.

A voltage is applied to the pair of electrodes.

In order to achieve the above object, according to a third aspect of the present disclosure, there is provided a light control device (light control element) including:

a pair of electrodes; and a light control layer sandwiched by the pair of electrodes.

The light control layer has a stacked structure of a first dielectric material layer, a first intermediate layer, a nanocarbon film doped with an impurity or not doped with an impurity, a second intermediate layer, and a second dielectric material layer.

A voltage different from a voltage applied to the pair of electrodes is applied to the nanocarbon film.

In order to achieve the above object, according to a fourth aspect of the present disclosure, there is provided a light control device (light control element) including:

a pair of electrodes; and a stacked structure body in which P (provided that P≥1) light control layers sandwiched by the pair of electrodes are stacked.

A p-th light control layer (provided that 1≤p≤P) has a stacked structure of a first dielectric material layer, a first intermediate layer, a first nanocarbon film doped with an n-type impurity or not doped with an impurity, a second intermediate layer, a second dielectric material layer, a third intermediate layer, a second nanocarbon film doped with a p-type impurity or not doped with an impurity, and a fourth intermediate layer.

A third dielectric material layer is further formed on the fourth intermediate layer in a P-th light control layer.

A voltage different from a voltage applied to the first nanocarbon film is applied to the second nanocarbon film.

In order to achieve the above object, according to the first aspect of the present disclosure, there is provided an imaging element including:

a light receiving element (photoelectric conversion element); and a light control device (light control element) disposed on a light incidence side of the light receiving element.

The light control device includes stacked M (provided that M≥1) light control layers in each of which a first nanocarbon film, a first intermediate layer, a dielectric material layer, and a second intermediate layer are stacked, and a second nanocarbon film formed on the second intermediate layer included in an M-th light control layer.

A voltage is applied to the first nanocarbon film and the second nanocarbon film.

In order to achieve the above object, according to the second aspect of the present disclosure, there is provided an imaging element including:

a light receiving element (photoelectric conversion element); and a light control device (light control element) disposed on a light incidence side of the light receiving element.

The light control device includes a pair of electrodes, and a light control layer sandwiched by the pair of electrodes.

The light control layer has a stacked structure of a first dielectric material layer, a first intermediate layer, a first nanocarbon film doped with an impurity of a first conductivity type or not doped with an impurity, a second nanocarbon film doped with an impurity of a second conductivity type different from the first conductivity type or not doped with an impurity, a second intermediate layer, and a second dielectric material layer.

A voltage is applied to the pair of electrodes.

In order to achieve the above object, according to the third aspect of the present disclosure, there is provided an imaging element including:

a light receiving element (photoelectric conversion element); and a light control device (light control element) disposed on a light incidence side of the light receiving element, The light control device includes a pair of electrodes, and a light control layer sandwiched by the pair of electrodes.

The light control layer has a stacked structure of a first dielectric material layer, a first intermediate layer, a nanocarbon film doped with an impurity or not doped with an impurity, a second intermediate layer, and a second dielectric material layer, and A voltage different from a voltage applied to the pair of electrodes is applied to the nanocarbon film.

In order to achieve the above object, according to the fourth aspect of the present disclosure, there is provided an imaging element including:

a light receiving element (photoelectric conversion element); and a light control device (light control element) disposed on a light incidence side of the light receiving element.

The light control device includes a pair of electrodes, and a stacked structure body in which P (provided that P≥1) light control layers sandwiched by the pair of electrodes are stacked.

A p-th light control layer (provided that 1≤p≤P) has a stacked structure of a first dielectric material layer, a first intermediate layer, a first nanocarbon film doped with an n-type impurity or not doped with an impurity, a second intermediate layer, a second dielectric material layer, a third intermediate layer, a second nanocarbon film doped with a p-type impurity or not doped with an impurity, and a fourth intermediate layer.

A third dielectric material layer is further formed on the fourth intermediate layer in a P-th light control layer.

A voltage different from a voltage applied to the first nanocarbon film is applied to the second nanocarbon film.

In order to achieve the above object, according to the first aspect of the present disclosure, there is provided an imaging device (solid state imaging device) including imaging elements arranged in a two-dimensional matrix configuration.

At least part of the imaging elements arranged in a two-dimensional matrix configuration include a light receiving element (photoelectric conversion element) and a light control device (light control element) disposed on a light incidence side of the light receiving element.

The light control device includes stacked M (provided that M≥1) light control layers in each of which a first nanocarbon film, a first intermediate layer, a dielectric material layer, and a second intermediate layer are stacked, and a second nanocarbon film formed on the second intermediate layer included in an M-th light control layer.

A voltage is applied to the first nanocarbon film and the second nanocarbon film.

In order to achieve the above object, according to the second aspect of the present disclosure, there is provided an imaging device (solid state imaging device) including imaging elements arranged in a two-dimensional matrix configuration.

At least part of the imaging elements arranged in a two-dimensional matrix configuration include a light receiving element (photoelectric conversion element) and a light control device (light control element) disposed on a light incidence side of the light receiving element.

The light control device includes a pair of electrodes and a light control layer sandwiched by the pair of electrodes.

The light control layer has a stacked structure of a first dielectric material layer, a first intermediate layer, a first nanocarbon film doped with an impurity of a first conductivity type or not doped with an impurity, a second nanocarbon film doped with an impurity of a second conductivity type different from the first conductivity type or not doped with an impurity, a second intermediate layer, and a second dielectric material layer.

A voltage is applied to the pair of electrodes.

In order to achieve the above object, according to the third aspect of the present disclosure, there is provided an imaging device (solid state imaging device) including imaging elements arranged in a two-dimensional matrix configuration.

At least part of the imaging elements arranged in a two-dimensional matrix configuration include a light receiving element (photoelectric conversion element) and a light control device (light control element) disposed on a light incidence side of the light receiving element.

The light control device includes a pair of electrodes and a light control layer sandwiched by the pair of electrodes.

The light control layer has a stacked structure of a first dielectric material layer, a first intermediate layer, a nanocarbon film doped with an impurity or not doped with an impurity, a second intermediate layer, and a second dielectric material layer.

A voltage different from a voltage applied to the pair of electrodes is applied to the nanocarbon film.

In order to achieve the above object, according to the fourth aspect of the present disclosure, there is provided an imaging device (solid state imaging device) including imaging elements arranged in a two-dimensional matrix configuration.

At least part of the imaging elements arranged in a two-dimensional matrix configuration include a light receiving element (photoelectric conversion element) and a light control device (light control element) disposed on a light incidence side of the light receiving element.

The light control device includes
a pair of electrodes and
a stacked structure body in which P (provided that P≥1) light control layers sandwiched by the pair of electrodes are stacked.

A p-th light control layer (provided that 1≤p≤P) has a stacked structure of a first dielectric material layer, a first intermediate layer, a first nanocarbon film doped with an n-type impurity or not doped with an impurity, a second intermediate layer, a second dielectric material layer, a third intermediate layer, a second nanocarbon film doped with a p-type impurity or not doped with an impurity, and a fourth intermediate layer.

A third dielectric material layer is further formed on the fourth intermediate layer in a P-th light control layer.

A voltage different from a voltage applied to the first nanocarbon film is applied to the second nanocarbon film.

Advantageous Effects of Invention

In the light control device (light control element), the imaging element, and the imaging device according to the first aspect of the present disclosure, since the light control layer including the first nanocarbon film and the second nanocarbon film is provided and a voltage is applied to the first nanocarbon film and the second nanocarbon film, the light transmittance of the light control layer can be controlled.

In the light control device (light control element), the imaging element, and the imaging device according to the second aspect of the present disclosure, since the light control layer has a stacked structure of the first dielectric material layer, the first nanocarbon film doped with an impurity of the first conductivity type or not doped with an impurity, the second nanocarbon film doped with an impurity of the second conductivity type or not doped with an impurity, and the second dielectric material layer, when a voltage is applied to the pair of electrodes, a positive or negative charge is induced in either one of the first nanocarbon film and the second nanocarbon film and a negative or positive charge is induced in the other in accordance with the polarity of the applied voltage. Consequently, the wavelength band of light that can pass through the light control layer at a high light transmittance is determined. That is, the light transmittance of the light control layer can be controlled. Here, when the first nanocarbon film is doped with an impurity of the first conductivity type and the second nanocarbon film is doped with an impurity of the second conductivity type, a p-n junction is formed at the interface between the first nanocarbon film and the second nanocarbon film; and when a reverse bias voltage is applied to the pair of electrodes, a charge is retained in each of the first nanocarbon film and the second nanocarbon film. Alternatively, even in the case where the first nanocarbon film and/or the second nanocarbon film is not doped with an impurity, when an appropriate voltage is applied to the pair of electrodes, a charge is retained in each of the first nanocarbon film and the second nanocarbon film.

In the light control device (light control element), the imaging element, and the imaging device according to the third aspect of the present disclosure, since the light control layer has a stacked structure of the first dielectric material layer, the nanocarbon film doped with an impurity or not doped with an impurity, and the second dielectric material layer and a voltage different from the voltage applied to the pair of electrodes is applied to the nanocarbon film, the light transmittance of the light control layer can be controlled. In the light control device (light control element), the imaging element, and the imaging device according to the fourth aspect of the present disclosure, since a stacked structure body in which P (provided that P≥1) light control layers having a prescribed configuration are stacked is provided and a voltage different from the voltage applied to the first nanocarbon film is applied to the second nanocarbon film, the light transmittance of the light control layer can be controlled.

Furthermore, in the light control device etc. according to the second aspect to the fourth aspect of the present disclosure, since a current does not flow between the pair of electrodes, low power consumption can be achieved.

In addition, in the light control device etc. according to the first aspect to the fourth aspect of the present disclosure, since the intermediate layer that functions as a planarization layer and also functions as an anti-reflection layer is formed between the nanocarbon film and the dielectric material layer, the flatness between the nanocarbon film and the dielectric material layer can be improved and the adhesiveness can thus be improved, and the occurrence of unneeded reflection of incident light between the nanocarbon film and the dielectric material layer can be suppressed. By selecting the applied voltage (a prescribed voltage $V_0$) appropriately, the effective light transmittance of the light control layer for light of wavelengths not less than a wavelength $\lambda_0$ can be controlled; thus, the value of the wavelength $\lambda_0$ may be set to, for example, blue color (e.g. 380 nm) and setting may be made so that the light transmittance for light of wavelengths not less than the wavelength $\lambda_0$ (for example, light having a wavelength band of visible light or more) when the prescribed voltage $V_0$ is applied is almost 100%, and thereby a desired value of light transmittance can be obtained accurately and easily and setting to a desired value of light transmittance can be made. In addition, in the nanocarbon film, there is no wavelength dependence of light transmittance, and the time required for the change in light transmittance is short. The effects described in this specification are only examples and are not limitative ones, and there may be additional effects.

BRIEF DESCRIPTION OF DRAWINGS

FIG. 7A and FIG. 7B are diagrams schematically showing layouts of imaging element groups in imaging devices of Embodiment 6.

FIG. 8A and FIG. 8B are diagrams schematically showing layouts of imaging element groups in imaging devices of Embodiment 6.

FIG. 9B and FIG. 9B are diagrams schematically showing layouts of imaging element groups in imaging devices of Embodiment 6 and Embodiment 7, respectively.

FIG. 12 is a diagram schematically showing a layout of imaging element groups in an imaging device of Embodiment 9.

FIG. 19 is a diagram showing examples of the random pulse voltage used in Embodiment 9.

DESCRIPTION OF EMBODIMENTS

Figure 1A:
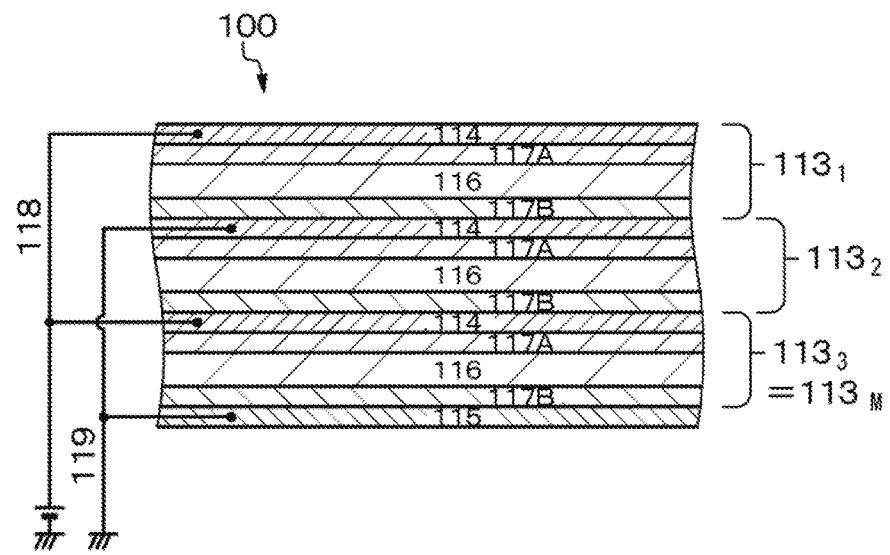
FIG. 1A and FIG. 1B are schematic cross-sectional views of light control devices of Embodiment 1.

Hereinbelow, the present disclosure is described based on Embodiments with reference to the drawings, but the present disclosure is not limited to Embodiments, and the various numerical values and materials in Embodiments are only examples. The description is given in the following order.
1. Overall description of the light control device according to the first aspect to the fourth aspect of the present disclosure, the imaging element according to the first aspect to the fourth aspect of the present disclosure, and the imaging device according to the first aspect to the fourth aspect of the present disclosure
2. Embodiment 1 (the light control device according to the first aspect of the present disclosure)
3. Embodiment 2 (the light control device according to the second aspect of the present disclosure)
4. Embodiment 3 (a modification of Embodiment 2)
5. Embodiment 4 (the light control device according to the third aspect of the present disclosure)
6. Embodiment 5 (the light control device according to the fourth aspect of the present disclosure)
7. Embodiment 6 (the imaging element according to the first aspect to the fourth aspect of the present disclosure and the imaging device according to the first aspect to the fourth aspect of the present disclosure)
8. Embodiment 7 (a modification of Embodiment 6)
9. Embodiment 8 (modifications of Embodiment 6 to Embodiment 7)
10. Embodiment 9 (modifications of Embodiment 6 or Embodiment 7)
11. Embodiment 10 (modifications of Embodiment 9)

12. Embodiment 11 (modifications of Embodiment 9 to Embodiment 10)
13. Embodiment 12 (modifications of Embodiment 9 to Embodiment 11), etc.

[Overall Description of the Light Control Device According to the First Aspect to the Fourth Aspect of the Present Disclosure, the Imaging Element According to the First Aspect to the Fourth Aspect of the Present Disclosure, and the Imaging Device According to the First Aspect to the Fourth Aspect of the Present Disclosure]

In the following description, the light control device according to the first aspect of the present disclosure, the light control device included in the imaging element according to the first aspect of the present disclosure, and the light control device included in the imaging device according to the first aspect of the present disclosure are hereinafter collectively referred to as "the light control device etc. according to the first aspect of the present disclosure." Further, the light control device according to the second aspect of the present disclosure, the light control device included in the imaging element according to the second aspect of the present disclosure, and the light control device included in the imaging device according to the second aspect of the present disclosure are hereinafter collectively referred to as "the light control device etc. according to the second aspect of the present disclosure." Further, in the following description, the light control device according to the third aspect of the present disclosure, the light control device included in the imaging element according to the third aspect of the present disclosure, and the light control device included in the imaging device according to the third aspect of the present disclosure are hereinafter collectively referred to as "the light control device etc. according to the third aspect of the present disclosure." Further, in the following description, the light control device according to the fourth aspect of the present disclosure, the light control device included in the imaging element according to the fourth aspect of the present disclosure, and the light control device included in the imaging device according to the fourth aspect of the present disclosure are hereinafter collectively referred to as "the light control device etc. according to the fourth aspect of the present disclosure."

In the imaging device according to the second aspect to the fourth aspect of the present disclosure, a form in which the pair of electrodes are shared between imaging elements including the light control device is possible, or a form in which the pair of electrodes shared between imaging elements including the light control device are provided to be also shared with an imaging element not including the light control device is possible.

In the light control device etc. according to the first aspect of the present disclosure, a form in which the light transmittance in the light control layer is controlled by a voltage being applied to the first nanocarbon film and the second nanocarbon film is possible. In the light control device etc. according to the first aspect of the present disclosure including such a form, a form in which, when M is an odd number, the first nanocarbon films in odd positions are connected to a first interconnection and the first nanocarbon films in even positions and the second nanocarbon film are connected to a second interconnection, and when M is an even number, the first nanocarbon films in odd positions and the second nanocarbon film are connected to the first interconnection and the first nanocarbon films in even positions are connected to the second interconnection is possible.

In the light control device etc. according to the second aspect of the present disclosure including the preferred forms mentioned above, a form in which a voltage is applied to the pair of electrodes to control the amount of charge generated in the first nanocarbon film and/or the second nanocarbon film and thereby the light transmittance in the light control layer is controlled is possible.

Further, in the light control device etc. according to the second aspect of the present disclosure including the various preferred forms described above, a form in which
N light control layers and (N+1) electrodes are provided,
the N light control layers and the (N+1) electrodes are alternately stacked, and
the electrodes in odd positions are connected to the first interconnection and the electrodes in even positions are connected to the second interconnection is possible.

Further, in the light control device etc. according to the second aspect of the present disclosure including the various preferred forms described above, a form in which
the first conductivity type is the n-type and the second conductivity type is the p-type, and
a voltage higher than the voltage applied to a second electrode facing the second nanocarbon film via the second dielectric material layer is applied to a first electrode facing the first nanocarbon film via the first dielectric material layer is possible. That is, by employing such a form, a negative charge is induced in the first nanocarbon film and a positive charge is induced in the second nanocarbon film. Here, when the first nanocarbon film is doped with an n-type impurity and the second nanocarbon film is doped with a p-type impurity, a p-n junction is formed at the interface between the first nanocarbon film and the second nanocarbon film, and a charge is retained in each of the first nanocarbon film and the second nanocarbon film while a reverse bias voltage is applied to the pair of electrodes. As a result of the above, the wavelength band of light that can pass through the light control layer at a high light transmittance is determined.

In the light control device etc. according to the third aspect of the present disclosure including the preferred forms mentioned above, a form in which the impurity is of the p-type and a voltage higher than the voltage applied to the pair of electrodes is applied to the nanocarbon film is possible. Alternatively, a form in which the impurity is of the n-type and a voltage lower than the voltage applied to the pair of electrodes is applied to the nanocarbon film is possible.

In the light control device etc. according to the fourth aspect of the present disclosure including the preferred forms mentioned above, a form in which a voltage not more than the voltage applied to the second nanocarbon film and not less than the voltage applied to the first nanocarbon film is applied to the pair of electrodes is possible. In the light control device etc. according to the fourth aspect of the present disclosure including such a form, a form in which the first nanocarbon film is connected to the first interconnection and the second nanocarbon film is connected to the second interconnection is possible.

In the light control device etc. according to the first aspect to the fourth aspect of the present disclosure including the various preferred forms described above, a form in which the first nanocarbon film, the second nanocarbon film, and the nanocarbon film are formed of graphene is possible, but not limited to this, also a form of being formed of carbon nanotubes or fullerenes is possible. Since the thickness of graphene is the thickness of one layer of atoms, the thickness of the light control device can be reduced and reduction in the height (thickness) of the imaging element or the imaging device can be achieved by forming the nanocarbon film out of graphene.

A form in which the material that forms the first intermediate layer and the second intermediate layer in the light control device etc. according to the first aspect to the third aspect of the present disclosure including the various preferred forms described above or the material that forms the first intermediate layer, the second intermediate layer, the third intermediate layer, and the fourth intermediate layer in the light control device etc. according to the fourth aspect of the present disclosure including the various preferred forms described above is at least one material selected from the group consisting of titanium dioxide, titanium nitride, chromium oxide, amorphous silicon, magnesium fluoride, silicon nitride, and silicon oxide is possible.

In the imaging element or the imaging device according to the first aspect to the fourth aspect of the present disclosure including the various preferred forms described above, a form in which a color filter layer is disposed on the light incidence side of the light receiving element is possible, and in this case, in the imaging element including the light control device, a form in which the color filter layer is disposed on the light incidence side of the light control device is possible.

Further, in the imaging element or the imaging device according to the first aspect to the fourth aspect of the present disclosure including the various preferred forms described above, a form in which the imaging element further includes a light blocking film is possible.

Further, in the imaging device according to the first aspect to the fourth aspect of the present disclosure including the various preferred forms described above, a form in which
the light control device is provided in imaging elements arranged on a row basis, alternatively
the light control device is provided in imaging elements arranged on a column basis, or alternatively
the light control device is provided in all the imaging elements is possible.

Further, in the imaging device according to the first aspect to the fourth aspect of the present disclosure including the various preferred forms described above, a configuration including a random pulse voltage generation and transmission device that generates a random pulse voltage on the basis of a signal processing algorithm and transmits the generated random pulse voltage to the imaging element including the light control device is possible. Such a configuration may be referred to as "random exposure" for the sake of convenience. In this case, a configuration in which one random pulse voltage generation and transmission device is disposed for a plurality of imaging elements including the light control device is possible, or a configuration in which one random pulse voltage generation and transmission device is disposed for one imaging element including the light control device is possible. Further, in the imaging device according to the first aspect to the fourth aspect of the present disclosure including the various preferred forms and configurations described above, a form in which the random pulse voltage has positive and negative polarities is possible.

Alternatively, in the imaging device according to the first aspect to the fourth aspect of the present disclosure including the various preferred forms described above, a configuration in which a pulse voltage calculated on the basis of an output signal obtained by the imaging element including the light control device is applied is possible. Also such a configuration may be referred to as "random exposure" for the sake of convenience.

Further, in the imaging device according to the first aspect to the fourth aspect of the present disclosure including the various preferred forms and configurations described above, a configuration in which the image output signals from the imaging elements including the light control device are thinned out spatially and temporally and thereby the image output signals are compressed is possible.

Further, in the imaging device according to the first aspect to the fourth aspect of the present disclosure including the various preferred forms and configurations described above, a form in which
imaging elements arranged in a two-dimensional matrix configuration are provided on a first semiconductor chip,
the random pulse voltage generation and transmission device that generates a random pulse voltage and transmits the generated random pulse voltage to the imaging element including the light control device is provided on a second semiconductor chip,
the first semiconductor chip and the second semiconductor chip are stacked, and
the light control device and the random pulse voltage generation and transmission device are connected via through-silicon vias (TSVs) is possible, or a form of being connected via bumps (a form based on what is called a chip-on-chip system) is possible. In such a form, the imaging element may be configured as a back-side illumination type, but is not limited to this, and may be configured as a front-side illumination type.

Further, in the imaging device according to the first aspect to the fourth aspect of the present disclosure including the various preferred forms and configurations described above, a form in which
the random pulse voltage generation and transmission device that generates a random pulse voltage and transmits the generated random pulse voltage to the imaging element including the light control device is provided, and
the light control device and the random pulse voltage generation and transmission device are connected by connection lines formed of a nanocarbon film or a transparent conductive material layer
is possible.

Further, in the imaging device according to the first aspect to the fourth aspect of the present disclosure including the various preferred forms and configurations described above, a form in which
imaging elements are arranged in a two-dimensional matrix configuration in a first direction and a second direction,
the first nanocarbon film extends in the first direction and is shared between the imaging elements arranged in the first direction,
the second nanocarbon film extends in the second direction and is shared between the imaging elements arranged in the second direction, and
a positive-polarity random pulse voltage is applied to the first nanocarbon film and a negative-polarity random pulse voltage is applied to the second nanocarbon film is possible. In this case, a form in which an end portion of the first nanocarbon film extending in the first direction is patterned in a comb electrode configuration and an end portion of the second nanocarbon film extending in the second direction is patterned in a comb electrode configuration is possible.

The pair of electrodes in the light control device etc. according to the second to the fourth aspect of the present disclosure may be formed of a nanocarbon film, or may be formed of a transparent conductive material layer; or one of the pair of electrodes may be formed of a nanocarbon film and the other may be formed of a transparent conductive material layer. As the material that forms the transparent conductive material layer, ITO (an indium-tin composite oxide, including Sn-doped $In_2O_3$, crystalline ITO, and amorphous ITO), IZO (an indium-zinc composite oxide), AZO (zinc oxide doped with aluminum oxide), GZO (gallium-doped zinc oxide), AlMgZnO (zinc oxide doped with aluminum oxide and magnesium oxide), an indium-gallium composite oxide (IGO), In—$GaZnO_4$ (IGZO), IFO (F-doped $In_2O_3$), antimony-doped $SnO_2$ (ATO), FTO (F-doped $SnO_2$), tin oxide ($SnO_2$), zinc oxide (ZnO), B-doped ZnO, InSn-ZnO, or ITiO (Ti-doped $In_2O_3$) may be illustrated. Also the material that forms the first interconnection, the second interconnection, and the connection line may be the same as above.

The first dielectric material layer, the second dielectric material layer, and the third dielectric material layer need to be formed of a material that is transparent to the light incident on the light control device etc. according to the first aspect to the fourth aspect of the present disclosure. As the insulating material that forms the first dielectric material layer, the second dielectric material layer, and the third dielectric material layer, known insulating materials, such as $SiO_2$-based materials such as $SiO_2$, NSG (non-doped silicate glass), BPSG (boron phosphorus silicate glass), PSG, BSG, AsSG, PbSG, SbSG, SOG (spin-on glass), SiOC, and SiOF; SiN-based materials including SiON and SiCN; metal oxides such as aluminum oxide ($Al_2O_3$), titanium oxide ($TiO_2$), ZnO, indium oxide ($In_2O_3$), tin oxide ($SnO_2$), gallium oxide ($Ga_2O_3$), tellurium oxide ($TeO_2$), germanium oxide ($GeO_2$), cadmium oxide (CdO), tungsten oxide ($WO_3$), and molybdenum oxide ($MoO_3$); metal nitrides; and metal oxynitrides, may be given; and these may be used singly or in combination as appropriate. As the method for forming the first dielectric material layer, the second dielectric material layer, and the third dielectric material layer, known methods such as various CVD methods, the application method, various PVD methods including the sputtering method and the vacuum deposition method, various printing methods such as the screen printing method, and the sol-gel method may be given.

Alternatively, in the light control device etc. according to the second aspect of the present disclosure, as the first dielectric material layer and the second dielectric material layer, a material with a high density of polarization charge which, when a voltage is applied to the pair of electrodes, can induce a charge in the first nanocarbon film and the second nanocarbon film without causing insulation breakdown is preferably used. In order to increase the amount of charge stored in the nanocarbon film by voltage application, it is preferable to use a dielectric material with a large relative permittivity (a paraelectric material or a high dielectric material), for example a dielectric material with a relative permittivity of 2.0 or more, preferably with a relative permittivity of 4.0 or more, and more preferably with a relative permittivity of 8.0 or more, as the dielectric material that forms the first dielectric material layer and the second dielectric material layer. Also a ferroelectric material having spontaneous polarization may be used as the dielectric material that forms the first dielectric material layer and the second dielectric material layer. Alternatively, organic substances such as polyvinylidene fluoride (PVDF) (relative permittivity: approximately 10), high density polyethylene (HDPE), and amorphous fluorine resins, ionic liquids, liquid crystals, etc. may be given. In general, inorganic oxides have high dielectricity and insulating properties, and on the other hand have low transmissivity in the far-infrared region. In the case of performing light transmittance control in the far-infrared region, $CaF_2$ or the like, which has high transmissivity in the far-infrared region, is preferably used as the dielectric material that forms the first dielectric material layer and the second dielectric material layer, for example. Also a metamaterial may be used as the dielectric material. The relative permittivity etc. of various dielectric materials are shown in Table 1 below. The above description can be applied also to the light control device etc. according to the first aspect and the third aspect to the fourth aspect of the present disclosure.

TABLE 1

| Dielectric material | Relative permittivity | Insulation breakdown voltage (MV/cm) | Charge density ($\mu C/cm^2$) |
|---|---|---|---|
| $SiO_2$ | 4 | 10 | 3.5 |
| $Al_2O_3$ | 8.2 | 8.2 | 6.0 |
| h-BN | 4 | 20 | 7.1 |
| $HfO_2$ | 18.5 | 7.4 | 12.0 |
| $ZrO_2$ | 29 | 6 | 15.4 |
| ZnO | 7.9 | | |
| $TiO_2$ | 8.5 | | |
| IGZO | 9 | | |
| SiN | 7 | 40 | 2.5 |
| GaN | 9.5 | | |
| STO | 140-200 | 2 | 24.8-35.4 |
| BTO | 200 | 0.4 | 7.1 |
| PZT | 700 | 0.5 | 30.9 |
| PTO | 100-200 | 0.675 | 6.1-11.9 |
| PLZT | 200 | 3 | 53.1 |
| $CaF_2$ | 6.6 | 0.3 | 0.17 |
| HDPE | 2.3 | | |

Here, "h-BN" denotes hexagonal boron nitride, "STO" strontium titanate ($SrTiO_3$), "BTO" barium titanate, "PZT" lead zirconate titanate, "PTO" lead titanate, and "PLZT" lead lanthanum zirconate titanate ($(Pb,La)(Zr,Tr)O_3$).

As the light receiving element in the imaging element or the imaging device according to the first aspect to the fourth aspect of the present disclosure, specifically a photosensor (photodiode) may be given; and a CMOS image sensor or a CCD image sensor is formed by using the light receiving element. Alternatively, a bolometer-type light receiving element may be formed. The imaging element or the imaging device itself may be an imaging element or an imaging device of a known configuration and a known structure.

Since the light transmittance per nanocarbon film is approximately 97.7% (light absorptance being approximately 2.3%), a light control device including a plurality of light control layers may be used in order to reduce the light transmittance greatly. For example, in a light control device in which 60 nanocarbon films are stacked, the light transmittance can be reduced up to $0.977^{60}$=approximately 25% as a whole.

Chemical doping may be performed in order to dope the nanocarbon film with an impurity of the first conductivity type or the second conductivity type, for example. To perform chemical doping, specifically, a dopant layer may be formed on the nanocarbon film. The dopant layer may be an electron-accepting (p-type) dopant layer, or may be an electron-donating (n-type) dopant layer. As the material that forms the electron-accepting (p-type) dopant layer, chlorides such as $AuCl_3$, $HAuCl_4$, and $PtCl_4$; acids such as $HNO_3$, $H_2SO_4$, HCl, and nitromethane; group III elements such as boron and aluminum; and electron-withdrawing molecules such as oxygen may be given; and as the material that forms the electron-donating (n-type) dopant layer, in addition to group V elements such as nitrogen and phosphorus, pyridine-based compounds, nitrides, alkali metals, and electron-donating molecules such as aromatic compounds having an alkyl group may be given.

As necessary, the thickness of the dielectric material layer may be adjusted so that the light of a wavelength to be controlled in light transmittance is multiply reflected in the light control layer. Thereby, the light transmittance during transparency of the light control layer can be brought close to 100%.

As necessary, metal nanoparticles or metal nanowires may be formed on or above the nanocarbon film to utilize the surface plasmon polariton phenomenon of them; thereby, the light transmittance per nanocarbon film can be made lower than 97.7%, for example.

The nanocarbon film may be formed of graphene as described above; graphene refers to a sheet-like substance of $sp^2$-bonded carbon atoms with the thickness of one atom, and has a hexagonal lattice structure like a honeycomb composed of carbon atoms and the bonds between them. As advantages of using graphene of such characteristics for electronic devices such as imaging elements, imaging devices, light control devices, and shutter devices, the following can be given: the light transmittance during transparency per light control layer is as high as almost 100%; the sheet resistance value per light control layer is as low as 1 kΩ/□; and the film thickness is as small as 0.3 nm.

Graphene has the characteristic that the light transmittance changes by application of a voltage, as described above. Variations of the forbidden band based on variations of the Fermi level $E_f$ in the band structure of graphene are schematically shown in FIG. 29A, FIG. 29B, FIG. 29C, and FIG. 29D.

Figure 29A:
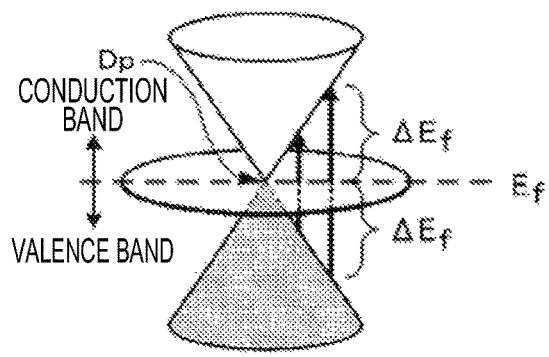
FIG. 29A, FIG. 29B, FIG. 29C, and FIG. 29D are diagrams schematically showing variations of the forbidden band based on variations of the Fermi level $E_f$ in the band structure of graphene.

As shown in FIG. 29A, unlike common semiconductors, graphene is a zero-gap semiconductor in which the valence band and the conduction band have a linear dispersion relation with the Dirac point Dp as the point of symmetry. The Fermi level $E_f$ usually exists at the Dirac point Dp, but can be shifted by application of a voltage or doping treatment.

Figure 29B:
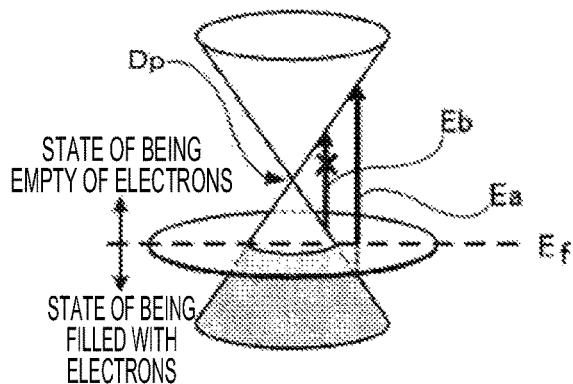
Figure 29C:
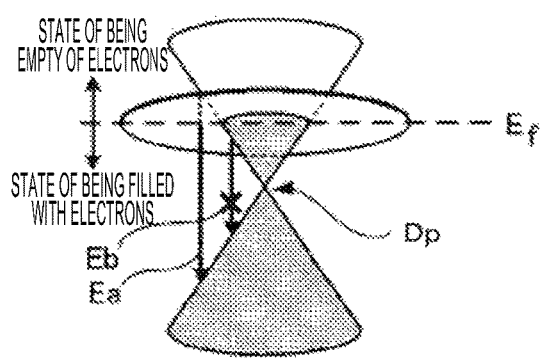
Figure 29D:
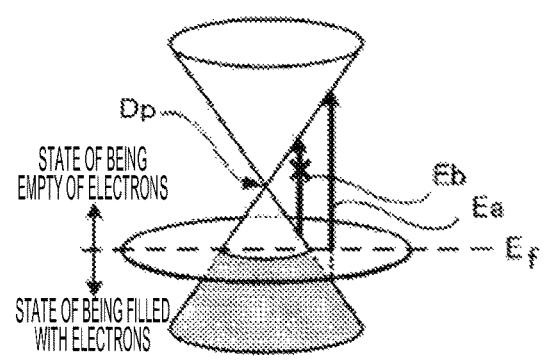

For example, when the Fermi level $E_f$ is shifted by application of a voltage or doping treatment as shown in FIG. 29B, the optical transitions of energies larger than $2|\Delta E_f|$ are possible as illustrated by arrow $E_a$, for example. On the other hand, as illustrated by arrow $E_b$, the optical transitions of energies of $2|\Delta E_f|$ or less can be forbidden. That is, graphene is transparent to light having an energy of $2|\Delta E_f|$ or less. Thus, in graphene, the light transmittance for light of a desired wavelength (frequency) can be changed (controlled) by shifting the Fermi level $E_f$. As shown in FIG. 29C, when graphene is doped with an n-type impurity, the Fermi level $E_f$ can be shifted from the Dirac point Dp to the conduction band side. On the other hand, as shown in FIG. 29D, when graphene is doped with a p-type impurity, the Fermi rank $E_f$ can be shifted from the Dirac point Dp to the valence band side.

Figure 30:
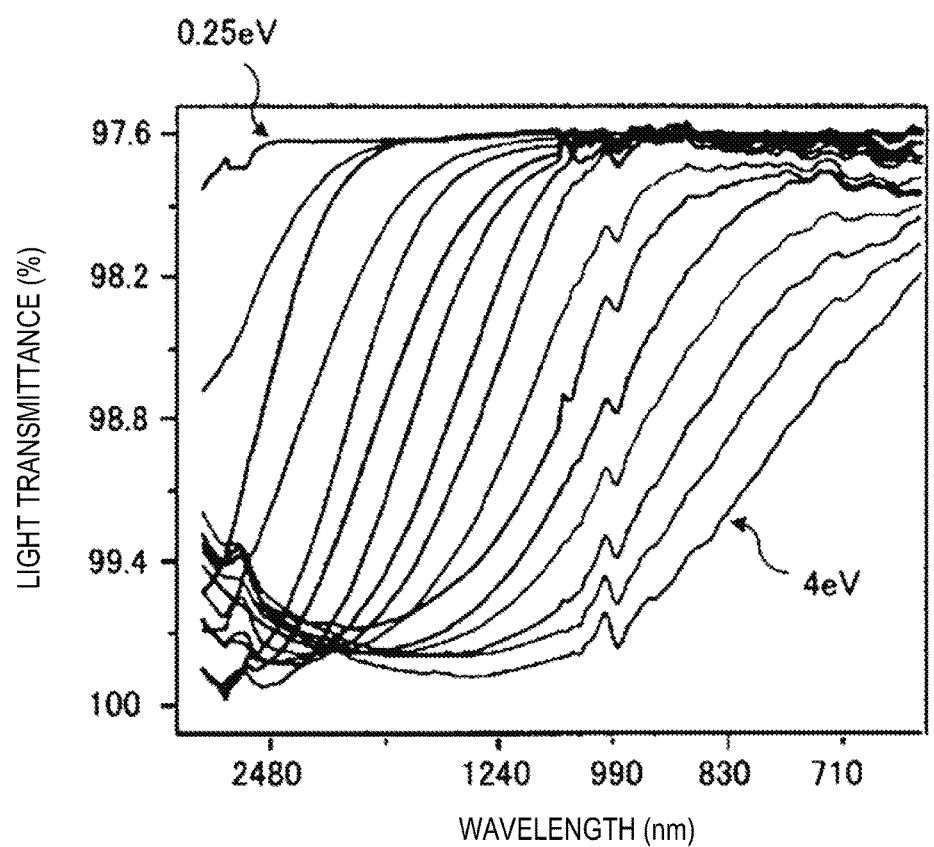
FIG. 30 is a diagram showing the light transmittance change in the infrared region when one layer of graphene in a film form is sandwiched by a pair of electrodes and the applied voltage is changed.
Figure 31:
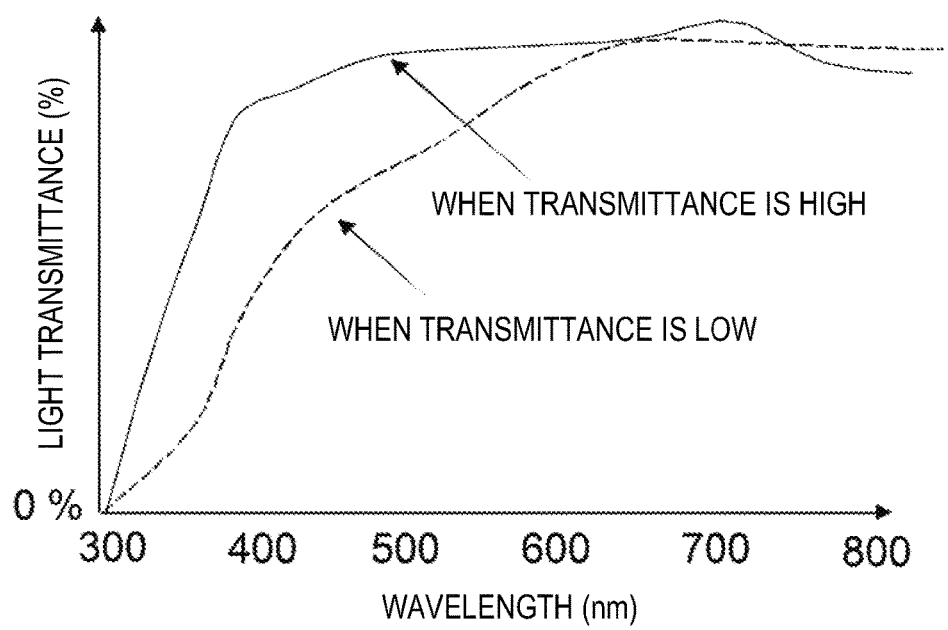
FIG. 31 is a schematic diagram showing the wavelength dependence of the light transmittance of an electrochromic film.

It is reported by Chen et al. that, when a voltage is applied to graphene, the light transmittance in the infrared region changes (Nature 471, 617-620 (2011)). The experimental results in the report are shown in FIG. 30. In FIG. 30, the light transmittance change in the infrared region when one layer of graphene in a film form is sandwiched by a pair of electrodes and the applied voltage is changed is shown, where the horizontal axis represents the wavelength (nm) and the vertical axis represents the light transmittance (%).

As shown in FIG. 30, the applied voltage is changed in a range of 0.25 eV to 4 eV. On the vertical axis of the graph, the bottom stands for the light transmittance being 100%, and the top stands for the light transmittance being 97.6% (the amount that one layer of graphene absorbs). From FIG. 30, it is found that, when the applied voltage is changed to the higher side in the entire wavelength region measured, the light transmittance comes closer to 100% in the region of long wavelengths than in the region of short wavelengths. Furthermore, since the region where the light transmittance comes close to 100% expands to the short wavelength side as the applied voltage becomes higher, it is found that the wavelength region of light in which the light transmittance can be modulated (controlled) by the applied voltage can be expanded to the short wavelength side. The above results are results in one layer of atoms; thus, based on the magnitude of the applied voltage, the light transmittance can be changed in accordance with the wavelength from the near-infrared region to the infrared region to the terahertz region.

These characteristics are common to, as well as graphene, other nanocarbon materials such as carbon nanotubes, fullerenes, or the like.

[Embodiment 1]

Embodiment 1 relates to the light control device (light control element) according to the first aspect of the present disclosure.

Figure 1B:
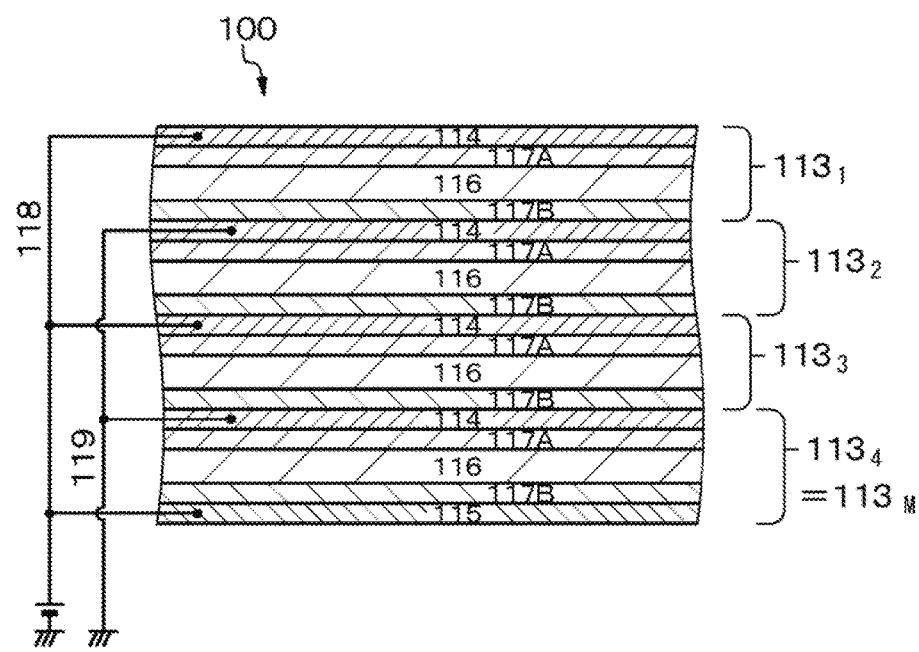

As shown in the schematic partial cross-sectional views of FIG. 1A and FIG. 1B, in a light control device (light control element) 100 of Embodiment 1, M (provided that M≥1; in the example shown in FIG. 1A, M=3; in the example shown in FIG. 1B, M=4) light control layers 113 in each of which a first nanocarbon film 114, a first intermediate layer 117A, a dielectric material layer 116, and a second intermediate layer 117B are stacked are stacked, and a second nanocarbon film 115 is formed on the second intermediate layer 117B included in the M-th light control layer $113_M$. A voltage is applied to the first nanocarbon film 114 and the second nanocarbon film 115.

In the illustrated examples, since the first nanocarbon film 114 is located on the upper side and the second nanocarbon film 115 is located on the lower side, the second nanocarbon film 115 is formed below the second intermediate layer 117B included in the M-th light control layer $113_M$. That is, whether the second nanocarbon film 115 is formed above or below the second intermediate layer 117B included in the M-th light control layer $113_M$ is a relative issue depending on the positional relationship between the first nanocarbon film 114 and the second nanocarbon film 115. In the case like the above where the first nanocarbon film 114 is located above the second nanocarbon film 115, the second nanocarbon film 115 is formed "below" the second intermediate layer 117B included in the M-th light control layer $113_M$; also such a configuration is included in the concept of "the second nanocarbon film 115 is formed 'on' the second intermediate layer 117B included in the M-th light control layer $113_M$."

Here, in the light control device 100 of Embodiment 1, the light transmittance in the light control layers 113 and $113_M$ is controlled by a voltage being applied to the first nanocarbon film 114 and the second nanocarbon film 115. That is, by applying an appropriate voltage to the first nanocarbon film 114 and the second nanocarbon film 115, the light control layers 113 and $113_M$ can be made a transparent state to light having a desired wavelength range. In the case where M is an odd number (see FIG. 1A), the first nanocarbon films 114 in odd positions are connected to a common first interconnection 118, and the first nanocarbon films 114 in even positions and the second nanocarbon film 115 are connected to a common second interconnection 119. On the other hand, in the case where M is an even number (see FIG. 1B), the first nanocarbon films 114 in odd positions and the second nanocarbon film 115 are connected to the common first interconnection 118, and the first nanocarbon films 114 in even positions are connected to the common second interconnection 119. The first interconnection 118 and the second interconnection 119 are connected to a not-shown light control device control circuit. It is possible to apply a positive potential to the first interconnection 118 and ground the second interconnection 119; alternatively, it is possible to ground the first interconnection 118 and apply a positive potential to the second interconnection 119; alternatively, it is possible to apply a negative potential to the first interconnection 118 and ground the second interconnection 119; alternatively, it is possible to ground the first interconnection 118 and apply a negative potential to the second interconnection 119; alternatively, it is possible to apply a positive potential to the first interconnection 118 and apply a negative potential to the second interconnection 119; or alternatively, it is possible to apply a negative potential to the first interconnection 118 and apply a positive potential to the second interconnection 119, for example. In the case where M is an odd number (see FIG. 1A), the first nanocarbon films 114 in odd positions may be electrically connected via a first contact hole (not shown) and connected to the common first interconnection 118, and the first nanocarbon films 114 in even positions and the second nanocarbon film 115 may be electrically connected via a second contact hole (not shown) and connected to the common second interconnection 119. Similarly, in the case where M is an even number (see FIG. 1B), the first nanocarbon films 114 in odd positions and the second nanocarbon film 115 may be electrically connected via a first contact hole (not shown) and connected to the common first interconnection 118, and the first nanocarbon films 114 in even positions may be electrically connected via a second contact hole (not shown) and connected to the common second interconnection 119.

The first nanocarbon film 114 and the second nanocarbon film 115 are formed of graphene. The first intermediate layer 117A and the second intermediate layer 117B are made of titanium dioxide ($TiO_2$), and the dielectric material layer 116 is made of $Al_2O_3$, $HfO_2$, $ZrO_2$, or the like. In order to prevent a reduction in light transmittance and an effect on visibility due to providing the first interconnection, the second interconnection, and a connection line described later, the first interconnection 118 and the second interconnection 119 are formed of a nanocarbon film, or are formed of a transparent conductive material layer. Also in the various Embodiments described below, the material that forms the nanocarbon film, the intermediate layer, the dielectric material layer, the first interconnection, the second interconnection, and the connection line may be the same as above.

Graphene can be formed by the manufacturing method described below, for example. That is, a film containing a graphene-izing catalyst is formed as a film on a base. Then, a gas-phase carbon supply source is supplied to the film containing a graphene-izing catalyst, and at the same time the gas-phase carbon supply source is heat-treated; thereby, graphene is produced. After that, the graphene is cooled at a prescribed cooling rate; thus, graphene in a film form can be formed on the film containing a graphene-izing catalyst. As the graphene-izing catalyst, as well as carbon compounds such as SiC, at least one metal selected from Ni, Co, Fe, Pt, Au, Al, Cr, Cu, Mg, Mn, Mo, Rh, Si, Ta, Ti, W, U, V, and Zr may be given. As the gas-phase carbon supply source, for example, at least one carbon source selected from carbon monoxide, methane, ethane, ethylene, ethanol, acetylene, propane, butane, butadiene, pentane, a pentene, cyclopentadiene, hexane, cyclohexane, benzene, and toluene may be given. The graphene in a film form thus formed is separated from the film containing a graphene-izing catalyst; thus, graphene can be obtained.

To manufacture the light control device in Embodiment 1, specifically, for example, rolled copper foil with a thickness of 35 μm is heated to 1000° C. in a hydrogen atmosphere (hydrogen flow rate: 20 sccm) in an electric furnace, and methane gas is supplied for 30 minutes at a flow rate of 30 sccm; thereby, the first nanocarbon film 114 made of graphene is formed on the copper foil. Subsequently, the first intermediate layer 117A, the dielectric material layer 116, and the second intermediate layer 117B are sequentially formed on the graphene. Thus, a light control layer of the first layer can be formed. On the other hand, a light control layer of the second layer in which the first nanocarbon film 114 made of graphene, the first intermediate layer 117A, the dielectric material layer 116, and the second intermediate layer 117B are sequentially formed on copper foil can be formed similarly. Then, an acetone-diluted solution of polymethyl methacrylate (PMMA) is applied onto the second intermediate layer 117B by spin coating, and then the solution is dried to form a PMMA film. After that, the copper foil on the light control layer of the second layer is removed using an iron nitrate aqueous solution, the first nanocarbon film 114 included in the light control layer of the second layer stuck to the PMMA film is transferred onto the second intermediate layer 117B included in the light control layer of the first layer, and then the PMMA film is removed using an acetone solvent. Thus, a stacked structure in which two light control layers are stacked can be obtained. A stacked structure having a desired number of layers (M layers) is formed in this way, and then the second nanocarbon film 115 may be stuck onto the second intermediate layer included in the M-th light control layer, based on a similar method to the above. Finally, the copper foil is removed from the stacked structure thus obtained, and then the workpiece may be stuck to a base on which imaging elements are formed beforehand. In the film formation process mentioned above, it is also possible to stick the first nanocarbon film 114 onto a transparent substrate beforehand, and then sequentially form the first intermediate layer 117A, the dielectric material layer 116, and the second intermediate layer 117B on the first nanocarbon film 114. In each film formation process, also a method of continuously forming a film based on a roll-to-roll system, a method of continuously forming graphene into a film while heating an electrode locally, etc. may be used, for example.

As described above using FIG. 29A, FIG. 29B, FIG. 29C, and FIG. 29D, the Fermi level $E_f$ can be shifted by changing the value of the voltage applied between the first interconnection 118 and the second interconnection 119; consequently, the light transmittance for light of a desired wavelength (frequency) can be changed (controlled). Alternatively, the Fermi level $E_f$ can be shifted by performing doping treatment on the first nanocarbon film 114 and the second nanocarbon film 115; consequently, the light transmittance for light of a desired wavelength (frequency) can be changed (controlled).

Alternatively, the dielectric material layer included in the light control layer is formed of a dielectric material having a high relative permittivity, and thereby the amount of carriers doped into graphene is increased. That is, the amount of charge retained in the first nanocarbon film 114 and the second nanocarbon film 115 can be increased. As a result of the above, the light transmittance for light of a desired wavelength (frequency) can be changed (controlled).

Examples in which $Al_2O_3$ (relative permittivity=8.2) and IGZO (relative permittivity=9), which are different in relative permittivity, are used as the dielectric material layer to allow the wavelength region of transmissible light to be expanded will now be described.

Figure 27:
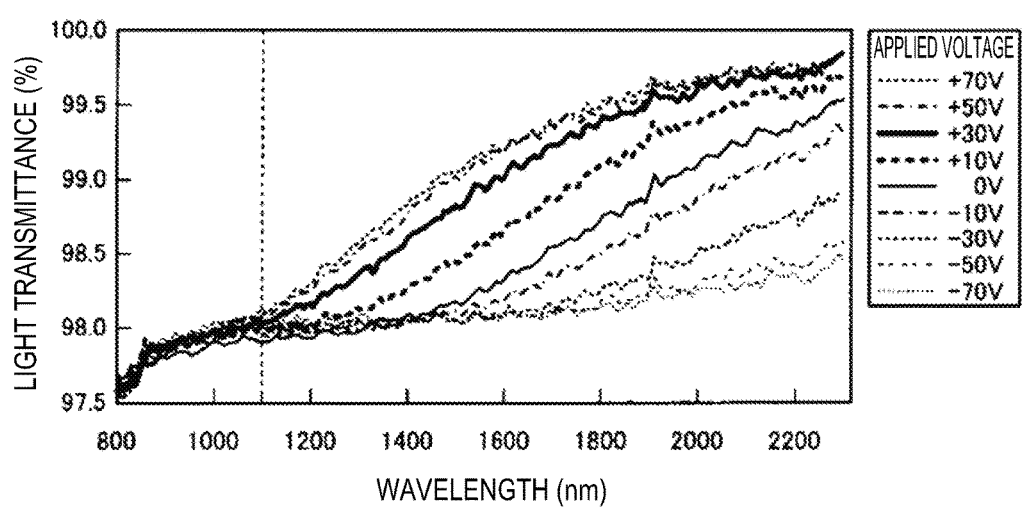
FIG. 27 is a graph showing light transmission spectra of a nanocarbon film stacked structure body that includes a dielectric material layer made of $Al_2O_3$.
Figure 28A:
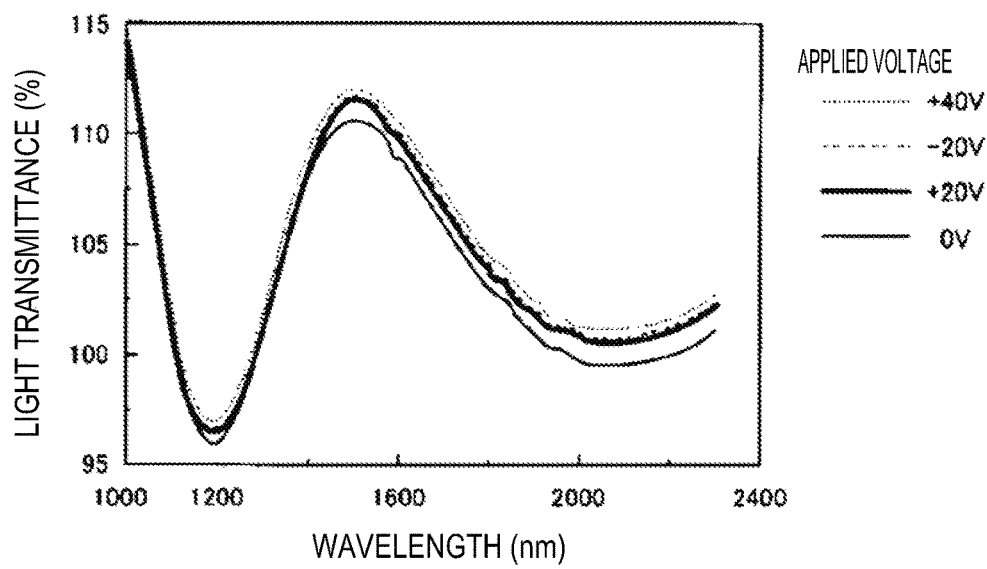
FIG. 28A is a graph showing light transmission spectra of a nanocarbon film stacked structure body that includes a dielectric material layer made of IGZO.
Figure 28B:
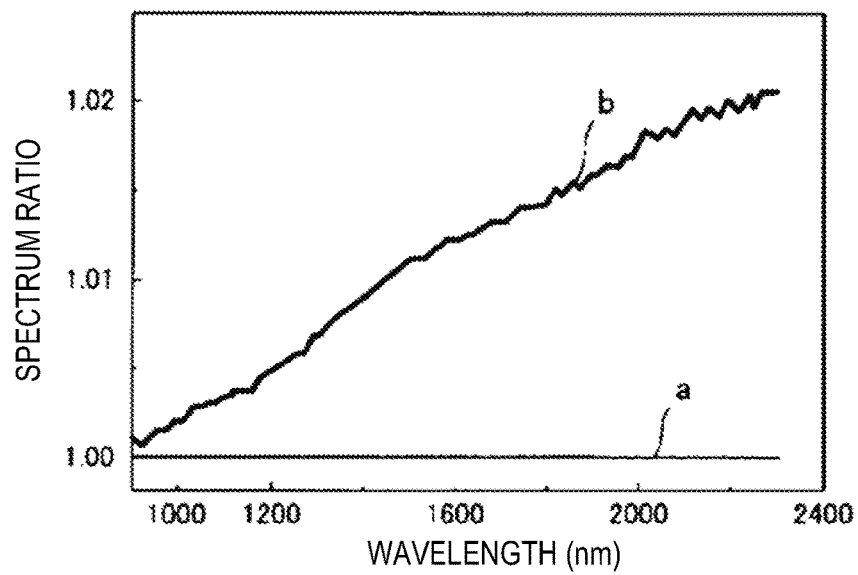
FIG. 28B is a graph showing a spectrum ratio a (0 volts/0 volts) and a spectrum ratio b (+20 volts/0 volts) using as a reference the light transmission spectrum when the applied voltage is 0 volts in FIG. 28A.

In FIG. 27 and FIG. 28A, examples of the light transmission spectrum of a nanocarbon film stacked structure body in which the first nanocarbon film/the dielectric material layer/the second nanocarbon film are stacked are shown. Here, FIG. 27 is an example in which the dielectric material layer in the nanocarbon film stacked structure body is formed of $Al_2O_3$, and the second nanocarbon film is grounded and the voltage applied to the first nanocarbon film is changed in a range of −70 volts to +70 volts. The vertical axis of FIG. 27 represents the light transmittance (unit: %). On the other hand, FIG. 28A is an example in which the dielectric material layer in the nanocarbon film stacked structure body is formed of IGZO, and the second nanocarbon film is grounded and the voltage applied to the first nanocarbon film is changed in a range of −20 volts to +40 volts. The vertical axis of FIG. 28A represents the light transmittance. FIG. 28B is a graph obtained by processing FIG. 28A in order to describe the change of the light transmission spectrum with the applied voltage, and shows a spectrum ratio a (0 volts/0 volts) and a spectrum ratio b (+20 volts/0 volts) using as a reference the light transmission spectrum when the applied voltage is 0 volts in FIG. 28A.

As shown in FIG. 27, when the dielectric material layer is formed of $Al_2O_3$, a rise of the spectrum is seen from near 1100 nm in the light transmission spectrum of an applied voltage of +30 volts or more (middle thick line). That is, it is found that the wavelength region of transmissible light (the region where the light transmittance can be modulated) can be expanded up to near 1100 nm by the applied voltage. On the other hand, as shown in FIG. 28A, when the dielectric material layer is formed of IGZO, a rise is seen from the side of wavelengths shorter than 1000 nm in the light transmission spectrum of an applied voltage of +20 volts (middle thick line). That is, it is found that the wavelength region of transmissible light (the region where the light transmittance can be modulated) can be expanded to the side of wavelengths shorter than 1000 nm by the applied voltage.

The value of the relative permittivity of IGZO is larger than that of $Al_2O_3$. Therefore, it is found that, in a dielectric material layer with a larger relative permittivity, the wavelength of forbidden transition is shifted further to the short wavelength side by voltage application, and the wavelength region of transmissible light can be expanded further to the short wavelength side. As shown in FIG. 27, it is found that, when the applied voltage is larger, the wavelength region of transmissible light can be expanded further to the short wavelength side. For example, it is found that the wavelength range of transmissible light can be expanded up to near 1200 nm at an applied voltage of 10 volts, and up to near 1100 nm at an applied voltage of 30 volts.

As above, in the light control device (light control element) of Embodiment 1, since the light control layer including the first nanocarbon film and the second nanocarbon film is provided and a voltage is applied to the first nanocarbon film and the second nanocarbon film, the light transmittance of the light control layer can be controlled. That is, by applying a prescribed voltage $V_0$ to the first nanocarbon film and the second nanocarbon film, the light control layer can be made a transparent state to light having a desired wavelength range.

The light transmittance modulation range per layer of graphene (the range of change in light transmittance ΔT) is approximately 2.3%; however, if the interface between graphene and the dielectric material layer is not uniform during the formation of the light control layer, carriers from the dielectric material may not be doped into the graphene, and consequently there is a concern that the light transmittance modulation of the graphene may be non-uniform. In particular, when a dielectric material layer made of a ferroelectric material is formed as a film by the sputtering method or the like, the surface of the dielectric material layer may be rough; and when graphene is stacked on such a dielectric material layer, there may be a case where not all the carriers are doped into the graphene, because the interface is rough. However, by forming an intermediate layer between the dielectric material layer and the nanocarbon film, that is, by forming an intermediate layer that functions as a planarization layer for improving the flatness between the nanocarbon film and the dielectric material layer, the occurrence of such a problem can be prevented reliably. Since the intermediate layer functions also as an adhesion improving layer and an anti-reflection layer at the same time, the adhesiveness between the nanocarbon film and the dielectric material layer can be improved and thus the occurrence of peeling between the nanocarbon film and the dielectric material layer can be prevented, and the occurrence of unneeded reflection of incident light between the nanocarbon film and the dielectric material layer can be suppressed. Furthermore, in the nanocarbon film, there is no wavelength dependence of light transmittance, the transmission spectrum is flat, the hues are neutral, and the time required for the change in light transmittance is short. Furthermore, mechanical driving is not needed; thus, the structure can be simplified, and height reduction (thickness reduction) and miniaturization are easy. Moreover, by selecting the applied voltage appropriately, the effective light transmittance of the light control layer for light of wavelengths not less than a desired wavelength can be controlled; thus, the desired value of wavelength may be set to, for example, blue color (e.g. 380 nm) and setting may be made so that the light transmittance for light of wavelengths not less than the desired wavelength (for example, light having a wavelength band of visible light or more) when the prescribed voltage $V_0$ is applied is almost 100%, and thereby a desired value of light transmittance can be obtained accurately and easily. This similarly applies to Embodiments below.

The first nanocarbon films in odd positions, the first nanocarbon films in even positions, and the second nanocarbon film may be doped with an impurity. Specifically, six ways of states of

[A-1] (a state in which the nanocarbon film connected to the first interconnection is doped with an impurity of the first conductivity type, a state in which the nanocarbon film connected to the second interconnection is doped with an impurity of the second conductivity type),

[A-2] (a state in which the nanocarbon film connected to the first interconnection is doped with an impurity of the first conductivity type, a state in which the nanocarbon film connected to the second interconnection is not doped with an impurity),

[A-3] (a state in which the nanocarbon film connected to the first interconnection is not doped with an impurity, a state in which the nanocarbon film connected to the second interconnection is doped with an impurity of the second conductivity type),

[B-1] (a state in which the nanocarbon film connected to the first interconnection is doped with an impurity of the second conductivity type, a state in which the nanocarbon film connected to the second interconnection is doped with an impurity of the first conductivity type),

[B-2] (a state in which the nanocarbon film connected to the first interconnection is doped with an impurity of the second conductivity type, a state in which the nanocarbon film connected to the second interconnection is not doped with an impurity), and

[B-3] (a state in which the nanocarbon film connected to the first interconnection is not doped with an impurity, a state in which the nanocarbon film connected to the second interconnection is doped with an impurity of the first conductivity type)

can be given.

[Embodiment 2]

Figure 2A:
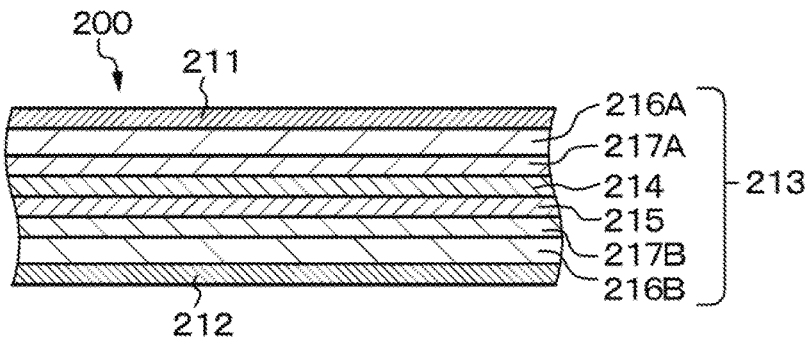
FIG. 2A is a schematic partial end view of a light control device of Embodiment 2.

Embodiment 2 relates to the light control device (light control element) according to the second aspect of the present disclosure. As shown in the schematic partial cross-sectional view of FIG. 2A, a light control device (light control element) 200 of Embodiment 2 includes a pair of electrodes 211 and 212 and a light control layer 213 sandwiched by the pair of electrodes 211 and 212.

The light control layer 213 has a stacked structure of a first dielectric material layer 216A, a first intermediate layer 217A, a first nanocarbon film 214 doped with an impurity of the first conductivity type or not doped with an impurity, a second nanocarbon film 215 doped with an impurity of the second conductivity type different from the first conductivity type or not doped with an impurity, a second intermediate layer 217B, and a second dielectric material layer 216B, and a voltage is applied to the pair of electrodes 211 and 212.

As (the impurity doping state in the first nanocarbon film 214, the impurity doping state in the second nanocarbon film 215), four ways of states of

[C-1] (a state in which the first nanocarbon film 214 is doped with an impurity of the first conductivity type, a state in which the second nanocarbon film 215 is doped with an impurity of the second conductivity type),

[C-2] (a state in which the first nanocarbon film 214 is doped with an impurity of the first conductivity type, a state in which the second nanocarbon film 215 is not doped with an impurity),

[D-1] (a state in which the first nanocarbon film 214 is not doped with an impurity, a state in which the second nanocarbon film 215 is doped with an impurity of the second conductivity type), and

[D-2] (a state in which the first nanocarbon film 214 is not doped with an impurity, a state in which the second nanocarbon film 215 is not doped with an impurity)

can be given. Specifically, in Embodiment 2, the first nanocarbon film 214 is doped with an impurity of the first conductivity type (more specifically, the n-type), and the second nanocarbon film 215 is doped with an impurity of the second conductivity type (more specifically, the p-type).

Here, the first nanocarbon film 214 and the second nanocarbon film 215 are formed of graphene like in Embodiment 1. The first electrode 211 and the second electrode 212 that form a pair of electrodes are formed of a nanocarbon film, specifically, of one layer of graphene. The first dielectric material layer 216A, the second dielectric material layer 216B, the first intermediate layer 217A, and the second intermediate layer 217B are formed of the material described in Embodiment 1.

In the light control device of Embodiment 2, a voltage is applied to the pair of electrodes 211 and 212 to control the amount of charge generated in the first nanocarbon film 214 and/or the second nanocarbon film 215; thus, the light transmittance in the light control layer 213 is controlled. Since two layers of the first nanocarbon film 214 and the second nanocarbon film 215 are stacked and the light transmittance modulation range per layer of graphene is approximately 2%, the light transmittance modulation range (the range of change in light transmittance) ΔT of the light control device of Embodiment 2 is approximately 4%.

Figure 2B:
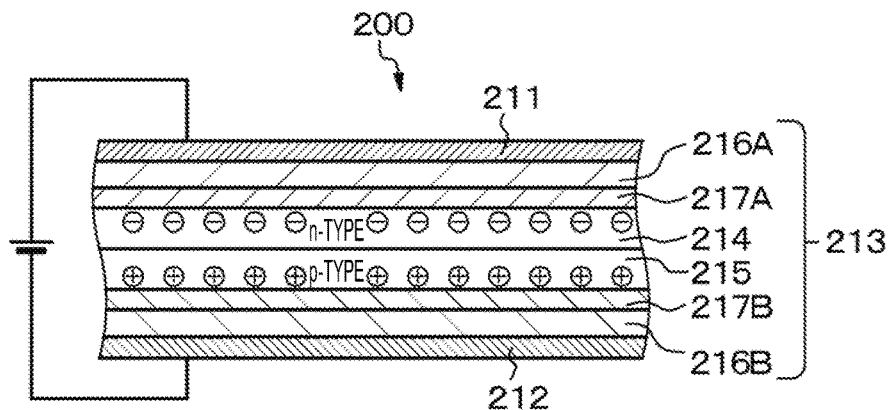
FIG. 2B is a conceptual diagram showing the behavior of a first nanocarbon film and a second nanocarbon film when a voltage is applied to a pair of electrodes of the light control device of Embodiment 2.

Specifically, as described above, the first conductivity type is the n-type and the second conductivity type is the p-type, and a voltage higher than the voltage applied to the second electrode 212 facing the second nanocarbon film 215 via the second dielectric material layer 216B is applied to the first electrode 211 facing the first nanocarbon film 214 via the first dielectric material layer 216A (see FIG. 2B). The second nanocarbon film 215 and the second dielectric material layer 216B are in an electrically floating state. Hence, a negative charge is induced in the first nanocarbon film 214, and a positive charge is induced in the second nanocarbon film 215 (see FIG. 2B). Here, since the first nanocarbon film 214 is doped with an n-type impurity and the second nanocarbon film 215 is doped with a p-type impurity, a p-n junction is formed at the interface between the first nanocarbon film 214 and the second nanocarbon film 215. Therefore, a depletion layer is formed between the first nanocarbon film 214 and the second nanocarbon film 215 while a reverse bias voltage is applied to the pair of electrodes 211 and 212; thus, a charge is retained in each of the first nanocarbon film 214 and the second nanocarbon film 215. As a result of the above, the wavelength band of light that can pass through (be transmitted through) the light control layer 213 at a high light transmittance is determined.

Figure 2C:
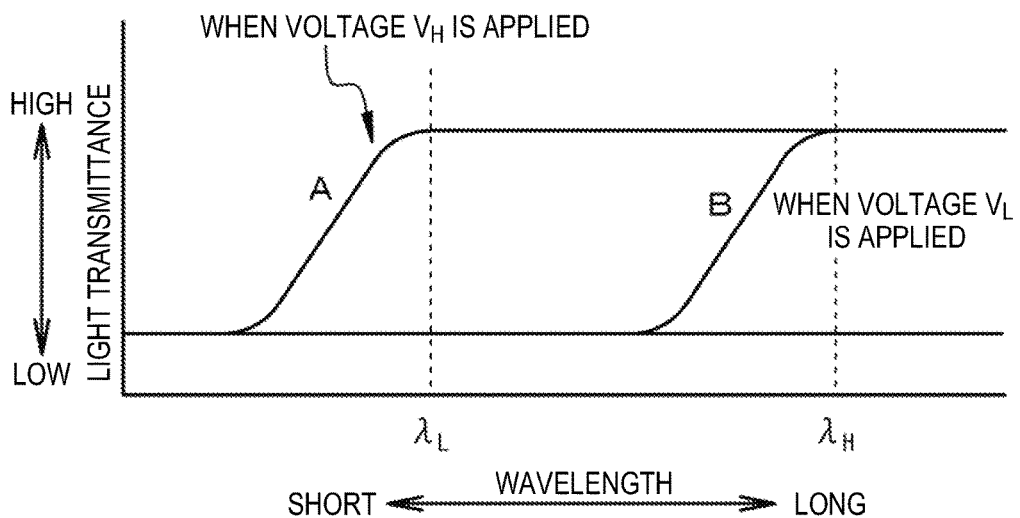
FIG. 2C is a conceptual diagram showing relationships between the light transmittance of a light control layer and the wavelength band of light that has passed through the light control device when voltages are applied to the pair of electrodes of the light control device of Embodiment 2.

Specifically, when a high first voltage $V_H$ is applied between the pair of electrodes 211 and 212, the relationship between the light transmittance of the light control layer 213 and the wavelength of light that has passed through the light control device is in the state of "A" in the conceptual diagram of FIG. 2C. On the other hand, when a low second voltage $V_L$ ($V_L<V_H$) is applied between the pair of electrodes 211 and 212, the relationship between the light transmittance of the light control layer 213 and the wavelength of light that has passed through the light control device is in the state of "B" in the conceptual diagram of FIG. 2C. Thereby, in the time of the application of the first voltage $V_H$ between the pair of electrodes 211 and 212, light of wavelengths not less than a wavelength $\lambda_L$ is allowed to pass (be transmitted) at a higher light transmittance than light of wavelengths less than the wavelength $\lambda_L$ (see the state of "A" in the conceptual diagram of FIG. 2C). Furthermore, in the time of the application of the second voltage $V_L$ between the pair of electrodes 211 and 212, light of wavelengths not less than a wavelength $\lambda_H$ (provided that $\lambda_H>\lambda_L$) is allowed to pass (be transmitted) at a higher light transmittance than light of wavelengths less than the wavelength $\lambda_H$ (the state of "B" in the conceptual diagram of FIG. 2C). That is, the relationship between the light control state of the light control device and the wavelength band of light can be controlled in accordance with the voltage applied to the pair of electrodes 211 and 212. The above description can be applied to the light control device of Embodiment 1, provided that the pair of electrodes 211 and 212 are replaced with the first nanocarbon film 114 and the second nanocarbon film 115.

To manufacture the light control device in Embodiment 2, specifically, for example, rolled copper foil with a thickness of 35 μm is heated to 1000° C. in a hydrogen atmosphere (hydrogen flow rate: 20 sccm) in an electric furnace, and methane gas is supplied for 30 minutes at a flow rate of 30 sccm; thereby, the first nanocarbon film 214 made of graphene is formed on the copper foil. Subsequently, a dopant layer is formed on the graphene. Then, the first intermediate layer 217A in a base in which the first electrode 211, the first dielectric material layer 216A, and the first intermediate layer 217A are formed and the first nanocarbon film 214 are stuck together, and the copper foil is removed using an iron nitrate aqueous solution. On the other hand, similarly, rolled copper foil with a thickness of 35 μm is heated to 1000° C. in a hydrogen atmosphere (hydrogen flow rate: 20 sccm) in an electric furnace, and methane gas is supplied for 30 minutes at a flow rate of 30 sccm; thereby, the second nanocarbon film 215 made of graphene is formed on the copper foil, for example. Subsequently, a dopant layer is formed on the graphene, and the second intermediate layer 217B and the second dielectric material layer 216B are formed. Then, an acetone-diluted solution of polymethyl methacrylate (PMMA) is applied onto the second dielectric material layer 216B by spin coating, and then the solution is dried to form a PMMA film. After that, the copper foil is removed using an iron nitrate aqueous solution, the second nanocarbon film 215 stuck to the PMMA film is transferred onto the first nanocarbon film 214, and then the PMMA film is removed using an acetone solvent. Thus, a stacked structure of the first dielectric material layer 216A, the first intermediate layer 217A, the first nanocarbon film 214 and the second nanocarbon film 215 made of graphene, the second intermediate layer 217B, and the second dielectric material layer 216B can be obtained. Imaging elements are formed on the base beforehand, for example. In each film formation process, also a method of continuously forming a film based on a roll-to-roll system, a method of continuously forming graphene into a film while heating an electrode locally, etc. may be used, for example.

In the light control device (light control element) of Embodiment 2, when a voltage is applied to the pair of electrodes, a positive or negative charge is induced in either one of the first nanocarbon film and the second nanocarbon film and a negative or positive charge is induced in the other in accordance with the polarity of the applied voltage. Consequently, the wavelength band of light that can pass through the light control layer at a high light transmittance is determined. That is, the light transmittance of the light control layer in a desired wavelength band can be controlled. In addition, since the first nanocarbon film is doped with an impurity of the first conductivity type and the second nanocarbon film is doped with an impurity of the second conductivity type, a p-n junction is formed at the interface between the first nanocarbon film and the second nanocarbon film, and a charge is retained in each of the first nanocarbon film and the second nanocarbon film while a reverse bias voltage is applied to the pair of electrodes. Since a current does not flow between the pair of electrodes, low power consumption can be achieved.

[Embodiment 3]

Figure 3:
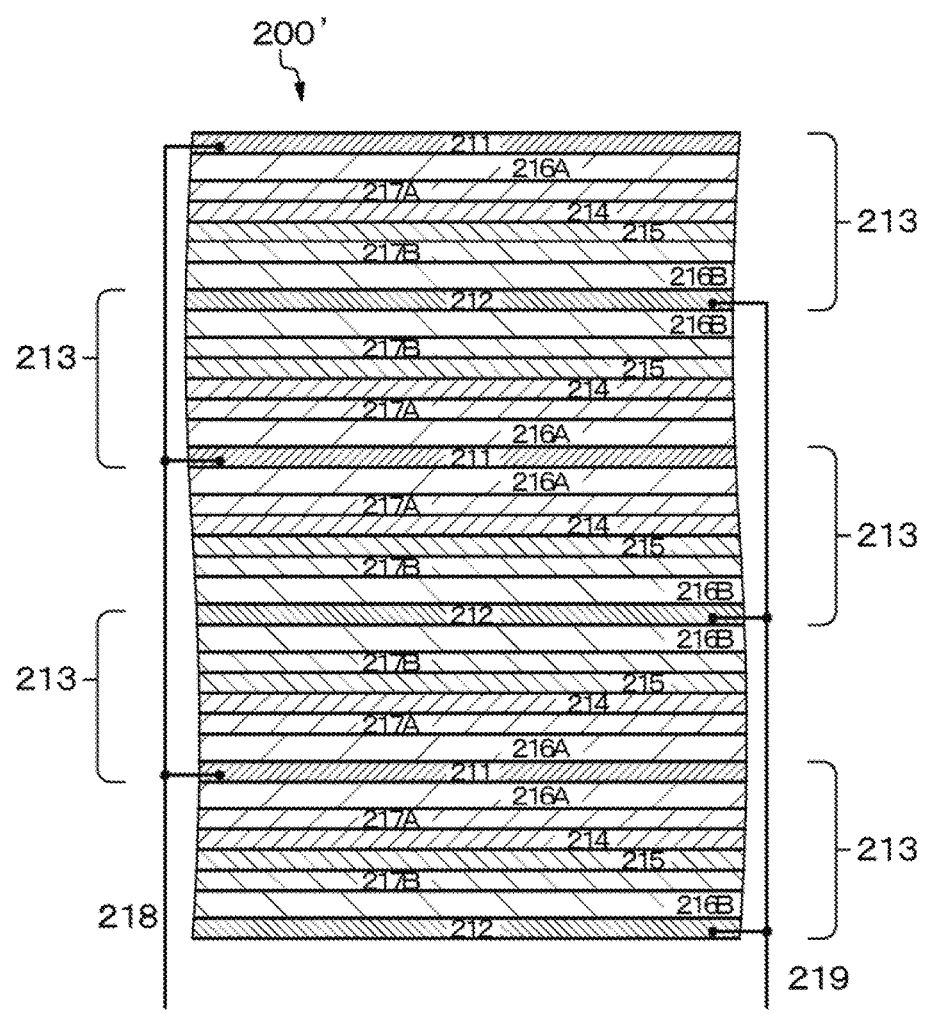
FIG. 3 is a schematic partial end view of a light control device of Embodiment 3.

Embodiment 3 is a modification of Embodiment 2. As shown in the schematic partial cross-sectional view in FIG. 3, in a light control device (light control element) 200' of Embodiment 3, N (in the illustrated example, N=5) light control layers and (N+1) electrodes are provided, the N light control layers and the (N+1) electrodes are alternately stacked, and the electrodes in odd positions are connected to a first interconnection 218 and the electrodes in even positions are connected to a second interconnection 219.

Specifically, the light control device 200' has a structure of a first electrode 211, a first dielectric material layer 216A, a first intermediate layer 217A, a first nanocarbon film 214, a second nanocarbon film 215, a second intermediate layer 217B, a second dielectric material layer 216B, a second electrode 212, a second dielectric material layer 216B, a second intermediate layer 217B, a second nanocarbon film 215, a first nanocarbon film 214, a first intermediate layer 217A, a first dielectric material layer 216A, a first electrode 211, a first dielectric material layer 216A, a first intermediate layer 217A, a first nanocarbon film 214, a second nanocarbon film 215, a second intermediate layer 217B, a second dielectric material layer 216B, a second electrode 212, etc. That is, the stacking order of the first dielectric material layer, the first nanocarbon film, the first intermediate layer, the second nanocarbon film, the second intermediate layer, and the second dielectric material layer is opposite between the light control layers in odd positions and the light control layers in even positions. By employing such a configuration, a structure in which the light control layer 213 of Embodiment 2 is stacked in N layers as a whole is created, and the range of change in light transmittance can be expanded.

It is also possible to separate the N light control layers into groups each composed of N' layers of light control devices, and to connect one electrode to the first interconnection 218 and connect the other electrode to the second interconnection 219 in each group of light control devices.

[Embodiment 4]

Embodiment 4 relates to the light control device (light control element) according to the third aspect of the present disclosure. As shown in the schematic partial cross-sectional views of FIG. 4A and FIG. 4B, light control devices (light control elements) $300_1$ and $300_2$ of Embodiment 4 include a pair of electrodes 311 and 312 and a light control layer 313 sandwiched by the pair of electrodes, the light control layer 313 has a stacked structure of a first dielectric material layer 316A, a first intermediate layer 317A, a nanocarbon film 314 doped with an impurity or not doped with an impurity, a second intermediate layer 317B, and a second dielectric material layer 316B, and a voltage different from the voltage applied to the pair of electrodes 311 and 312 is applied to the nanocarbon film 314.

Figure 4A:
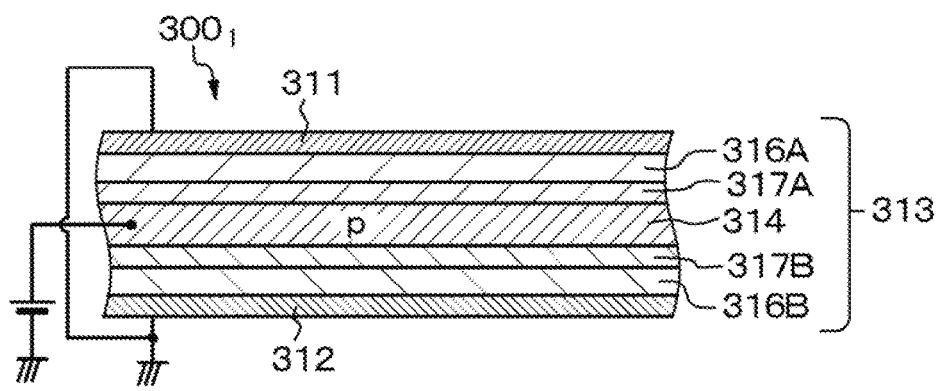
FIGS. 4A and 4B are schematic partial end views of light control devices of Embodiment 4.
Figure 4B:
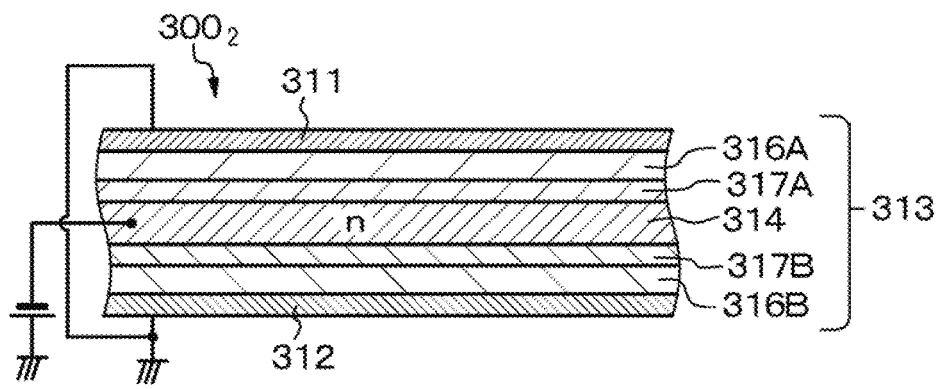

Specifically, as shown in FIG. 4A, the impurity is of the p-type, and a voltage higher than the voltage applied to the pair of electrodes 311 and 312 is applied to the nanocarbon film 314. Alternatively, as shown in FIG. 4B, the impurity is of the n-type, and a voltage lower than the voltage applied to the pair of electrodes 311 and 312 is applied to the nanocarbon film 314. The nanocarbon film 314 is formed of graphene like in Embodiment 1.

Otherwise, the light control device (light control element) of Embodiment 4 may be similar to the light control device (light control element) described in Embodiment 2, and a detailed description is omitted. In the light control device (light control element) of Embodiment 4, since the light control layer has a stacked structure of the first dielectric material layer, the nanocarbon film doped with an impurity or not doped with an impurity, and the second dielectric material layer and a voltage different from the voltage applied to the pair of electrodes is applied to the nanocarbon film, the light transmittance of the light control layer can be controlled.

[Embodiment 5]

Figure 5:
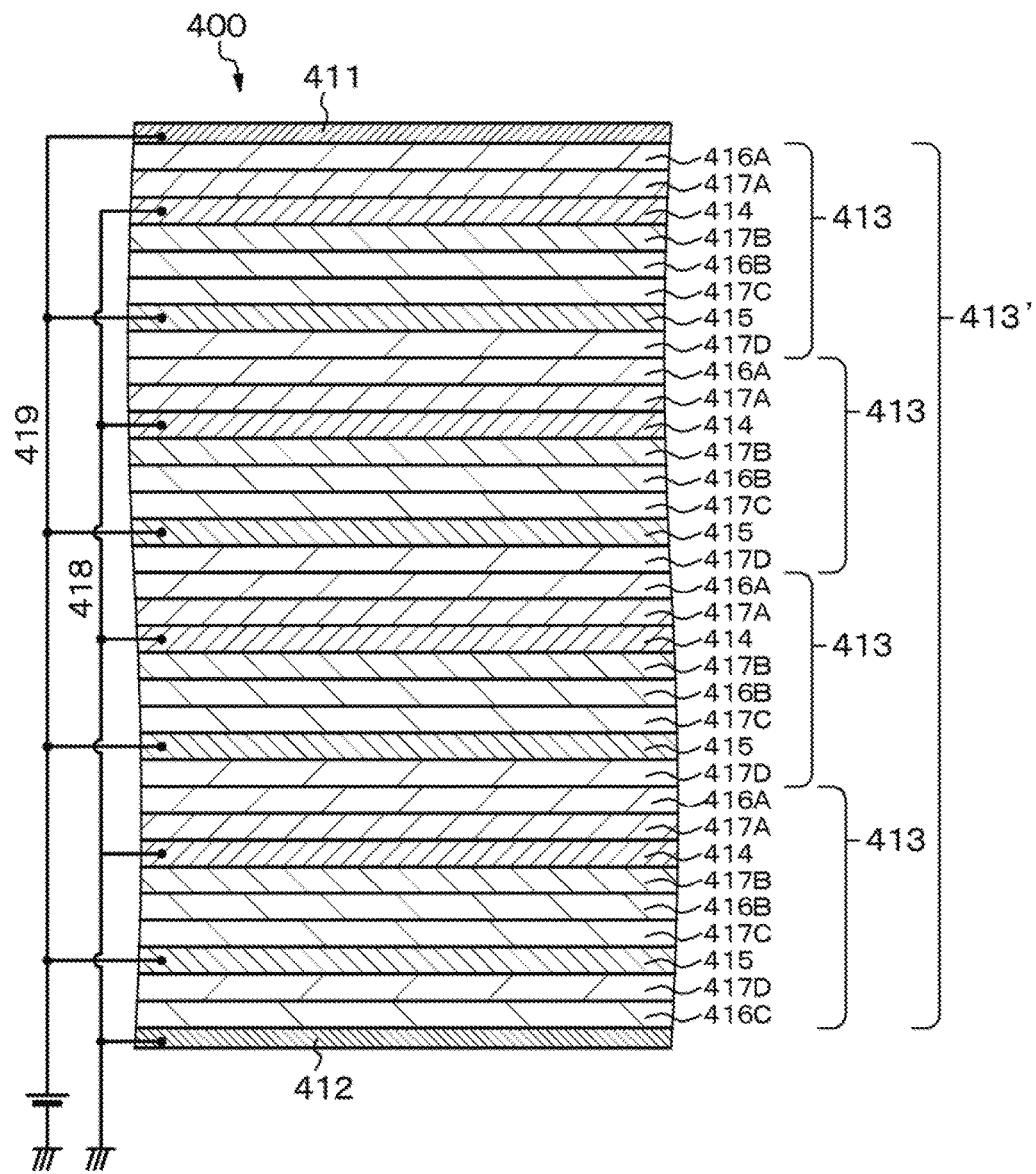
FIG. 5 is a schematic partial end view of a light control device of Embodiment 5.

Embodiment 5 relates to the light control device (light control element) according to the fourth aspect of the present disclosure. As shown in the schematic partial cross-sectional view of FIG. 5, a light control device (light control element) 400 of Embodiment 5 includes a pair of electrodes 411 and 412 and a stacked structure body 413' in which P (provided that P≥1) light control layers 413 sandwiched by the pair of electrodes 411 and 412 are stacked, the p-th light control layer 413 (provided that 1≤p≤P) has a stacked structure of a first dielectric material layer 416A, a first intermediate layer 417A, a first nanocarbon film 414 doped with an n-type impurity or not doped with an impurity, a second intermediate layer 417B, a second dielectric material layer 416B, a third intermediate layer 417C, a second nanocarbon film 415 doped with a p-type impurity or not doped with an impurity, and a fourth intermediate layer 417D, a third dielectric material layer 416C is further formed on the fourth intermediate layer 417D in the P-th light control layer 413, and a voltage different from the voltage applied to the first nanocarbon film 414 is applied to the second nanocarbon film 415. Specifically, a voltage higher than the voltage applied to the first nanocarbon film 414 is applied to the second nanocarbon film 415.

In the illustrated example, since the first light control layer 413 is located on the upper side and the P-th light control layer 413 is located on the lower side, the third dielectric material layer 416C is formed further below the fourth intermediate layer 417D in the P-th light control layer 413. That is, whether the third dielectric material layer 416C is formed above or below the fourth intermediate layer 417D is a relative issue depending on the positional relationship between the first light control layer and the P-th light control layer. In the case like the above where the first light control layer is located above the P-th light control layer, the third dielectric material layer 416C is formed "below" the fourth intermediate layer 417D; also such a configuration is included in the concept of "the third dielectric material layer 416C is further formed "on" the fourth intermediate layer 417D in the P-th light control layer 413."

The electrode 412 and the first nanocarbon film 414 are connected to a common first interconnection 418, and the electrode 411 and the second nanocarbon film 415 are connected to a common second interconnection 419. Therefore, the same voltage as the voltage applied to the second nanocarbon film 415 is applied to the electrode 411 via the common second interconnection 419. On the other hand, the same voltage as the voltage applied to the first nanocarbon film 414 is applied to the electrode 412 via the common first interconnection 418.

Otherwise, the light control device (light control element) of Embodiment 5 may be similar to the light control device (light control element) described in Embodiment 2, and a detailed description is omitted. In the light control device (light control element) of Embodiment 6, since a stacked structure body in which P (provided that P≥1) light control layers having a prescribed configuration are stacked is provided and a voltage different from the voltage applied to the first nanocarbon film is applied to the second nanocarbon film, the light transmittance of the light control layer can be controlled.

[Embodiment 6]

Embodiment 6 relates to the imaging element and the imaging device according to the first aspect to the fourth aspect of the present disclosure. Imaging elements $R_1$, $G_1$, and $B_1$ of Embodiment 6 are composed of a light receiving element (photosensor, photodiode, or photoelectric conversion element) 27 and the light control device 100, 200, 200', $300_1$, $300_2$, or 400 according to the first aspect to the fourth aspect of the present disclosure described in Embodiment 1 to Embodiment 5 which is disposed on the light incidence side of the light receiving element. The light control devices 100, 200, 200', $300_1$, $300_2$, and 400 may be hereinafter collectively referred to as a "light control device 21." An imaging device of Embodiment 6 includes imaging elements $R_1$, $R_0$, $G_1$, $G_0$, $B_1$, and $B_0$ arranged in a two-dimensional matrix configuration, and at least parts $R_1$, $G_1$, and $B_1$ of the imaging elements arranged in a two-dimensional matrix configuration are formed of a light receiving element (photoelectric conversion element) and the light control device (light control element) 21 disposed on the light incidence side of the light receiving element. That is, at least the parts $R_1$, $G_1$, and $B_1$ of the imaging elements arranged in a two-dimensional matrix configuration are formed of the imaging elements $R_1$, $G_1$, and $B_1$ of Embodiment 6.

Figure 6A:
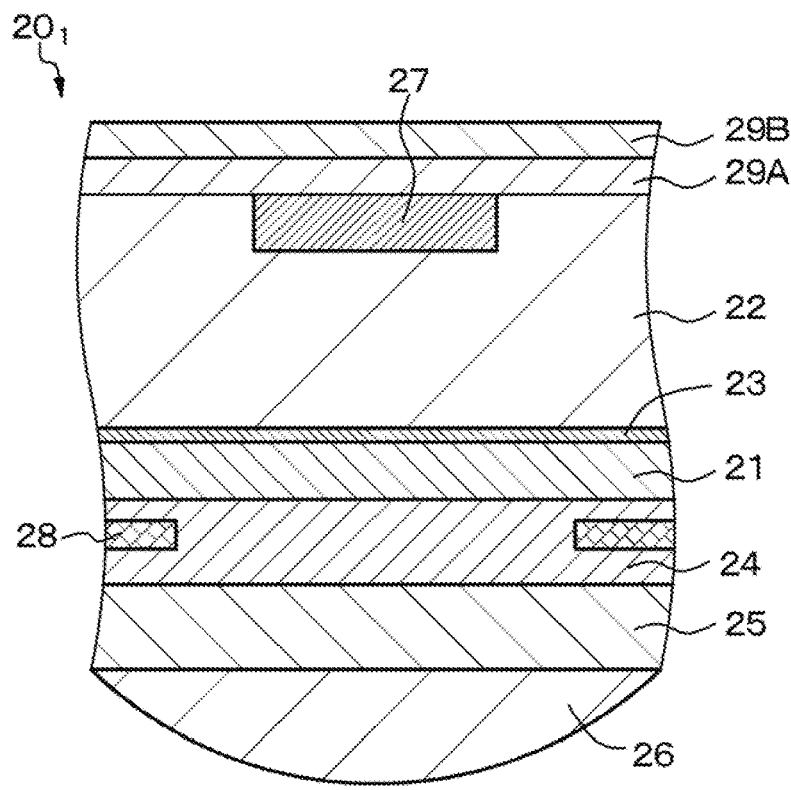
FIG. 6A and FIG. 6B are schematic partial cross-sectional views of imaging elements of Embodiment 6.
Figure 6B:
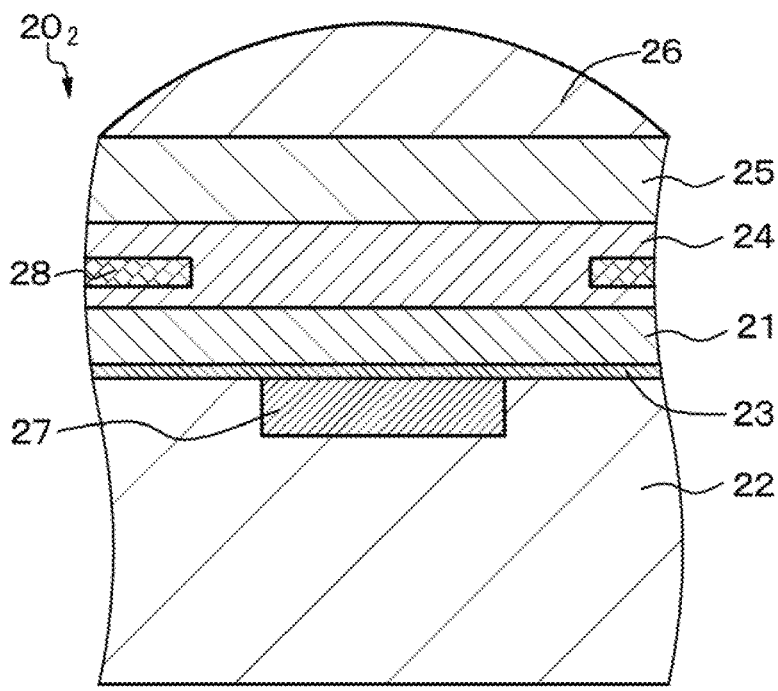

Schematic partial cross-sectional views of imaging elements of Embodiment 6 are shown in FIG. 6A and FIG. 6B. Layouts of imaging element groups are schematically shown in FIG. 7A, FIG. 7B, FIG. 8A, FIG. 8B, and FIG. 9A. Here, an imaging element 201 shown in FIG. 6A is a back-side illumination imaging element, and an imaging element 202 shown in FIG. 6B is a front-side illumination imaging element. The imaging elements $R_1$, $R_0$, $G_1$, $G_0$, $B_1$, and $B_0$ are arranged based on the Bayer arrangement, for example.

The imaging elements $20_1$ and $20_2$ have a structure in which a silicon semiconductor substrate 22, an interlayer insulating film 23 made of $SiO_2$, the light control device 21 (100, 200, 200', $300_1$, $300_2$, or 400) described in Embodiment 1 to Embodiment 5, a protective film 24, a color filter layer (or transparent film) 25, and a condensing lens (on-chip lens) 26 are stacked. That is, the color filter layer 25 is disposed on the light incidence side of the light receiving element. The light receiving element 27 is formed in a surface portion of the silicon semiconductor substrate 22. A light blocking film 28 is provided between an imaging element and an imaging element. The light blocking film 28 is specifically provided in a kind of lattice configuration in the portion between adjacent pixels, that is, between a pixel and a pixel. In the back-side illumination imaging element $20_1$, the stacked structure of the light control device 21 etc. is formed on the back surface side of the silicon semiconductor substrate 22; and in the front-side illumination imaging element $20_2$, the stacked structure of the light control device 21 etc. is formed on the front surface side of the silicon semiconductor substrate 22. In the back-side illumination imaging element $20_1$, an interlayer insulating layer 29A made of $SiO_2$ and a protective film 29B are formed on the front surface side of the silicon semiconductor substrate 22. The incident light is photoelectrically converted in the light receiving element 27 to generate a signal charge, and the signal charge is stored. The first interconnection and the second interconnection are disposed in the light control device 21, but the illustration of the first interconnection and the second interconnection is omitted. The configuration and structure of the back-side illumination imaging element $20_1$ and the front-side illumination imaging element $20_2$ may be a known configuration and a known structure except for the light control device 21, and a detailed description is omitted. Also the imaging device itself may be a similar configuration to a known imaging device, and also the method for driving the imaging element and the method for driving the imaging device may be known driving methods; and a detailed description is omitted. The imaging element of Embodiment 6 can achieve height reduction (thickness reduction); thus, an imaging element and an imaging device that have high sensitivity and in which color mixing between pixels and sensitivity shading are at a low level can be obtained.

In FIG. 7A, FIG. 7B, FIG. 8A, FIG. 8B, and FIG. 9A, "$R_0$" and "$R_1$" are an imaging element in which a red color filter layer is formed, and receive red light. Such an imaging element is referred to as a "red imaging element" for the sake of convenience. Furthermore, "$G_0$" and "$G_1$" are an imaging element in which a green color filter layer is formed, and receive green light. Such an imaging element is referred to as a "green imaging element" for the sake of convenience. Furthermore, "$B_0$" and "$B_1$" are an imaging element in which a blue color filter layer is formed, and receive blue light. Such an imaging element is referred to as a "blue imaging element" for the sake of convenience. In the examples illustrated, one red imaging element, two green imaging elements, and one blue imaging element constitute one unit imaging element group, and 16 unit imaging element groups are illustrated in FIG. 7A, FIG. 7B, FIG. 8A, FIG. 8B, and FIG. 9A. As shown in FIG. 7B, the light control device 21 may be provided in imaging elements arranged on a row basis, or although not illustrated, the light control device may be provided in imaging elements arranged on a column basis. In the imaging elements $R_0$, $G_0$, and $B_0$, the light control device 21 is not provided, and instead a planarization film (not illustrated) made of a polystyrene-based resin or an acrylic resin is provided. When the thickness of the light control device 21 is sufficiently small, it is not necessary to provide a planarization film. On the other hand, the light control device 21 is provided in the imaging elements $R_1$, $G_1$, and $B_1$. The dynamic range can be expanded by using such imaging elements and applying, for example, signal processing of a spatially varying exposure (SVE) system disclosed in WO 2002/056604 to the imaging elements.

The light control device 21 absorbs approximately 2.3% of the light per nanocarbon film when a voltage is not applied. Therefore, when, for example, the number of nanocarbon films is set to 60 in the light control device 21, the light transmittance as the whole light control device 21 when a voltage is not applied is approximately 25%. On the other hand, by applying a prescribed voltage $V_0$, the light transmittance as the whole light control device 21 is made a value close to 100%.

The dynamic range is expressed by the ratio between the amount of saturation signal, which is the maximum amount of signal, and the noise. When the dynamic range is larger, image output signals in bright scenes and image output signals in dark scenes can be obtained more reliably. In the imaging element of Embodiment 6, the imaging elements $R_1$, $G_1$, and $B_1$ including the light control device 21 and the imaging elements $R_0$, $G_0$, and $B_0$ not including the light control device 21 are provided; and by controlling the value of the prescribed voltage $V_0$ applied to the light control device 21 or not applying a voltage to the light control device 21 to control the light transmittance or reduce the light transmittance to a desired value, the time until reaching the amount of saturation charge is made longer in the imaging elements $R_1$, $G_1$, and $B_1$ including the light control device 21 than in the imaging elements $R_0$, $G_0$, and $B_0$ not including the light control device 21. As a result of the above, the dynamic range can be expanded.

In the case where a pair of electrodes are provided, the pair of electrodes may be shared between imaging elements including the light control device. That is, a form in which the first electrode in each light control device is shared and similarly the second electrode is shared between adjacent imaging elements may be employed; thereby, the configuration and structure of the imaging elements can be simplified. Also a form in which a pair of electrodes shared between the imaging elements $R_1$, $G_1$, and $B_1$ including the light control device are provided to be also shared with the imaging elements $R_0$, $G_0$, and $B_0$ not including the light control device is possible; also by this, the configuration and structure of the imaging elements can be simplified. Specifically, in these cases, the first electrode and the second electrode are configured as what is called a solid electrode between imaging elements. When the first electrode and the second electrode are formed of graphene, light is absorbed also in the first electrode and the second electrode; but the absorption is at 4% at most, and the amount of light absorption is smaller than when the first electrode and the second electrode are formed of a transparent conductive material layer made of ITO or the like. Although the light control device 21 is disposed in a region between the color filter layer 25 and the silicon semiconductor substrate 22, the light control device 21 may be disposed in a region between the color filter layer 25 and the condensing lens 26.

[Embodiment 7]

Embodiment 7 is a modification of Embodiment 6. In Embodiment 7, as illustrated in the layout of imaging element groups schematically shown in FIG. 9B, the red imaging element $R_0$, the green imaging element $G_0$, and the blue imaging element $B_0$, and an imaging element $IR_1$ that receives infrared light (referred to as an "infrared imaging element $IR_1$" for the sake of convenience) are provided. The imaging elements $R_0$, $G_0$, and $B_0$ do not include the light control device 21. On the other hand, the infrared imaging element $IR_1$ includes the light control device 21. The imaging elements $R_0$, $G_0$, $B_0$, and $IR_1$ constitute a unit imaging element group. In FIG. 9B, four unit imaging element groups are illustrated. In the infrared imaging element $IR_1$, a color filter is not provided, and instead a transparent film that allows light in the entire wavelength region to pass is provided. The transparent film is a film for filling the level difference of the element surface occurring due to a color filter layer not being formed, and is provided as necessary. In the infrared imaging element $IR_1$, a light control device that allows light in the infrared band to pass can be obtained by appropriately selecting the prescribed voltage $V_0$ applied to the light control device 21.

Also in the imaging element and the imaging device of Embodiment 7, on the basis of the voltage applied to the light control device 21, the wavelength region of passable light can be changed. In Embodiment 7, the dynamic range in the infrared imaging element $IR_1$ can be expanded.

In addition, by the infrared imaging element $IR_1$ being provided, a function of removing noise components due to dark current from the imaging elements $R_0$, $G_0$, and $B_0$ (noise cancellation function) can be provided. Here, the dark current is noise that occurs due to a charge generated by output current or heat even when light is completely blocked. In order to correct the dark current unevenness (that is, perform noise cancellation) in the imaging element, a light control device in which the light transmittance when a voltage is not applied is almost 0% and the light transmittance when a voltage is applied is almost 100% is used as the light control device 21. In this case, when a voltage is not applied to the light control device 21, since the infrared imaging element $IR_1$ does not allow light to pass, the signal component obtained is only a noise component $\Delta E$ due to dark current. The noise component due to dark current can be removed in each of the imaging elements $R_0$, $G_0$, and $B_0$ by subtracting the noise due to dark current from the signal component of each of the imaging elements $R_0$, $G_0$, and $B_0$.

Specifically, when a voltage is applied to the light control device 21 of the infrared imaging element $IR_1$, since the light transmittance of the light control device 21 is almost 100%, a signal component $S_{IR}$ in the infrared region or more is obtained. On the other hand, when a voltage is not applied to the light control device 21 of the infrared imaging element $IR_1$, since the light transmittance of the light control device 21 is almost 0%, only the noise component $\Delta E$ due to dark current is obtained. For example, in the green imaging element $G_0$, light passes through the green color filter layer and a signal component $S_G$ in the green region is obtained. Since the green imaging element $G_0$ also allows light in the infrared region to pass, the signal component $S_{IR}$ in the infrared region and the noise component $\Delta E$ due to dark current are added in the signal component read from the green imaging element $G_0$. That is, the signal component $S_G'$ read from the green imaging element $G_0$ is $$S_G' = (\text{signal component } S_G \text{ in the green region}) +$$
$$(\text{signal component } S_{IR} \text{ in the infrared region or more}) +$$
$$(\text{noise component } \Delta E \text{ due to dark current}).$$

On the other hand, the signal component $S_{IR}$ and the noise component $\Delta E$ due to dark current are obtained from the infrared imaging element $IR_1$. Thus, the signal component $S_G$ in the green region can be obtained by subtracting the signal component SIR and the noise component $\Delta E$ due to dark current obtained from the infrared imaging element $IR_1$ from the signal component $S_G'$ read from the green imaging element $G_0$. This similarly applies to the imaging elements $R_0$ and $B_0$. In Embodiment 7, since both the infrared component and the noise component $\Delta E$ can thus be removed from the imaging elements $R_0$, $G_0$, and $B_0$ using the signal components obtained in the infrared imaging element $IR_1$, it is not necessary to provide an IR cut filter on the upper side of the imaging elements $R_0$, $G_0$, and $B_0$, and the imaging element can be downsized and the number of manufacturing processes can be reduced.

In the case where an IR cut filter is provided on the upper side of the imaging elements $R_0$, $G_0$, and $B_0$, the noise component $\Delta E$ due to dark current can be removed. For example, in the green imaging element $G_0$, light passes through the green color filter layer and the signal component $S_G$ in the green region is obtained. In the green imaging element $G_0$, although light in the infrared region is absorbed by the IR cut filter, the noise component $\Delta E$ due to dark current is added in the signal component read from the green imaging element $G_0$. That is, the signal component $S_G'$ read from the green imaging element $G_0$ is $$S_G' = (\text{signal component } S_G \text{ in the green region}) +$$
$$(\text{noise component } \Delta E \text{ due to dark current}).$$

On the other hand, the noise component $\Delta E$ due to dark current is obtained from the infrared imaging element $IR_1$. Thus, the signal component $S_G$ in the green region can be obtained by subtracting the noise component $\Delta E$ due to dark current obtained from the infrared imaging element $IR_1$ from the signal component $S_G'$ read from the green imaging element $G_0$. This similarly applies to the imaging elements $R_0$ and $B_0$.

A color filter layer may be provided in the infrared imaging element Specifically, the color filter layer is disposed on the light incidence side of the light control device in the imaging element including the light control device. An example in which a red color filter layer that allows red color to pass is provided will now be described. The infrared imaging element $IR_1$ like this is written as an "infrared imaging element $IR-R_1$." In this case, in the infrared imaging element $IR-R_1$, a signal component corresponding to light in the red region, which is a visible light component, is obtained by voltage application, along with a signal component corresponding to light in the infrared region. Hence, in the unit imaging element group, since there is no case where the number of imaging elements that receive visible light is reduced by providing the infrared imaging element $IR-R_1$, there is no problem of resolution reduction. Furthermore, since the effective light transmittance can be changed by voltage application, measures against resolution reduction in high sensitivity imaging are possible in dark scenes such as in the nighttime. Furthermore, since the infrared imaging element $IR-R_1$ serves as both the infrared imaging element $IR_1$ and a red imaging element that receives red light, in imaging in bright scenes, the signal degradation of the green imaging element $G_0$ can be compensated for using a high frequency component of the high resolution signal in the red region obtained in the infrared imaging element $IR-R_1$. That is, high frequency components with sharp color tones may be synthesized, and faded color tones can be corrected.

The image output signal of the imaging element to be corrected can be expressed by the following formula.

$$\text{Image output signal} = (\text{signal of light received}) +$$
$$(C_1 \times \text{high frequency component of the red imaging element } R_0) +$$
$$(C_2 \times \text{high frequency component}$$
$$\text{of the green imaging element } G_0) +$$
$$(C_3 \times \text{high frequency component of the blue imaging element } B_0),$$

where $C_1$, $C_{12}$, and $C_3$ are correction factors, and are determined by the signal of the position to be corrected. The signal of the green imaging element $G_0$ is corrected using the high frequency components by setting the correction factors to, for example, $C_1=0.50$, $C_2=0.48$, and $C_3=0.02$. The blurred portions of the image can be improved by this signal processing.

An example in which a green color filter layer that allows green color to pass is provided will be described next. The infrared imaging element $IR_1$ like this is written as an "infrared imaging element $IR-G_1$." In this case, in the infrared imaging element $IR-G_1$, a signal component corresponding to light in the green region, which is a visible light component, is obtained by voltage application to the light control device 21, along with a signal component corresponding to light in the infrared region. Hence, in the unit imaging element group, since there is no case where the number of imaging elements that receive visible light is reduced by providing the infrared imaging element IR-G$_1$, there is no problem of resolution reduction. Furthermore, since the effective light transmittance can be changed by voltage application, measures against resolution reduction in high sensitivity imaging are possible in dark scenes such as in the nighttime. Furthermore, since the infrared imaging element IR-G$_1$ serves as both the infrared imaging element IR$_1$ and a green imaging element that receives green light, imaging in the region of visible light to infrared light is possible with high resolution even in the nighttime etc. In addition, since the proportion of green imaging elements provided in the unit imaging element group is one half in the unit imaging element group, the resolution of green color can improve the apparent resolution. This is because the spectral sensitivity of the human eye peaks around green color.

Alternatively, in the infrared imaging element IR$_1$, a light control device that allows light in the band of visible light to infrared light to pass can be obtained by appropriately selecting the prescribed voltage $V_0$ applied to the light control device 21. The infrared imaging element IR$_1$ like this is referred to as an "infrared imaging element IR—W$_1$," for the sake of convenience. In this case, the signal component read from the infrared imaging element IR—W$_1$ is a signal component in the infrared region, a signal component in the visible light region (white light), and the noise component $\Delta E$, or only the noise component $\Delta E$, in accordance with the presence or absence of application of a voltage to the light control device 21. That is, in the infrared imaging element IR—W$_1$, a signal component corresponding to white light is obtained by voltage application, along with a signal component corresponding to light in the infrared region. Thereby, there is no problem of resolution reduction due to providing the infrared imaging element IR—W$_1$; and in dark scenes such as in the nighttime, the problem of resolution reduction is eliminated because the effective light transmittance can be changed by voltage application. Furthermore, since the infrared imaging element IR—W$_1$ has the effects of both an infrared imaging element and a white imaging element, imaging in the region of visible light to near-infrared light is possible with high resolution even in the nighttime etc.

The light control device 21 may be provided in the red imaging element, the green imaging element, and the blue imaging element depending on circumstances. Furthermore, a red imaging element, a green imaging element, or a blue imaging element may be provided in place of the infrared imaging element. The light control device may be provided in all the imaging elements.

Alternatively, the light control device may be made to function as a color filter, without providing a color filter layer. Specifically, the material of the dielectric material layer in the light control device 21 provided in each of the red imaging element, the green imaging element, and the blue imaging element is varied. That is, for example, the dielectric material layer in the infrared imaging element IR$_1$ is formed of SiO$_2$, the dielectric material layer in the red imaging element R$_1$ is formed of HfO$_2$, the dielectric material layer in the green imaging element G$_1$ is formed of ZrO$_2$, and the dielectric material layer in the blue imaging element B$_1$ is formed of PLZT. When the relative permittivity of the material that forms the dielectric material layer varies, the amount of charge induced in the nanocarbon film varies, and consequently it becomes possible to change the value of $\lambda_0$ in the light control device that allows light of wavelengths not less than the wavelength $\lambda_0$ to pass (be transmitted) at a higher light transmittance than light of wavelengths less than the wavelength $\lambda_0$. Here, in the red imaging element R$_1$, signal components corresponding to light in the infrared region and the red region and the noise component $\Delta E$ are obtained. Similarly, in the green imaging element G$_1$, signal components corresponding to light in the infrared region to the green region and the noise component $\Delta E$ are obtained. In the blue imaging element B$_1$, signal components corresponding to light in the infrared region to the blue region and the noise component $\Delta E$ are obtained. Thus, the signal component in the red region in the red imaging element R$_1$ can be obtained by subtracting all the signal components obtained in the infrared imaging element IR$_1$ from all the signal components obtained in the red imaging element R$_1$. The signal component in the green region in the green imaging element G$_1$ can be obtained by subtracting all the signal components obtained in the red imaging element R$_1$ from all the signal components obtained in the green imaging element G$_1$. The signal component in the blue region in the blue imaging element B$_1$ can be obtained by subtracting all the signal components obtained in the green imaging element G$_1$ from all the signal components obtained in the blue imaging element B$_1$. In the infrared imaging element IR$_1$, the signal component in the infrared region can be obtained by subtracting the noise component $\Delta E$ of the imaging element R$_1$, G$_1$, or B$_1$ in a state where a voltage is not applied from all the signal components of the infrared imaging element IR$_1$. Such a modification example can be applied also to the imaging element described in Embodiment 6.

[Embodiment 8]

Embodiment 8 is modifications of Embodiment 6 to Embodiment 7, and specifically relates to a light transmittance control method for an imaging element. That is, the light transmittance control method for an light control device (light control element) of Embodiment 8 is (a) a light transmittance control method for a light control device (light control element) in which a prescribed voltage $V_0$ is applied between nanocarbon films forming a pair (between the first nanocarbon film 114 and the second nanocarbon film 115) to allow light of wavelengths not less than the wavelength $\lambda_0$ to pass at a higher light transmittance than light of wavelengths less than the wavelength $\lambda_0$, alternatively (b) a light transmittance control method for a light control device (light control element) in which a prescribed voltage $V_0$ is applied between the pair of electrodes 211 and 212 to allow light of wavelengths not less than the wavelength $\lambda_0$ to pass at a higher light transmittance than light of wavelengths less than the wavelength $\lambda_0$, alternatively (c) a light transmittance control method for a light control device (light control element) in which a prescribed voltage $V_0$ is applied between the pair of electrodes 311 and 312 and the nanocarbon film 314 to allow light of wavelengths not less than the wavelength $\lambda_0$ to pass at a higher light transmittance than light of wavelengths less than the wavelength $\lambda_0$, or alternatively (d) a light transmittance control method for a light control device (light control element) in which a prescribed voltage $V_0$ is applied between the first nanocarbon film 414 (and the electrode 412) and the second nanocarbon film 415 (and the electrode 411) to allow light of wavelengths not less than the wavelength $\lambda_0$ to pass at a higher light transmittance than light of wavelengths less than the wavelength $\lambda_0$.

In these light transmittance control methods for a light control device (light control element), the effective light transmittance of the light control layer for light of wavelengths not less than the wavelength $\lambda_0$ is controlled by changing the duty ratio of the pulsed prescribed voltage $V_0$. In Embodiment 8, unlike in Embodiment 9 to Embodiment 11 described later, the pulsed voltage is not a random pulse voltage. For the sake of convenience, "the application of a prescribed voltage $V_0$" in (a) to (d) mentioned above is expressed as "a prescribed voltage $V_0$ is applied to the first nanocarbon film 114 or the like.")

Figure 10A:
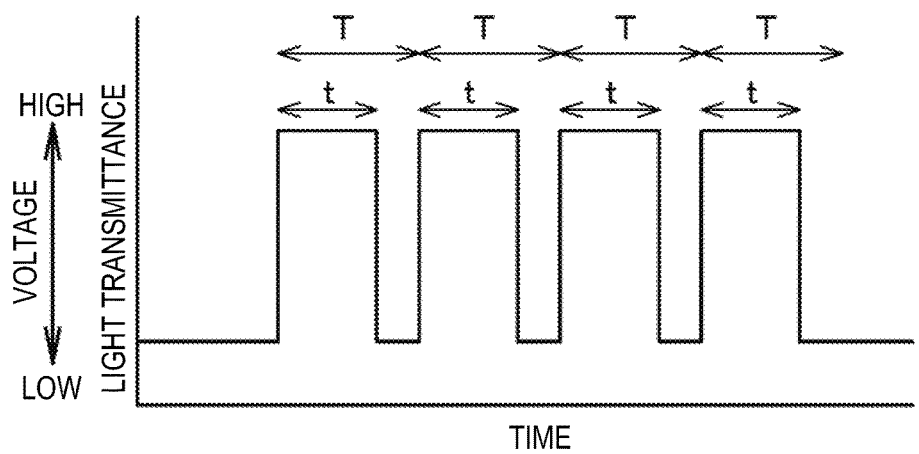
FIG. 10A and FIG. 10B are a diagram schematically showing the prescribed voltage $V_0$ and the change in light transmittance when a pulsed prescribed voltage $V_0$ is applied to the light control device included in the imaging device of Embodiment 8 and a diagram schematically showing the amount of charge stored in one frame period when the pulsed prescribed voltage $V_0$ is applied to the light control device, respectively.
Figure 10B:
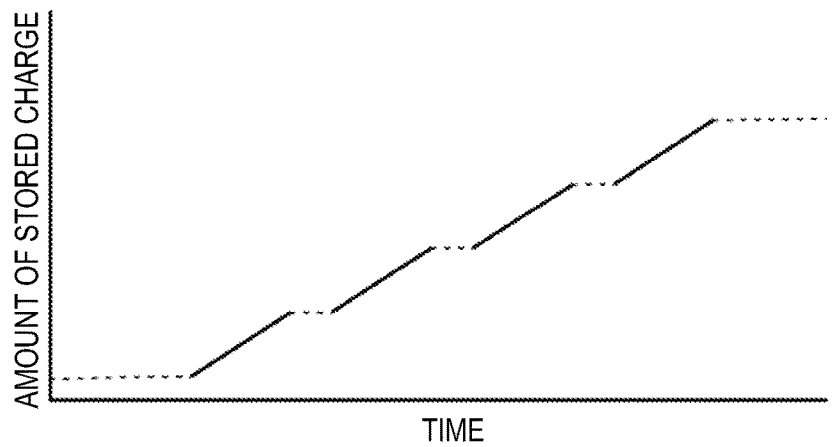
Figure 11A:
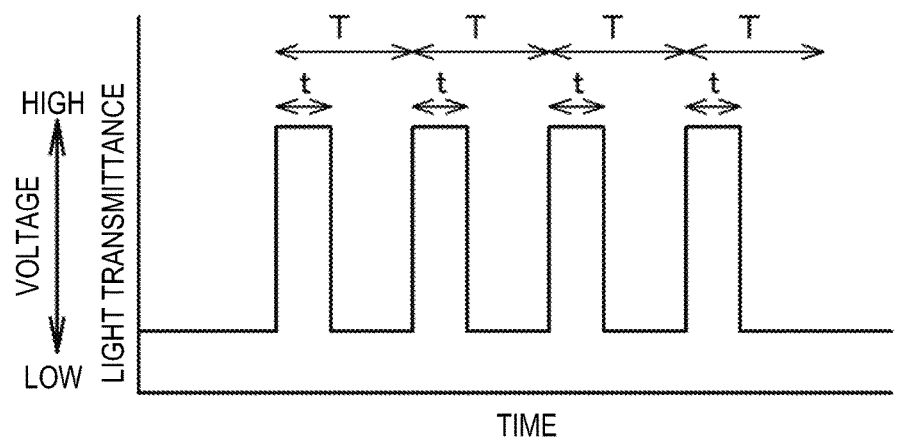
FIG. 11A and FIG. 11B are a diagram schematically showing the prescribed voltage $V_0$ and the change in light transmittance when a pulsed prescribed voltage $V_0$ is applied to the light control device included in the imaging device of Embodiment 8 and a diagram schematically showing the amount of charge stored in one frame period when the pulsed prescribed voltage $V_0$ is applied to the light control device, respectively.
Figure 11B:
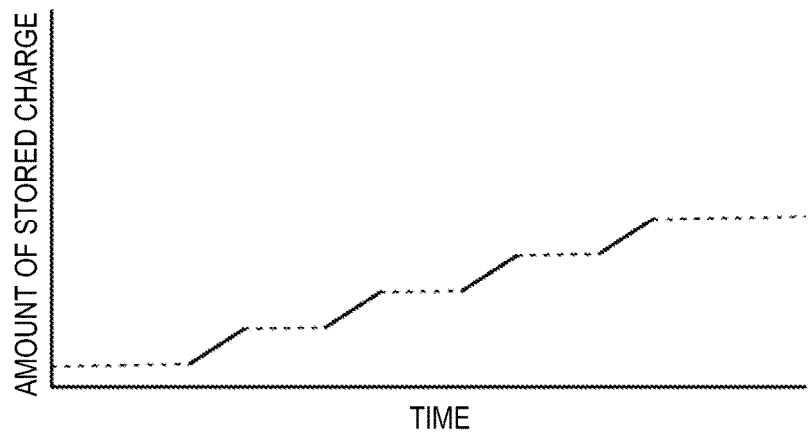

Specifically, the voltage change (or light transmittance) when a prescribed voltage $V_0$ with a pulse period of T and a duty ratio of D=t/T is applied to the first nanocarbon film 114 or the like is shown in FIG. 10A and FIG. 11A, and the amount of charge stored in the light receiving element in a certain period (e.g. one frame period) on the basis of light that has passed through the light control device is shown in FIG. 10B and FIG. 11B. As shown in the graphs of FIG. 10A and FIG. 11A, the light transmittance of the light control device is higher in the period t than in the period (T−t). Hence, a larger amount of charge can be obtained. Therefore, as shown in FIG. 10B and FIG. 11B, the amount of stored charge is larger in the period t than in the period (T−t). The duty ratio D is a higher value in the example shown in FIG. 10A than in the example shown in FIG. 11A. In FIG. 10B and FIG. 11B, the solid line indicates the amount of stored charge in the period t, and the dotted line indicates the amount of stored charge in the period (T−t). When the pulsed prescribed voltage $V_0$ is applied, the amount of stored charge obtained in one frame period is obtained by the integration of the amount of stored charge in the period t and the amount of stored charge in the period (T−t). Thus, the amount of stored charge obtained in one frame period can be changed by changing the duty ratio D of the pulsed prescribed voltage $V_0$ (see FIG. 10B and FIG. 11B). That is, the effective light transmittance of the light control layer 113, that is, the average light transmittance of the light control layer 113 or the like in a certain period can be controlled. More specifically, when the quantity of light that has passed through the light control layer 113 or the like in a certain period when the light transmittance of the light control layer 113 or the like is maximized is denoted by $Q_0$ and the quantity of light that has passed through the light control layer 113 or the like in the certain period when the prescribed voltage $V_0$ with a duty ratio of D=t/T is applied is denoted by $Q_1$, the effective light transmittance of the light control layer 113 or the like can be expressed as ($Q_1/Q_0$). As a result of the above, the dynamic range of the imaging element and the imaging device can be expanded, and the amounts of information of both bright portions and dark portions can be obtained during imaging.

In the light transmittance control method of Embodiment 8, the value obtained by converting the change in light transmittance of the nanocarbon film in the light control layer to frequency is higher than the frequency of the pulsed voltage. The frequency of the pulsed voltage is preferably not less than $1\times10^2$ Hz and not more than $1\times10^5$ Hz, specifically, the value obtained by converting the change in light transmittance of the nanocarbon film in the light control layer to frequency is $2.4\times10^3$ Hz (2.4 kHz), and the frequency of the pulsed prescribed voltage $V_0$ is, but not limited to, 240 Hz, for example. That is, T=4.2×range is expressed by the ratio between the amount of saturation signal, $10^{-3}$ seconds, for example.

As described earlier, the dynamic which is the maximum amount of signal, and the noise.

When the dynamic range is larger, image output signals in bright scenes and image output signals in dark scenes can be obtained more reliably. For example, in the imaging element of Embodiment 6 described above, the imaging elements $R_1$, $G_1$, and $B_1$ including the light control device 21 and the imaging elements $R_0$, $G_0$, and $B_0$ not including the light control device 21 are provided; and by controlling the value and duty ratio D of the prescribed voltage $V_0$ applied to the light control device 21 or not applying a voltage to the light control device 21 to control the light transmittance or reduce the light transmittance to a desired value, the time until reaching the amount of saturation charge is made longer in the imaging elements $R_1$, $G_1$, and $B_1$ including the light control device 21 than in the imaging elements $R_0$, $G_0$, and $B_0$ not including the light control device 21. As a result of the above, the dynamic range can be expanded. On the other hand, by controlling the value and duty ratio D of the prescribed voltage $V_0$ applied to the light control device 21 to maximize the light transmittance, the imaging elements $R_1$, $G_1$, and $B_1$ including the light control device 21 can be made an imaging element having almost the same light transmittance as those of the imaging elements $R_0$, $G_0$, and $B_0$ not including the light control device 21; thus, there is no problem of resolution reduction. That is, for example, a user of the imaging device may switch or the imaging device may automatically switch between an imaging mode that attempts to expand the dynamic range and an imaging mode that focuses on the resolution; thereby, imaging in optimum imaging modes can be performed.

Also in the imaging element and the imaging device of Embodiment 7 described above, on the basis of the voltage applied to the light control device 21, the light transmittance of the light control device 21 can be changed and furthermore the wavelength region of passable light can be changed. In Embodiment 7, the dynamic range in the infrared imaging element $IR_1$ can be expanded.

In the light transmittance control method for a light control device (light control element) in Embodiment 8, the effective light transmittance of the light control layer for light of wavelengths not less than the wavelength $\lambda_0$ is controlled by changing the duty ratio of the pulsed prescribed voltage $V_0$; thus, the value of the wavelength $\lambda_0$ may be set to, for example, blue color (e.g. 380 nm) and setting may be made so that the light transmittance for light of wavelengths not less than the wavelength $\lambda_0$ (for example, light having a wavelength band of visible light or more) when the prescribed voltage $V_0$ is applied is almost 100%, and thereby a desired value of light transmittance can be obtained accurately and easily and setting to a desired value of light transmittance can be made. In addition, in the nanocarbon film, there is no wavelength dependence of light transmittance, and the time required for the change in light transmittance is short.

[Embodiment 9]

These days, the concept of cloud technology is actively discussed, and is expected to play a role as a cloud terminal of an electronic device equipped with an imaging device such as an image-taking device or an image-taking element. It is expected that, in the near future, a society in which various electronic device are connected to the cloud and connections are made between these electronic devices, between electronic devices and users, and between users and the cloud will be created. In view of such a current of society, the development of an imaging device that can be installed in an electronic device for use in network societies including the cloud is desired.

When various electronic devices are connected to the cloud, it is necessary to solve various issues such as the enormous amount of communication, the heat generation of electronic devices, and the increase in power consumption. The development of increasing the amount of communication is progressing in the communication field, but there will be limitations to the increase of the amount of communication. Furthermore, when the number of users is increased with the development of network society, wireless communications etc. will scramble for the amount of communication immediately, and the communication band will become insufficient. On the other hand, in the imaging device, there are issues of the power consumption and heat generation in the portion of image signal processing and the power consumption during communication. Furthermore, when consideration is given to the communication of images obtained by the imaging device, also the size and the amount of communication (communication rate) of images are taken as issues.

In general, the amount of power consumption during communication is reduced by performing communication while compressing the image obtained by the imaging device. Thus far, several proposals have been made for the image compression signal processing. For example, in JP 2003-234967A, a technology in which signals from an analog-digital converter (A/D converter) are subjected to cosine transformation to compress the image is proposed. However, when the compression of signals is performed on a column basis or on a pixel (imaging element) basis, there is a problem that the interconnection for connecting the A/D converter and the imaging elements is complicated. Furthermore, in discrete cosine transformation during compression, also the occurrence of degradation in image quality when the image is restored is a problem. Also in the wavelet transformation proposed in JP 2006-025270A, there is a concern that the image quality will be degraded during image restoration, and there are also problems of the increase in the area of the portion of the image compression circuit and the increase in power consumption.

In common image compression technology, discrete cosine transformation (DCT) technology is used. The DCT technology provides good compression efficiency, and has therefore been used from old times and is the mainstream of image coding technology of today. However, in DCT technology, an image is divided into arbitrary transformation blocks and processings such as quantization and coding are performed on a block basis; therefore, as the compression rate is increased, block distortion and noise such as mosquito noise tend to get mixed in the restored image and degradation in image quality tends to occur. Hence, filter bank coding is drawing attention as a coding system in which these noises are less likely to get mixed in. As the filter bank coding, sub-band coding and wavelet transformation coding may be given. The sub-band coding is a method in which signals are band-limited by a low-pass filter and a high-pass filter, and all the output signals are further filtered. Wavelet transformation coding is a method in which signals are band-limited by a low-pass filter and a high-pass filter, and only the low-frequency band with a large amount of information is filtered hierarchically. These codings are implemented using the technology of a filter bank or decimation and interpolation. There are JPEG 2000 and Motion-JPEG 2000 as international standards employing wavelet transformation coding, where wavelet transformation is employed for transformation coding and high compression performance is achieved. In the international standards mentioned above, DCT technology or wavelet transformation is used for transformation coding, and these transformations are called orthogonal transformation because each of the coordinate systems before and after transformation is an orthogonal coordinate system. By the image compression by orthogonal transformation, the image can be transmitted and stored at a low bit rate.

With the increase in the screen size of display devices such as liquid crystal display devices and plasma display devices, various issues when stored image data are reused are pointed out. Since the point most considered in image compression is the compression rate, various studies have been made in order to improve the compression efficiency, and the compression rate in filter bank coding is higher than the compression rate in DCT technology. However, in general, filter bank coding technology is inferior in processing speed to DCT technology.

Both DCT technology and wavelet transformation use an orthogonal basis, and the degradation in image quality during image restoration is a problem. When wavelet transformation or cosine transformation is performed in the imaging device, data compression utilizing these transformation technologies is performed by passing the data after analog-digital (A/D) conversion through a processing circuit for performing wavelet transformation or cosine transformation.

On the other hand, a signal processing technology in which, based on exposure control in the imaging elements, a smaller amount of data can be obtained than based on reading all the pixels (all the imaging elements) and furthermore a processing circuit for data compression is not needed after A/D conversion is known. That is, moving images are grasped as three-dimensional data, and data in a form in which the three-dimensional cubic lattice is thinned out are restored by applying sparse coding as a signal processing algorithm. Although the number of vector elements is large, when most of them are zero, it is sufficient to retain only the information of what the figures in what positions in the order of elements of the basis are, and consequently data compression can be achieved. In the application to moving images, moving image data thinned out spatially and temporally are, as they are, regarded as data compressed by such an idea, and subsequent processing is performed in accordance with this.

A technology in which this signal processing method is implemented by an A/D conversion circuit is disclosed in the paper of IEEE Journal of Solid-State Circuits (Jan. 2013), "CMOS image sensor with per-column-Δ ADC and programmable compressed sensing." However, in the technology disclosed in this paper, there are problems that the technology is control using an electronic shutter, and that the area of a portion of the A/D converter occupied by the multiplexer that distributes the signals from pixels randomly is increased. Furthermore, when the electronic shutter is driven in units of one imaging element, it is essential to construct a memory in the imaging element and develop process technology for connecting each imaging element to a logic circuit.

Figure 12:
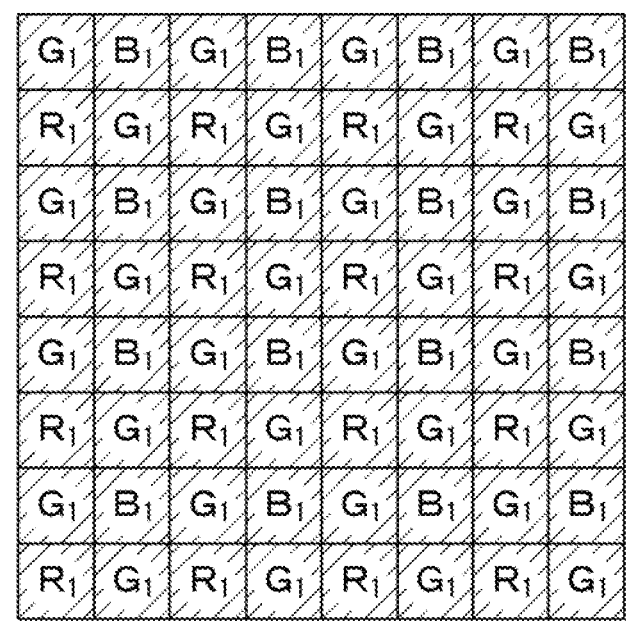

In Embodiment 9, substantially the same imaging device as the imaging device described in Embodiment 6 to Embodiment 7, although the configuration of the imaging element is slightly different, is used. As shown in the schematic layout of imaging element groups of FIG. 12, the light control device is provided in all the imaging elements.

The problem in the technology disclosed in the paper mentioned above is solved by compressing images on the basis of signal processing using sparse coding, and the problem of the degradation in image quality during compressed image restoration is solved by sparse coding. Furthermore, the signal processing method of sparse coding is applied to compress moving images, and the amount of output data from the imaging elements is reduced. That is, moving images are grasped as three-dimensional data, and data in a form in which the three-dimensional cubic lattice is thinned out are restored by applying sparse coding, which is a signal processing algorithm. Specifically, shutter data needed to obtain the shutter function S in Sparse signal $I=S \cdot D \cdot \alpha$ are obtained by the light control device; thereby, the simplification of the imaging device, the imaging element, and the interconnection structure is achieved. Here,
S: shutter function
I: Image
D: Scene.

When the processing for obtaining the shutter function S is attempted to be performed with a normal solid state imaging element, an electronic shutter is used, but since the read control in the electronic shutter needs to be randomized, the simultaneity is lost and data are read in an order different from the arrangement of the imaging elements. To obtain data arranged in an order in conformity with the arrangement of the imaging elements, it is needed to
(1) read image data randomly and then perform rearrangement processing outside the imaging elements,
or
(2) provide each imaging element with a capacity for data retention.

However, in the imaging device of the present disclosure, these are not necessary because the imaging element including the light control device is used.

In the imaging device of Embodiment 9, random exposure is performed. That is, a random pulse voltage generation and transmission device that generates a random pulse voltage and transmits the generated random pulse voltage to the imaging element including the light control device is provided. Specifically, a random pulse voltage generation and transmission device (not shown) that generates a random pulse voltage on the basis of a signal processing algorithm and transmits the generated random pulse voltage to the imaging element including the light control device is provided. Here, one or a plurality of random pulse voltage generation and transmission devices are disposed for a plurality of imaging elements including the light control device. The light control device and the random pulse voltage generation and transmission device are connected by connection lines formed of a nanocarbon film or a transparent conductive material layer.

Imaging elements are arranged in a two-dimensional matrix configuration in a first direction and a second direction,
the first nanocarbon film extends in the first direction and is shared between the imaging elements arranged in the first direction,
the second nanocarbon film extends in the second direction and is shared between the imaging elements arranged in the second direction, and
a positive-polarity random pulse voltage is applied to the first nanocarbon film and a negative-polarity random pulse voltage is applied to the second nanocarbon film is possible.

Specifically, in the imaging device of Embodiment 9, one random pulse voltage generation and transmission device is disposed for a plurality of imaging elements occupying one column (arranged in the column direction). A vertical scan circuit (V SCAN CIRCUIT) 31 and a horizontal scan circuit (H SCAN CIRCUIT) 32 described later with reference to FIG. 14 serve also as the random pulse voltage generation and transmission device. From the random pulse voltage generation and transmission device, a random pulse voltage is applied to the first nanocarbon film and the second nanocarbon film of the light control device included in each imaging element, or is applied to the first electrode and the second electrode. Consequently, the light transmittance of the light control device in each imaging element changes randomly. That is, the light transmittance of the light control device in each imaging element changes from a low value to a high value randomly. Here, the integrated amount of random pulse voltage corresponds to the amount of stored charge in the light receiving element; hence, when the application of random pulse voltage is continued for a prescribed period of time, charge is increasingly accumulated in the light receiving element. Thus, light transmittance modulation in accordance with the random pulse voltage is performed for each imaging element randomly in, for example, 16 imaging frames, that is, the light transmittance is changed in units of one imaging element (one pixel) in, for example, every set of 16 imaging frames; thereby, images are obtained. Then, these images are used to restore the moving images. The number of imaging frames (in this example, 16) is selected appropriately in accordance with the compression rate.

Since images captured continuously for a certain period of time can be expressed by a finite number of images by utilizing the sparseness of images, the compression of image data is enabled. Furthermore, since all the images are not necessarily sparse, data transformation may be performed beforehand in order to provide sparseness, and images provided with sparseness can be obtained by the transformation. Thus, the image data of moving images, which originally have a large volume, can be compressed, and images can thereby be communicated wirelessly. Consequently, the power consumption value can be greatly reduced as compared to the result of performing image processing with the main body of the imaging device.

Figure 13:
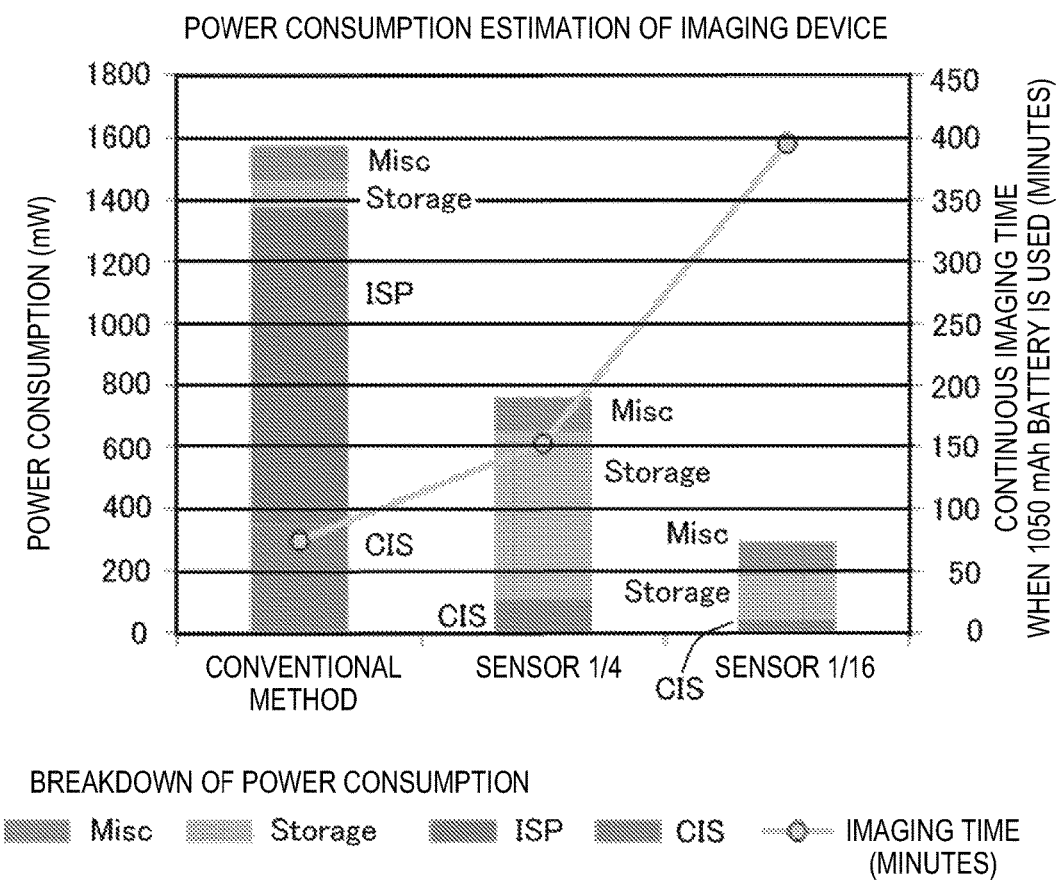
FIG. 13 is a graph showing a power consumption estimation of the imaging device etc. when imaging is performed with a camera including the imaging device on the basis of an imaging system using an imaging device of Embodiment 9 and a conventional imaging system.

A power consumption estimation of the imaging device etc. when imaging is performed with a camera including the imaging device on the basis of an imaging system using an imaging device of Embodiment 9 and a conventional imaging system is shown in the graph of FIG. 13. In FIG. 13, "Misc" denotes the overhead put on devices in common, "Storage" the power consumption in the memory portion, "ISP" the power consumption in image signal processing, and "CIS" the power consumption in the imaging elements. The vertical axis of FIG. 13 represents the power consumption; the left bar graph of FIG. 13 shows the power consumption value and a breakdown thereof when imaging is performed with the conventional imaging system and image signal processing is performed, and the central and right bar graphs show the power consumption value and a breakdown thereof when imaging is performed with the imaging system using the imaging device of Embodiment 9 and image signal processing is performed. It is found that, in the conventional system, the proportion of signal processing (ISP) in the power consumption is large. On the other hand, by the system of Embodiment 9, the power consumption can be greatly reduced because there is no portion of signal processing. The central bar graph ("sensor 1/4") shows the case where the amount of image output signals is compressed to 1/4, and the right bar graph ("sensor 1/16") shows the case where the amount of image output signals is compressed to 1/16. When the compression rate is increased, the amount of data outputted by the imaging elements is reduced, and the power consumption necessary for reading is reduced. This can be understood also from the fact that the value of the power consumption in the imaging elements CIS has decreased in the central bar graph and the right bar graph of FIG. 13.

The signal processing in Embodiment 9 will now be described. For the details, IEEE Journal of Solid-State Circuits (January 2013), "CMOS image sensor with per-column-Δ ADC and programmable compressed sensing" is given as a reference.

In the imaging of conventional systems, image output signals are obtained by exposure to light for a certain period of time. On the other hand, in Embodiment 9, image output signals equivalent to them are expressed by a random exposure pattern and the integration of the moving image states at certain times. Therefore, continuous moving images are expressed by finite image output signals, and thereby the image output signals of the imaging elements can be compressed. That is, the image output signals from the imaging elements including the light control device are thinned out spatially and temporally, and thereby the image output signals are compressed.

Figure 14:
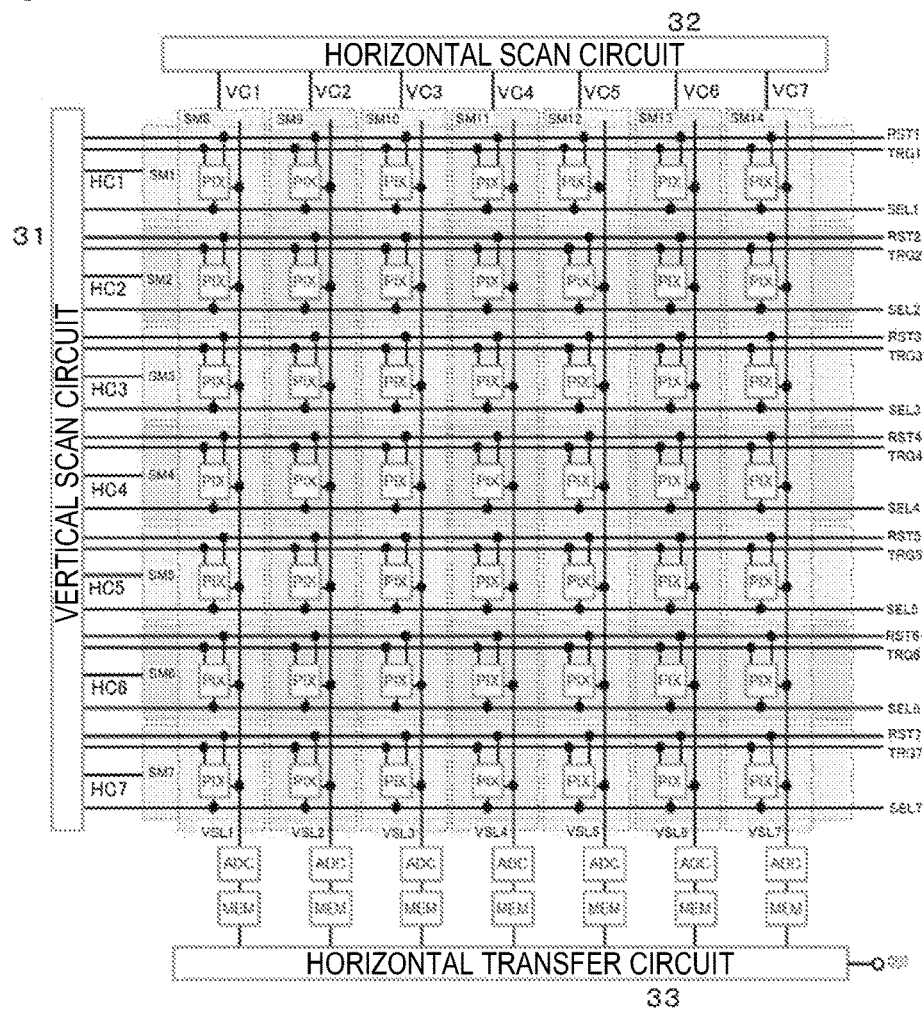
FIG. 14 is a diagram showing an example of the configuration of a pixel drive circuit in an imaging device of Embodiment 9.

In FIG. 14, the configuration of a pixel drive circuit in the imaging device of Embodiment 9 is shown. In FIG. 14, (7 imaging elements)×(7 imaging elements) are illustrated for the sake of convenience.

The pixel drive circuit in Embodiment 9 includes a vertical scan circuit (V SCAN CIRCUIT) 31 that generates a pixel control signal on a row basis and a horizontal scan circuit (H SCAN CIRCUIT) 32 that generates a pixel control signal on a column basis.

Imaging elements (pixels, PIXs) are arranged in a two-dimensional matrix configuration (in a lattice configuration). Pixel reset control signal lines (RST1 to RST7), pixel transfer control signal lines (TRG1 to TRG7), and pixel select control signal lines (SEL1 to SEL7) extend from the vertical scan circuit 31 for each row, and the imaging elements (pixels) of the same row are connected to one pixel reset control signal line, one pixel transfer control signal line, and one pixel select control signal line.

The pixel drive circuit in Embodiment 9 further includes a horizontal transfer circuit (H TRANSFER CIRCUIT) 33 for outputting the image output signal read from the imaging element (pixel) to the outside. Vertical signal lines (VSL1 to VSL7) are drawn on a column basis, and the imaging elements (pixels) of the same column are connected to one vertical signal line, and each of all the vertical signal lines is connected to the horizontal transfer circuit 33 via an A/D converter (ADC) and a memory (MEM).

The first nanocarbon film (or the second nanocarbon film) of the light control device included in each of the imaging elements arranged in the row direction is formed to be shared between the imaging elements arranged in the row direction; in FIG. 14, they are shown by SM1 to SM7. The second nanocarbon film (or the first nanocarbon film) of the light control device included in each of the imaging elements arranged in the column direction is formed to be shared between the imaging elements arranged in the column direction; in FIG. 14, they are shown by SM8 to SM14. The nanocarbon films in units of rows (SM1 to SM7) are connected to the vertical scan circuit 31 via nanocarbon film control first signal lines (horizontal stacked film control signal lines HC1 to HC7) corresponding to connection lines. The nanocarbon films in units of columns (SM8 to SM14) are connected to the horizontal scan circuit 32 via nanocarbon film control second signal lines (vertical stacked film control signal lines VC1 to VC7) corresponding to connection lines. As described above, the vertical scan circuit (V SCAN CIRCUIT) 31 and the horizontal scan circuit (H SCAN CIRCUIT) 32 serve also as the random pulse voltage generation and transmission device, and a voltage is applied to the nanocarbon film via the nanocarbon film control first signal lines HC1 to HC7 and the nanocarbon film control second signal lines VC1 to VC7. By employing such a configuration, the manufacturing process of the imaging elements can be simplified, and the pixel can be miniaturized. The connection line is formed of a nanocarbon film or a transparent conductive material layer. In a light control device including the first electrode and the second electrode, the wording of "the first nanocarbon films SM1 to SM7" may be changed to "the first electrode or the second electrode," and the wording of "the second nanocarbon films SM8 to SM14" may be changed to "the second electrode or the first electrode."

Figure 15A:
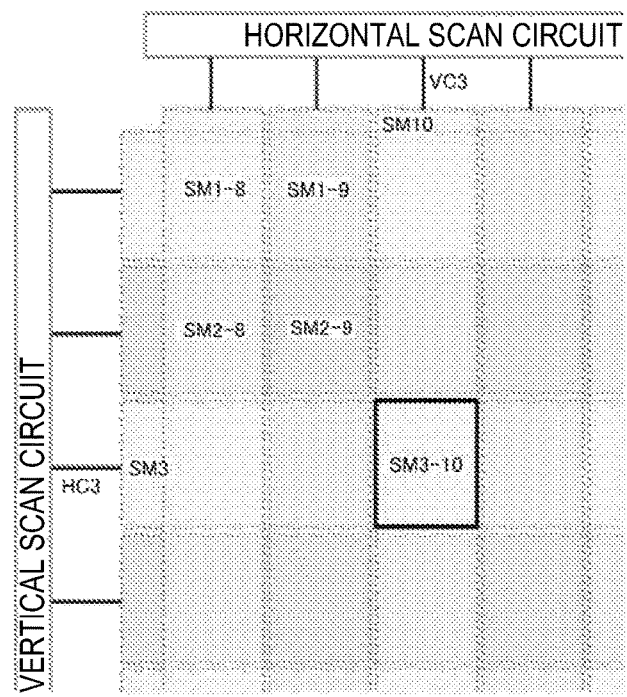
FIG. 15A is a diagram showing an example of the configuration of part of the pixel drive circuit in the imaging device of Embodiment 9.

In FIG. 15A, a diagram in which various elements related to pixel driving are removed from FIG. 14 for easier viewing is shown. In order to control the light transmittance of the light control device included in one imaging element (pixel) SM3-10, a positive-polarity random pulse voltage ($V_2$>0), for example, is applied to the common nanocarbon film SM3 of the third row via the nanocarbon film control first signal line (HC3) extending from the vertical scan circuit 31, and a negative-polarity random pulse voltage ($V_4$<0), for example, is applied to the common nanocarbon film SM10 of the third column via the nanocarbon film control second signal line (VC3) extending from the horizontal scan circuit 32.

Figure 15B:
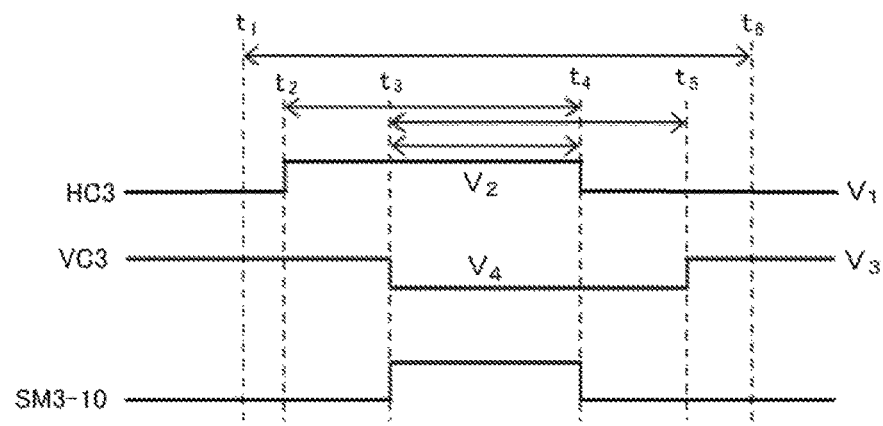
FIG. 15B is a diagram showing voltages applied to a nanocarbon film control first signal line and a nanocarbon film control second signal line and the change in light transmittance of the light control device included in an imaging element.

In FIG. 15B, the voltage applied to the nanocarbon film control first signal line (HC3), the voltage applied to the nanocarbon film control second signal line (VC3), and a manner of the light transmittance change of the light control device included in the imaging element SM3-10 are shown. The horizontal axis of FIG. 15B represents time.

Here, the period from time $t_1$ to $t_6$ is the period in which the imaging element is exposed to light in, for example, 16 imaging frames. In the periods other than the period of $t_1$ to $t_6$, the voltage applied to the nanocarbon film control first signal line (HC3) is set relatively low ($V_1$ volts), and the voltage applied to the nanocarbon film control second signal line (VC3) is set relatively high ($V_3$ volts); thus, the light transmittance of the light control device is low (see the light transmittance characteristics shown in FIG. 16A), and the light control device blocks the visible light incident on the light receiving element. On the other hand, in the period of $t_2$ to $t_4$, a first specified voltage (high voltage $V_2$>$V_1$) is applied to the nanocarbon film control first signal line (HC3); and in the period of $t_3$ to $t_5$, a second specified voltage (low voltage $V_4$<$V_3$) is applied to the nanocarbon film control second signal line (VC3). As a result of the above, before the period $t_2$ and after the period $t_5$, the light transmittance of the light control device is low (see the light transmittance characteristics shown in FIG. 16A), and the light control device blocks the visible light incident on the light receiving element. Also in the period of $t_2$ to $t_3$ and the period of $t_4$ to $t_5$, the light control device exhibits light transmittance characteristics like those shown in FIG. 16B, and the light control device blocks the visible light incident on the light receiving element. On the other hand, in the period of $t_3$ to $t_4$, the light control device exhibits light transmittance characteristics like those shown in FIG. 16C, and the light control device allows visible light to be incident on the light receiving element. Thus, in Embodiment 9, a kind of "AND circuit" in which a positive-polarity random pulse voltage, for example, is applied to the nanocarbon film control first signal line and a negative-polarity random pulse voltage, for example, is applied to the nanocarbon film control second signal line is constructed; thereby, the light transmittance of the nanocarbon film can be controlled. Also $V_1=-V_3$ is possible; $V_1$ and $V_3$ may be the ground potential; and $V_1 \approx -1$ volt, $V_2 \approx 2$ volts, $V_3 \approx 1$ volt, and $V_4 \approx -2$ volts may be illustrated, for example.

Figure 16A:
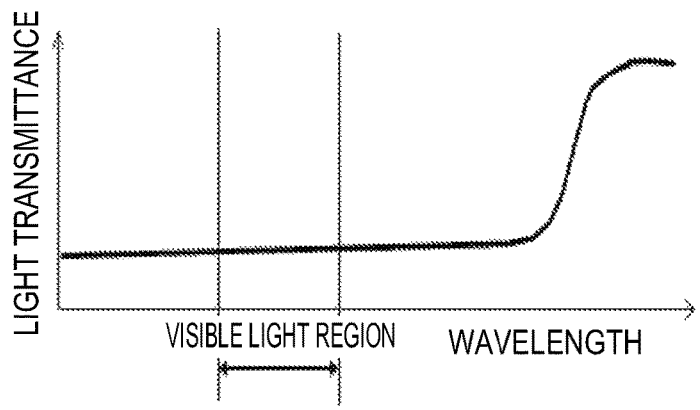
FIG. 16A, FIG. 16B, and FIG. 16C are conceptual diagrams showing light transmittance characteristics of the light control device in the imaging device of Embodiment 9.
Figure 16B:
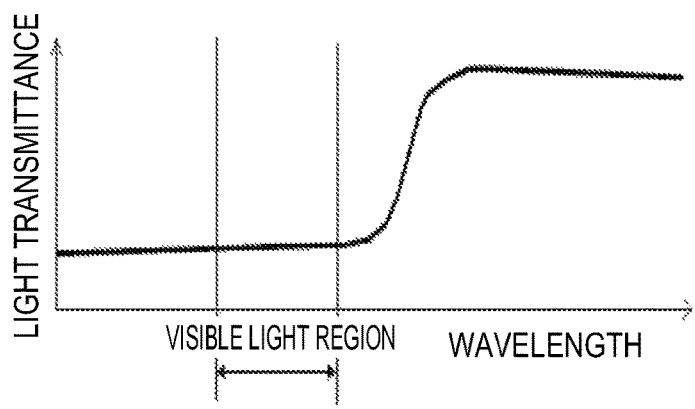
Figure 16C:
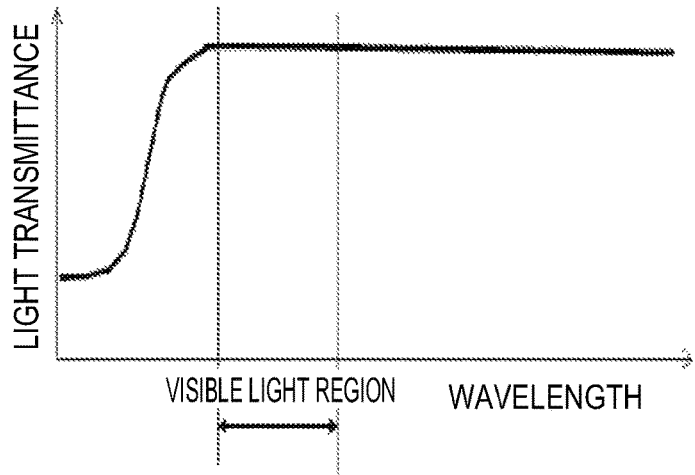

In the states shown in FIG. 16A and FIG. 16B, modulations of light transmittance occur in the infrared region; in this case, in an imaging device for visible light use, usually an infrared cut filter is disposed on the light incidence portion. Therefore, modulations of light transmittance like those shown in FIG. 16A and FIG. 16B are not used. However, when, for example, a modulation of light transmittance in the infrared region is needed in use of monitoring etc., the infrared cut filter may be removed and modulations of light transmittance like those shown in FIG. 16A and FIG. 16B may be used as appropriate.

Figure 17A:
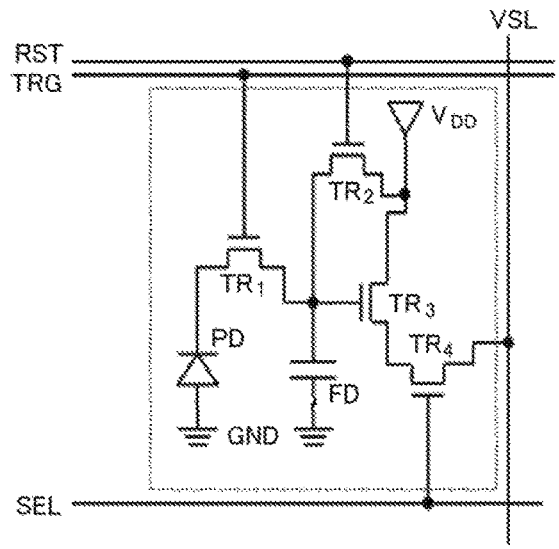
FIG. 17A is a diagram showing the configuration of an internal circuit of the imaging element included in the imaging device of Embodiment 9.
Figure 17B:
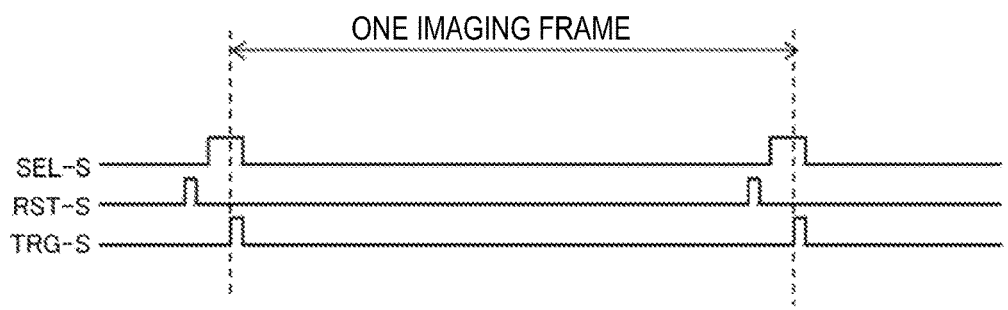
FIG. 17B is a diagram showing control conditions in which the incident light on the imaging element is converted to an image output signal.

The configuration of an internal circuit of the imaging element (pixel, PIX) included in the imaging device of Embodiment 9 is shown in FIG. 17A, and control conditions in which the incident light on the imaging element is converted to an image output signal are shown in FIG. 17B. Specifically, one imaging element is composed of a light receiving element (photodiode) PD that receives and photoelectrically converts incident light and stores a charge, a floating diffusion FD that temporarily stores the charge generated in the light receiving element PD, a first transistor $TR_1$ that controls the transfer of charge from the light receiving element PD to the floating diffusion FD, a second transistor $TR_2$ that resets the charge of the floating diffusion FD, a third transistor $TR_3$ that extracts an output signal in proportion to the charge stored in the floating diffusion FD (stored charge signal), and a fourth transistor $TR_4$ that controls the reading of the output signal (stored charge signal). As shown in FIG. 14, the pixel reset control signal line, the pixel transfer control signal line, and the pixel select control signal line extend from the vertical scan circuit 31 for each row; in FIG. 17A, one pixel reset control signal line (RST), one pixel transfer control signal line (TRG), and one pixel select control signal line (SEL) are illustrated. The first transistor $TR_1$ is connected to the pixel transfer control signal line (TRG), the second transistor $TR_2$ is connected to the pixel reset control signal line (RST), and the fourth transistor $TR_4$ is connected to the pixel select control signal line (SEL). The fourth transistor $TR_4$ is connected also to the vertical signal line (VSL).

In FIG. 17B, the timing at which each control signal is applied is shown. The horizontal axis represents time. The imaging element repeats the operation of converting the output signal (stored charge signal) to an image output signal, outputting the resulting signal, and resetting the floating diffusion FD, at each end of the exposure periods of 16 imaging frames (period $t_1$ to $t_6$). At the end of the exposure period, first, a pixel reset control signal (RST-S) is applied to the second transistor $TR_2$, and the electric potential of the floating diffusion FD is reset to a $V_{DD}$ level. Next, a pixel select control signal (SEL-S) is applied, and the electric potential of the floating diffusion FD which has been reset is read to the vertical signal line (VSL) via the third transistor $TR_3$ and the fourth transistor $TR_4$. Next, in the state where the pixel select control signal (SEL-S) is kept applied, a pixel transfer control signal (TRG-S) is applied to the first transistor $TR_1$ and thus the charge stored in the light receiving element PD in proportion to the light incident during the exposure period is transferred to the floating diffusion FD, and the accompanying potential change of the floating diffusion FD is read as an image output signal to the vertical signal line (VSL) via the third transistor $TR_3$ and the fourth transistor $TR_4$. From the image output signal, which is continuously read in this way, discretized differential signals are calculated by the A/D converter (ADC) and the memory (MEM) connected to the vertical signal line (VSL), and are outputted by the horizontal transfer circuit 33.

Figure 18:
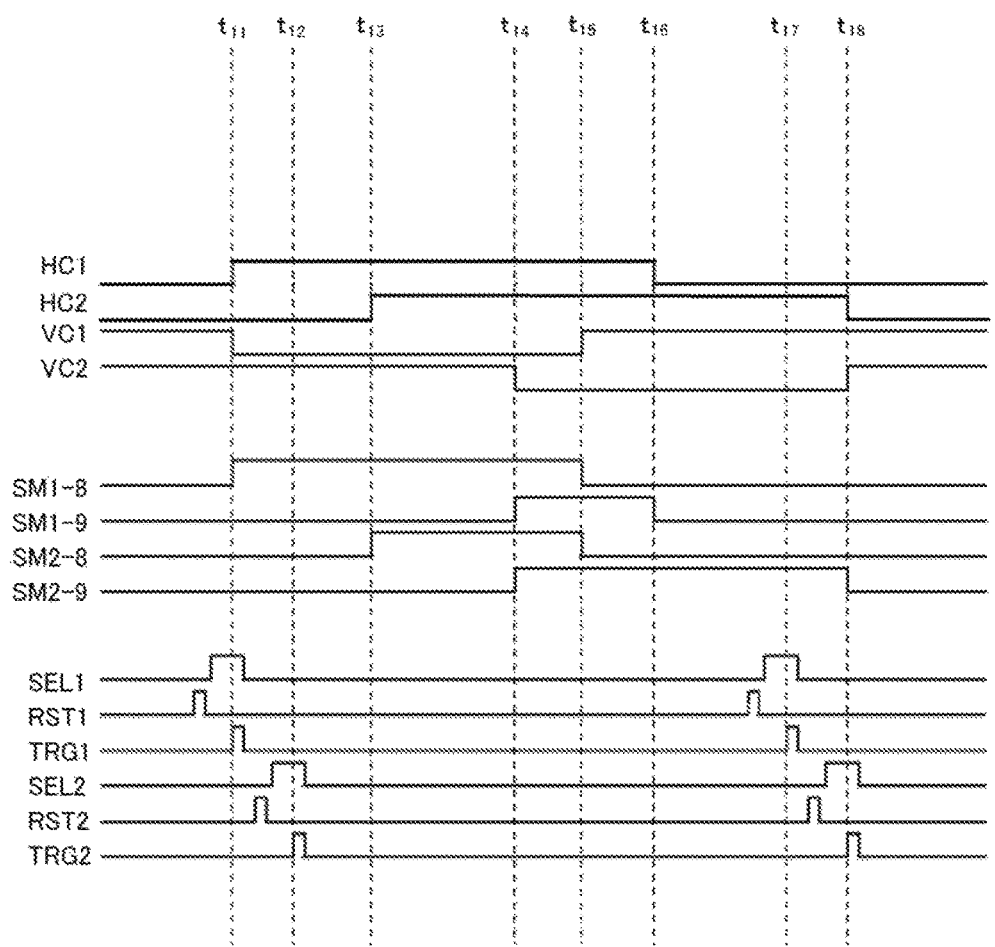
FIG. 18 is a diagram showing temporal changes of each control signal in the pixel drive circuit and the light transmittance in each imaging element for (2 imaging elements)×(2 imaging elements).

In FIG. 18, temporal changes of each control signal in the pixel drive circuit and the light transmittance in each imaging element for (2 imaging elements)×(2 imaging elements) are shown. The horizontal axis of FIG. 18 represents time. Here, HC1 and HC2 denote the applied voltages to the nanocarbon films of the first row and the second row (SM1 and SM2), respectively, and VC1 and VC2 denote the applied voltages to the nanocarbon films of the first column and the second column (SM8 and SM9), respectively. These four applied voltages are designed such that the first specified voltages and the second specified voltages are applied to the nanocarbon films at timings different from each other. As described using FIG. 15B, in the light control device included in each imaging element, the light transmittance is increased only when the voltage applications to the nanocarbon film of the corresponding row and the nanocarbon film of the corresponding column are at the first specified voltage and the second specified voltage, respectively, at the same time. For example, the applied voltage HC1 to the nanocarbon film of the first row (SM1) is the first specified voltage in the period $t_{11}$ to $t_{16}$. The applied voltage HC2 to the nanocarbon film of the second row (SM2) is the first specified voltage in the period $t_{13}$ to $t_{18}$. Further, the applied voltage VC1 to the nanocarbon film of the first column (SM8) is the second specified voltage in the period $t_{11}$ to $t_{15}$. The applied voltage VC2 to the nanocarbon film of the second column (SM9) is the second specified voltage in the period $t_{14}$ to $t_{18}$. As a result of the above, in the imaging element SM1-8 including the light control device composed of the nanocarbon film of the first row and the nanocarbon film of the first column, the value of the light transmittance of the light control device is high in the period $t_{11}$ to $t_{15}$, and light is received. In the imaging element SM1-9 including the light control device composed of the nanocarbon film of the first row and the nanocarbon film of the second column, the value of the light transmittance of the light control device is high in the period $t_{14}$ to $t_{16}$, and light is received. Further, in the imaging element SM2-8 including the light control device composed of the nanocarbon film of the second row and the nanocarbon film of the first column, the value of the light transmittance of the light control device is high in the period $t_{13}$ to $t_{15}$, and light is received. In the imaging element SM2-9 including the light control device composed of the nanocarbon film of the second row and the nanocarbon film of the second column, the value of the light transmittance of the light control device is high in the period $t_{14}$ to $t_{18}$, and light is received.

On the other hand, the resetting of the floating diffusion FD and the charge transfer from the floating diffusion FD in the imaging elements are controlled by three pixel control signals of the first row (RST1, TRG1, and SEL1) and three pixel control signals of the second row (RST2, TRG2, and SEL2). The control timing thereof is similar to the description in FIG. 17B, but since the first row and the second row share the same vertical signal line (VSL1 and VSL2), it is necessary to slightly shift the read timing for the rows. For example, the timing is set such that the pixel transfer control signal of the first row (TRG1) is applied at $t_{11}$ and $t_{17}$, and on the other hand the pixel transfer control signal of the second row (TRG2) is applied at $t_{12}$ and $t_{18}$. Although the transfer times of various control signals that control the operation of the imaging element vary between rows, the period of $t_{11}$ to $t_{17}$ and the period of $t_{12}$ to $t_{18}$ are the same length, and this serves as the frame exposure period. The substantial exposure period of each imaging element is the period in which the light transmittance of the corresponding light control device is large (high) in the frame exposure period of the corresponding row.

Although the same control is performed on a row basis in this way for the resetting and charge transfer of the internal circuit, the light transmittance of the light control device corresponding to each imaging element is controlled so as to be different between imaging elements. Therefore, the substantial exposure period of each imaging element is different between imaging elements.

As a feature of the nanocarbon film, the light transmittance response speed is given. The light transmittance response speed of graphene is of the gigahertz order. Therefore, for example, when a pulse voltage is applied, light transmittance modulation in accordance with the pulse voltage can be made. That is, a charge in proportion to the integrated amount of pulse voltage is stored in the light receiving element.

In Embodiment 9, image compression is performed by generating a random pulse voltage in, for example, every set of 16 imaging frames. In FIG. 19, examples of the random pulse voltage used in Embodiment 9 are shown. Different pulse voltage patterns are generated for the imaging elements (pixels), and three pulse voltage patterns out of them are shown in FIG. 19. A random pulse voltage is generated by the random pulse voltage generation and transmission device, and the random pulse voltage is transmitted to each of the imaging elements. Then, light transmittance modulation in accordance with the random pulse voltage is performed in units of one imaging element. Consequently, images with various (e.g. 16 kinds of) light transmittances are obtained in 16 imaging frames (in FIG. 19, shown by the dotted line), and these images are signal-processed to create compressed images. The compressed images are restored in another device. Therefore, the signal processing of the imaging device is lightened, and the output of the images obtained can be lessened.

The imaging device may be specifically configured as, for example, a stacked-type image sensor. That is, the imaging device can be obtained by stacking (sticking together) an image sensor chip (first semiconductor chip) that is an aggregate of back-side illumination imaging elements and a logic circuit chip (second semiconductor chip) that is an aggregate of drive circuits. Configurations of the logic circuit chip are conceptually shown in FIG. 20A and FIG. 20B. In the logic circuit area, a drive circuit of the imaging element, a signal processing circuit of the image output signal read from the imaging element, etc. are disposed. On the logic circuit chip, the random pulse voltage generation and transmission device for controlling the light transmittance of the nanocarbon film is disposed. The random pulse voltage generation and transmission device is, for example, disposed in areas in four directions (see FIG. 20A) which are portions of the logic circuit area not spatially overlapping with the imaging element area where imaging elements are arranged (in FIG. 20A, FIG. 20B, FIG. 21A, and FIG. 21B, shown by the area enclosed by the dotted line), or disposed in areas in two directions on the outside (see FIG. 20B) when the propagation delay poses no problem. A random pulse voltage is generated in order to control the light transmittance of each imaging element independently. Electrodes for transmitting a random pulse voltage are formed in each random pulse voltage generation and transmission device, and are, after the stacking with the image sensor chip, connected to the connection lines extending on the back surface side of the image sensor chip via through-silicon vias (TSVs) and further connected to the first interconnection and the second interconnection. By disposing the random pulse voltage generation and transmission device in portions of the logic circuit area not spatially overlapping with the imaging element area (areas on both sides on the outside or areas in four directions on the outside), the propagation delay due to the contact resistance between the nanocarbon film and the TSV embedded metal layer being high can be reduced. In Embodiment 10 described later, other than the arrangements shown in FIG. 20A and FIG. 20B, the random pulse voltage generation and transmission device may be disposed, as shown in FIG. 21A, in areas on both sides on the outside which are portions of the logic circuit area not spatially overlapping with the imaging element area where imaging elements are arranged, or may be disposed, as shown in FIG. 21B, only in an area on one side on the outside when the propagation delay poses no problem.

Figure 20A:
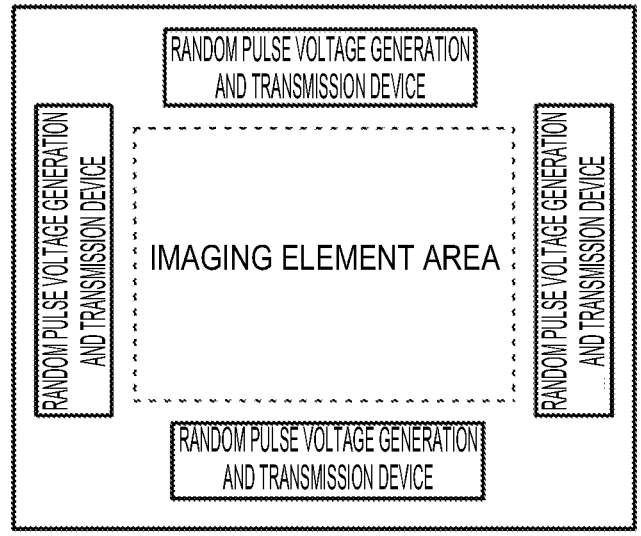
FIG. 20A and FIG. 20B are diagrams conceptually showing configurations of the logic circuit chip included in the imaging device of Embodiment 9.
Figure 20B:
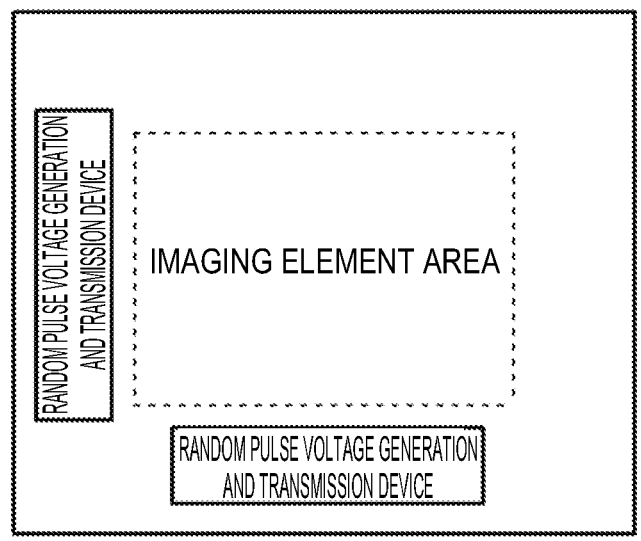
Figure 21A:
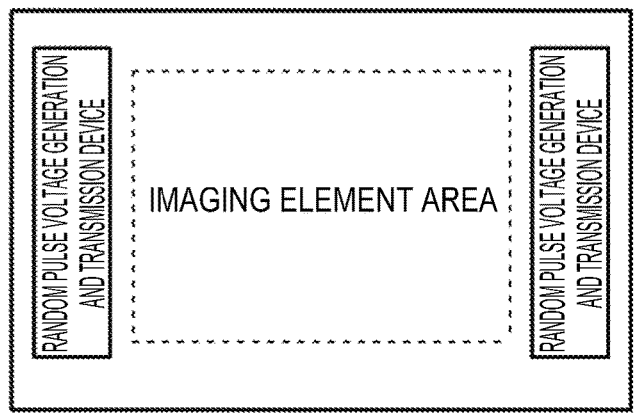
FIG. 21A and FIG. 21B are diagrams conceptually showing configurations of the logic circuit chip included in the imaging device of Embodiment 10.
Figure 21B:
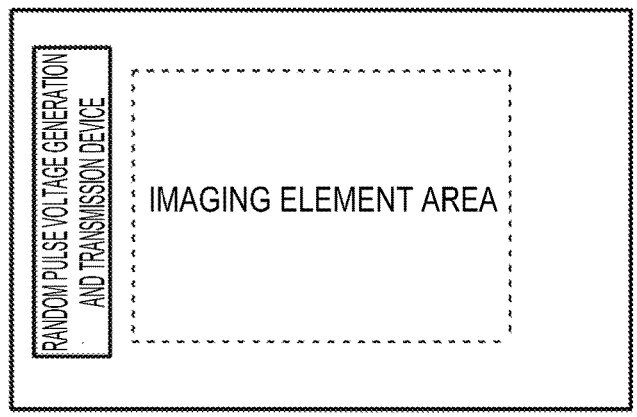
Figure 22:
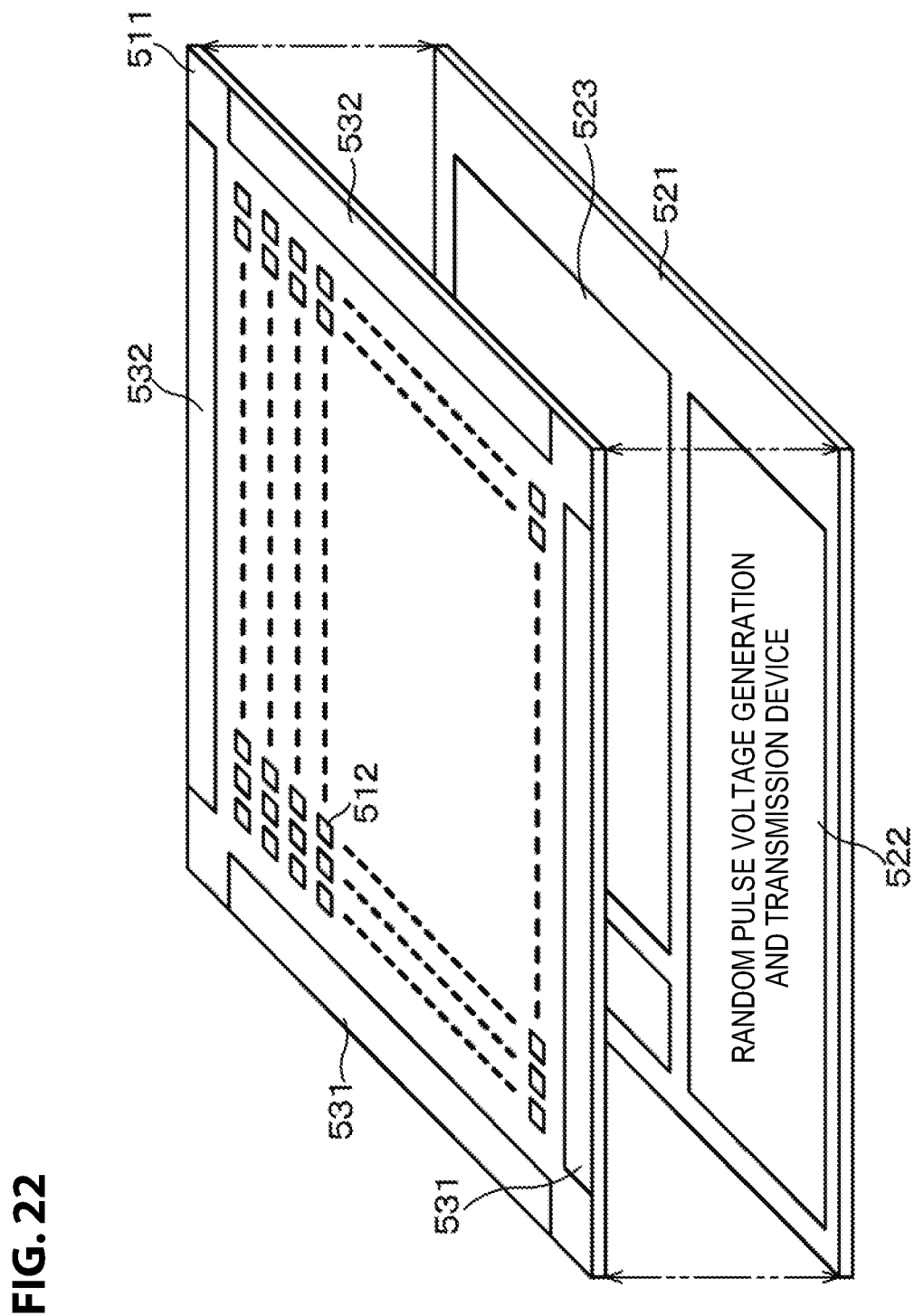
FIG. 22 is a conceptual diagram of an imaging device having a structure in which a first semiconductor chip and a second semiconductor chip are stacked in the imaging device of Embodiment 9.

A conceptual diagram of the stacked-type image sensor shown in FIG. 20B is shown in FIG. 22, for example. Here, imaging elements 512 arranged in a two-dimensional matrix configuration are provided on a first semiconductor chip (image sensor chip) 511, and random pulse voltage generation and transmission devices 522 that generate a random pulse voltage and transmits the generated random pulse voltage to the imaging element including the light control device are provided on a second semiconductor chip (logic circuit chip) 521. However, in FIG. 22, only one random pulse voltage generation and transmission device 522 is shown. The first semiconductor chip 511 and the second semiconductor chip 521 are stacked based on a known method. In FIG. 22, the first semiconductor chip 511 and the second semiconductor chip 521 are illustrated in a separate state for convenience of description. The light control device and the random pulse voltage generation and transmission device 522 are connected via through-silicon vias (TSVs) 531. Alternatively, a form in which they are connected via bumps (a form based on a chip-on-chip system) may be employed. The imaging element may be configured as a back-side illumination type, or may be configured as a front-side illumination type. On the second semiconductor chip 521, in addition to the above, various circuits 523 including a logic circuit that drives and controls the imaging element are provided.

In a peripheral portion of the first semiconductor chip 511, a pad unit 532 for making the electrical connection to the outside and the TSV 531 for making the electrical connection to the second semiconductor chip 521 are provided. Also a configuration in which a bonding pad unit is provided on the second semiconductor chip 521 on the lower side, openings are provided in the first semiconductor chip 511, and wire bonding is made on the bonding pad unit provided on the second semiconductor chip 521 via the openings provided in the first semiconductor chip 511, and a configuration in which substrate mounting is made from the second semiconductor chip 521 using a TSV structure are possible. Alternatively, the electrical connection between the imaging element 512 on the first semiconductor chip 511 and the various circuits on the second semiconductor chip 521 may be made via bumps based on a chip-on-chip system.

By the above, in Embodiment 9, the power consumption of the imaging device has been able to be reduced to approximately ⅕ of that of conventional ones by compressing the image obtained by the imaging element and thus compressing the size of the output image.

Figure 23A:
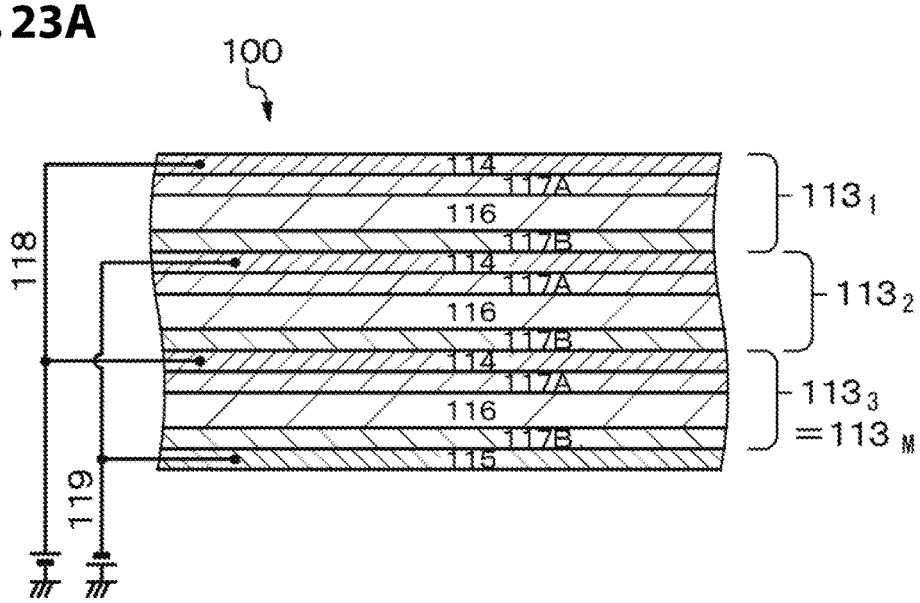
FIG. 23A and FIG. 23B are schematic cross-sectional views of modification examples of the light control device in the imaging element included in the imaging device of Embodiment 9.
Figure 23B:
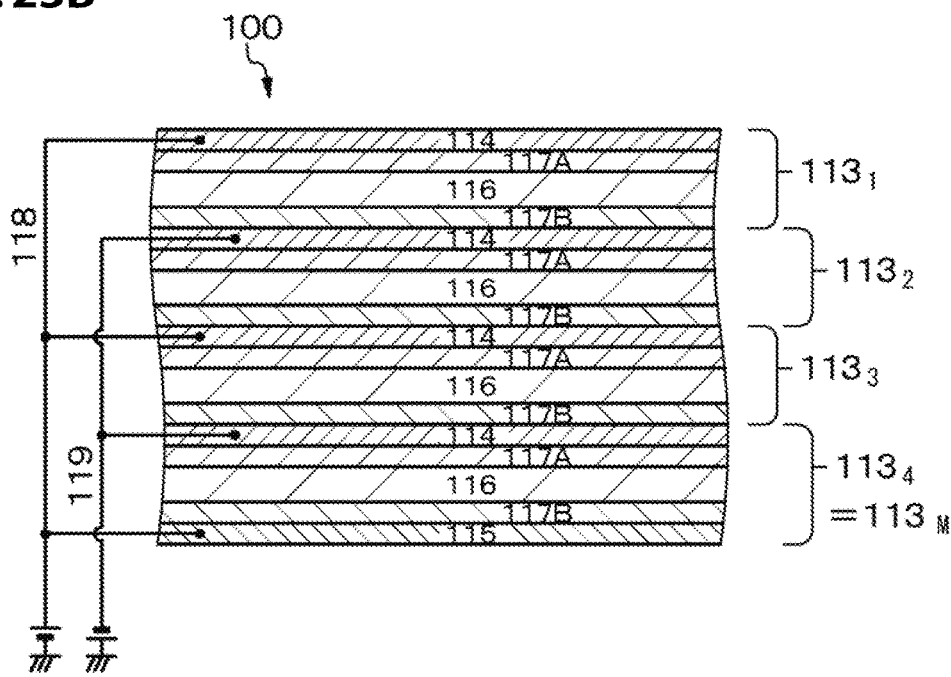

Schematic cross-sectional views of modification examples of the light control device in the imaging element included in the imaging device of Embodiment 9 are shown in FIG. 23A and FIG. 23B. The light control device (light control element) shown in FIG. 23A is a modification example of the light control device (light control element) shown in FIG. 1A, and the light control device (light control element) shown in FIG. 23B is a modification example of the light control device (light control element) shown in FIG. 1B. In these modification examples, the random pulse voltage has positive and negative polarities. When a random pulse voltage having a positive polarity is applied to the first nanocarbon film, a random pulse voltage having a negative polarity is applied to the second nanocarbon film. Alternatively, a configuration in which, when a random pulse voltage having a negative polarity is applied to the first nanocarbon film, a random pulse voltage having a positive polarity is applied to the second nanocarbon film is possible.

Figure 24:
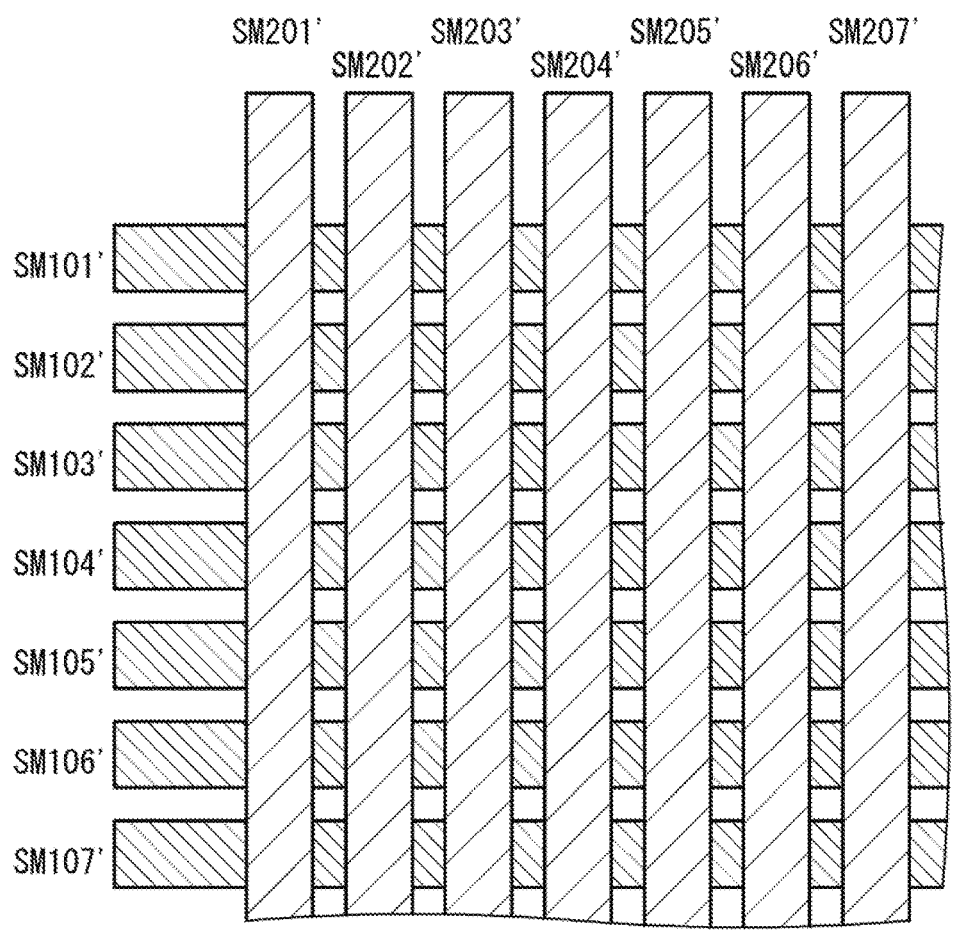
FIG. 24 is a diagram schematically showing the arrangement of part of the imaging elements included in a modification example of the imaging device of Embodiment 9.
Figure 25:
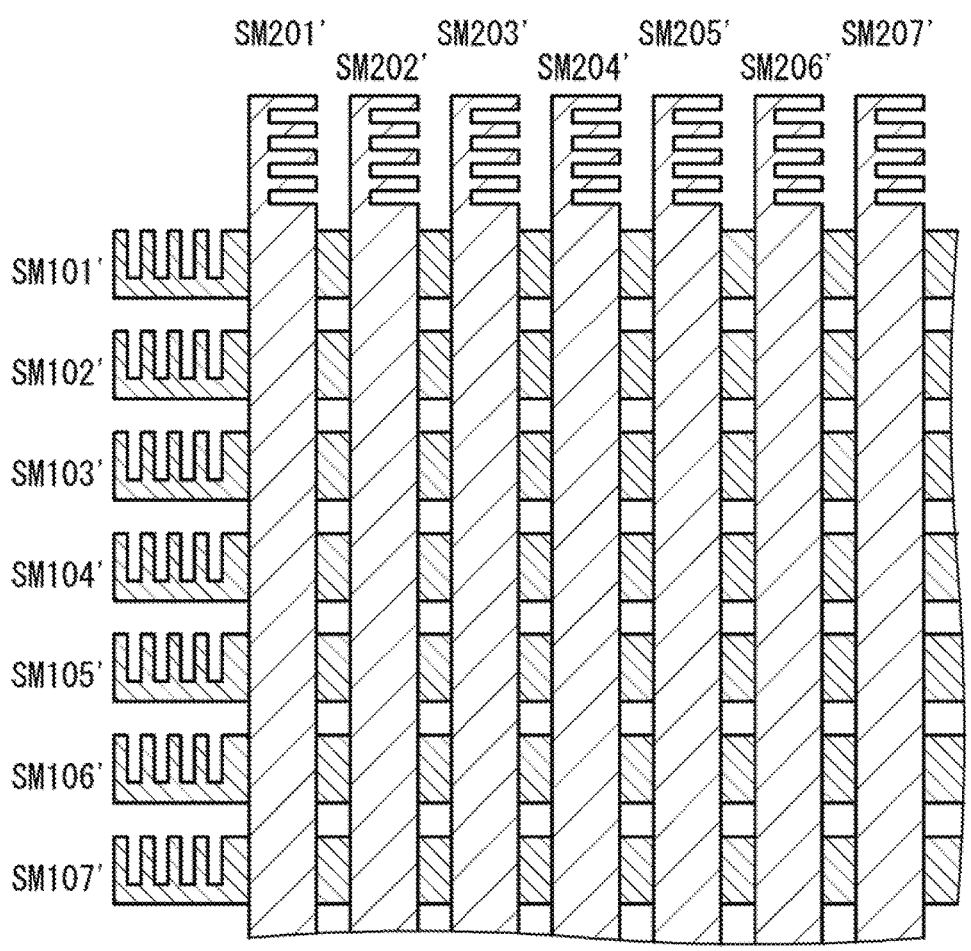
FIG. 25 is a diagram schematically showing the arrangement of part of the imaging elements included in another modification example of the imaging device of Embodiment 9.

Here, as shown in FIG. 24, which is a schematic diagram of the arrangement of part of the imaging elements arranged in a two-dimensional matrix configuration, a plurality of first nanocarbon films (or a plurality of second nanocarbon films) SM101' to SM107' etc. of the light control devices included in the imaging elements arranged in the row direction are formed to be shared between the imaging elements arranged in the row direction (that is, occupying one row). A plurality of second nanocarbon films (or a plurality of first nanocarbon films) SM201' to SM207' etc. of the light control devices included in the imaging elements arranged in the column direction are formed to be shared between the imaging elements arranged in the column direction (that is, occupying one column). The nanocarbon films SM101' to SM107' and the nanocarbon films SM201' are alternately stacked. Also the nanocarbon films SM101' to SM107' and the nanocarbon films SM202', SM203', SM204', SM205', SM206', and SM207' are similarly alternately stacked. In FIG. 24 and FIG. 25 described below, the first nanocarbon film and the second nanocarbon film are marked with oblique lines in order to clearly show them. The logic of an AND circuit is used by applying random pulse voltages having positive and negative polarities to these first nanocarbon films and these second nanocarbon films, that is, applying random pulse voltages on a row basis and on a column basis; thereby, the light transmittance of the light control device included in each imaging element can be controlled on an imaging element basis. Therefore, it becomes unnecessary to provide an interconnection for applying a random pulse voltage near the imaging element, and the interconnection can be simplified. The nanocarbon film is patterned in a band shape; when the width of the band-like nanocarbon film is made much larger (wider) than the size of the light receiving element, the occurrence of problems such as stray light and color mixing can be prevented reliably.

In FIG. 25, the arrangement of part of the imaging elements arranged in a two-dimensional matrix configuration of a modification example is schematically shown. Due to the high-speed light transmittance modulation of the nanocarbon film, the increase in the number of imaging elements, and the stacking of nanocarbon films, there is a possibility that the integrated amount of contact resistance values between the nanocarbon film and the connection line will influence the high-speed light transmittance modulation of the nanocarbon film. To cope with this, a form in which an end portion of the first nanocarbon film extending in the first direction is patterned in a comb electrode configuration and an end portion of the second nanocarbon film extending in the second direction is patterned in a comb electrode configuration is possible. Specifically, in the example shown in FIG. 25, end portions of the first nanocarbon films (or the second nanocarbon films) SM101' to SM107' etc. of the light control devices included in the imaging elements arranged in the row direction and end portions of the second nanocarbon films (or the first nanocarbon films) SM201' to SM207' etc. of the light control devices included in the imaging elements arranged in the column direction are patterned in what is called a comb electrode configuration. The perimeter of the end portion is set to approximately 20 times, for example. Thereby, the contact resistance value between the nanocarbon film and the connection line can be reduced to approximately 1/20. In the actual imaging device, a certain area of dead space is needed between the effective pixel area and the chip end as a measure against shading. Therefore, when the end portion of the nanocarbon film is drawn out using the space, it can be drawn out up to approximately 0.1 mm at the maximum. In general, the contact portion between the nanocarbon film and metal has a high contact resistance, and this delays electric signals. Although the resistance of the nanocarbon film itself is low, the contact resistance with metal is high because the electron density near the Fermi level is low. However, by forming the end portion of the nanocarbon film in a comb electrode configuration, the contact area with the connection line is increased, and thereby the contact resistance with the connection line can be reduced.

For example, when the pixel size is set to 1 μm square, the contact resistance between graphene and the connection line is $$10 \times^{-5} \times 10^7 \times 10^4 = 10^6 \text{ ohms,}$$

and the charge for each imaging element is $40 \times 10^{-6} \times 10^{-8} \approx 0.4$ pC. Therefore, the (virtual) capacitance is approximately $(0.4)/4 = 0.1$ pF. Thereby, the time constant RC of a kind of capacitor formed of graphene is estimated as $$RC = (10^3 + 10^6) \times 0.1$$
$$\approx 100 \text{ nanoseconds.}$$

For example, when an imaging device of one million pixels (1000 pixels×1000 pixels) is used, the capacitance of one row is added 1000-column times, and the switching speed on the positive electrode side and the negative electrode side is approximately 200 microseconds. Assuming that driving is performed at an imaging frame rate of 100 fps of still images, one imaging frame corresponds to 10 milliseconds, and when a rise of pulse voltage at a speed of approximately 1/10 thereof is acceptable, 1 millisecond is required as the rise time of pulse voltage, for example. Although the value of 200 microseconds is shorter than the required switching speed of 1 millisecond, it is preferable to attempt to reduce the contact resistance in view of the facts that (A) when the number of pixels is increased in the future, the capacitance is increased, (B) the contact resistance between graphene and the connection line is in practice much higher than the value mentioned above, and (C) there is a case where the capacitance varies due to the influence of process variations etc.

[Embodiment 10]

Embodiment 10 is modifications of Embodiment 9. In Embodiment 9, a kind of "AND circuit" is constructed by means of the nanocarbon film control first signal line and the nanocarbon film control second signal line, and thereby the light transmittance of the nanocarbon film is controlled. On the other hand, in Embodiment 10, a random pulse voltage is applied to each of the imaging elements. By employing such a configuration, the application pattern of the random pulse voltage applied to the imaging element can be made an arbitrary pattern.

That is, a random pulse voltage is applied from the random pulse voltage generation and transmission device to the first electrode or the second electrode of the light control device included in each imaging element. Consequently, the light transmittance of the light control device in each imaging element changes randomly. Specifically, the light transmittance of the light control device in each imaging element changes from a low value to a high value randomly. Here, since the integrated amount of random pulse voltage is equivalent to the amount of stored charge in the light receiving element, when the application of random pulse voltage is continued for a prescribed period of time, charge is increasingly accumulated in the light receiving element. Thus, light transmittance modulation in accordance with the random pulse voltage is performed for each imaging element randomly in, for example, 16 imaging frames, that is, the light transmittance is changed in units of one imaging element (one pixel) in, for example, every set of 16 imaging frames; thereby, images are obtained. Then, these images are used to restore the moving images. The number of imaging frames (in this example, 16) is appropriately selected in accordance with the compression rate.

Although the first electrode, the first nanocarbon film, the second electrode, and the second nanocarbon film are formed for each of the imaging elements, it is possible to form the first electrode, the first nanocarbon film, and the second nanocarbon film for each imaging element independently and form the second electrode with sharing between all the imaging elements, or it is possible to form the first nanocarbon film, the second nanocarbon film, and the second electrode for each imaging element independently and form the first electrode with sharing between all the imaging elements. Here, the positional relationship between the first electrode or the second electrode and the first nanocarbon film or the second nanocarbon film is a relative one; therefore, the first nanocarbon film may be disposed adjacent to the first electrode, or the second nanocarbon film may be disposed adjacent to the first electrode. When the uppermost electrode is defined as the first film, the uppermost nanocarbon film as the second film, the lowermost nanocarbon film as the (J−1)-th (provided that J being a natural number of 4 or more) film, and the lowermost electrode as the J-th film, the films in odd positions are electrically connected to each other via a first contact hole (not shown), and the films in even positions are electrically connected to each other via a second contact hole (not shown). In the case where the second electrode is provided to be shared between all the imaging elements, the first electrode is connected to one of the interconnections connected to the random pulse voltage generation and transmission device and random pulses are applied to the first electrode, and the second electrode is grounded. In the case where the first electrode is provided to be shared between all the imaging elements, the second electrode is connected to one of the interconnections connected to the random pulse voltage generation and transmission device and random pulses are applied to the second electrode, and the first electrode is grounded. In order not to block incident light, a two-layer interconnection process using a transparent conductive film or a nanocarbon film may be used for the connection line between the random pulse voltage generation and transmission device and the first electrode or the second electrode, for example.

Also in Embodiment 10, image compression is performed by generating a random pulse voltage in, for example, 16 imaging frames. By the random pulse voltage generation and transmission device, 16 kinds of random pulse voltages, for example, are generated in units of (7 imaging elements)×(7 imaging elements), that is, 49 pixels, and a random pulse voltage is transmitted to each of the imaging elements. In each of the imaging elements, light transmittance modulation in accordance with the random pulse voltage is performed. Consequently, images with various (e.g. 16 kinds of) light transmittances are obtained in 16 imaging frames, and these images are signal-processed to create compressed images. The compressed images are restored in another device. Therefore, the signal processing of the imaging device is lightened, and the output of the images obtained can be lessened.

[Embodiment 11]

Embodiment 11 is modifications of Embodiment 9 to Embodiment 10. In Embodiment 9 to Embodiment 10, the random pulse voltage generation and transmission device is used in order to generate a random pulse voltage. On the other hand, in Embodiment 11, a pulse voltage calculated on the basis of an output signal (stored charge signal) obtained by the imaging element including the light control device is applied to the nanocarbon film as a random pulse voltage. In Embodiment 11, the image output signals from the imaging elements including the light control device are thinned out spatially and temporally, and thereby the image output signals are compressed. Specifically, information in the imaging element is used in order to generate a random pulse voltage. That is, random exposure of the "shutter function" in IEEE ISSCC 2012, International Solid-State Circuits Conference, "CMOS image sensor with per-column Δ ADC and programmable compressed sensing" is achieved by the light control device; at this time, random information originally existing in the imaging element is used to generate a random pulse voltage.

Specifically, in Embodiment 11, attention is focused on the variation that the light receiving element (photosensor, photodiode, or photoelectric conversion element) 27 included in the imaging element has. The signal (output signal, or stored charge signal) from the light receiving element 27 is made into a constant by a logic circuit and is normalized by the pulse potential, and thereby a random pulse voltage is generated. That is, (photodiode signal/transistor application voltage+ reference potential)

is computed for each imaging element by the logic circuit, is amplified, and is transmitted to the light control device; thus, random exposure is achieved.

Figure 26A:
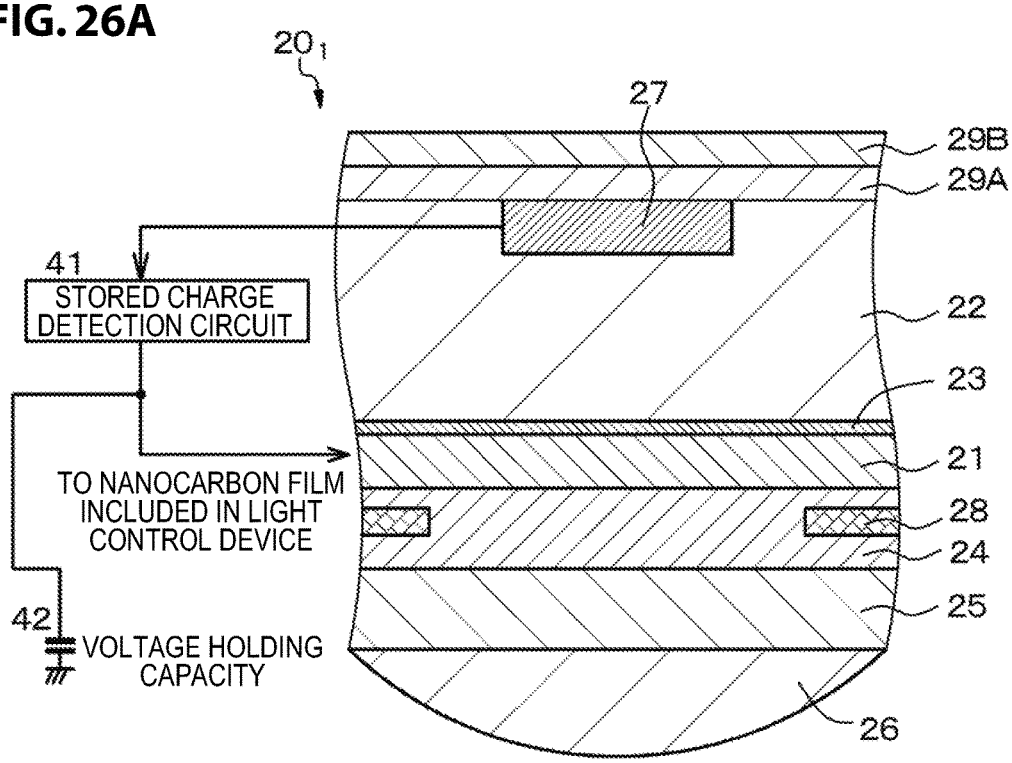
FIG. 26A and FIG. 26B are conceptual diagrams of imaging elements of Embodiment 11.
Figure 26B:
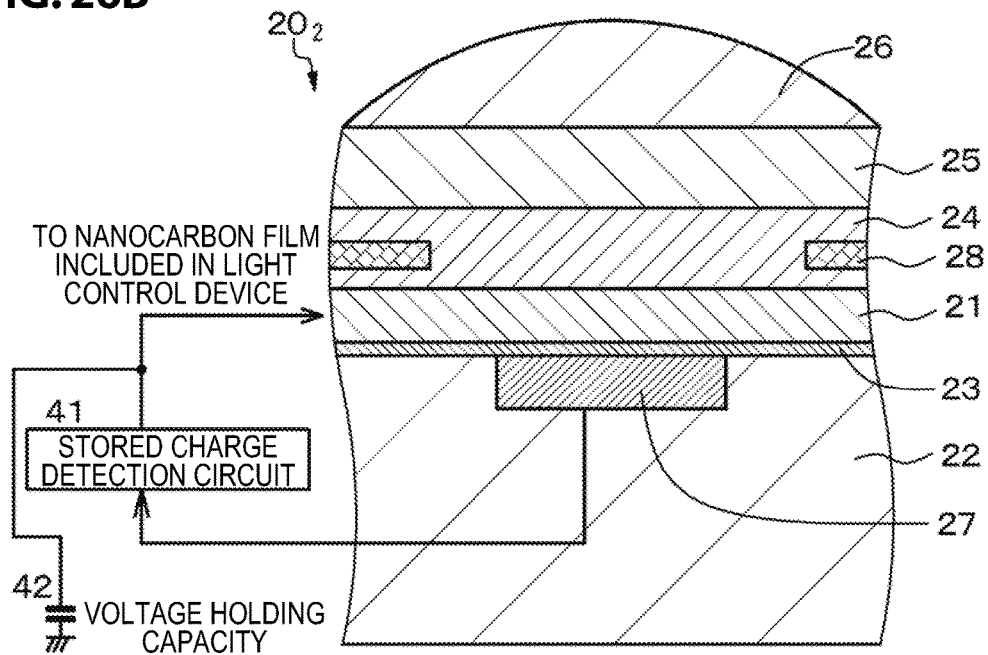

In FIG. 26A and FIG. 26B, conceptual diagrams of imaging elements of Embodiment 11 are shown; the imaging element shown in FIG. 26A is an imaging element based on the imaging element of Embodiment 6 shown in FIG. 6A, and the imaging element shown in FIG. 26B is an imaging element based on the imaging element of Embodiment 6 shown in FIG. 6B; in these imaging elements, a random pulse voltage generated by a logic circuit (not shown) provided in a stored charge detection circuit 41 and amplified is applied to the nanocarbon film included in the light control device 21 in the imaging element. A voltage holding capacity 42 is disposed between the stored charge detection circuit 41 and the light control device 21. The stored charge detection circuit 41 that monitors the output signal (stored charge signal) from the light receiving element 27 included in the imaging element may be provided for each imaging element, and thereby the random pulse voltage generation and transmission device becomes unnecessary. When it is difficult to form the stored charge detection circuit 41 for each imaging element, one stored charge detection circuit 41 may be provided for each row or each column of imaging elements, and a random pulse voltage computed in a peripheral circuit and then calculated to be randomized between imaging elements may be applied to the nanocarbon film included in the light control device 21 in each imaging element.

Although the image output signal from the imaging element is transmitted to the analog-digital converter (A/D converter, ADC) and is outputted from the A/D converter, also a pulse voltage calculated on the basis of noise generated in the A/D converter may be applied as a random pulse voltage to the nanocarbon film. That is, with focus on the noise variation of the electric signal of the A/D converter, the noise variation from the A/D converter is made into a constant by a logic circuit and is normalized by the pulse potential to generate a random pulse voltage, and the random pulse voltage is transmitted to the light control device; thereby, random exposure is achieved.

[Embodiment 12]

In Embodiment 12, images were communicated by wireless communication using a camera including the imaging device described in Embodiment 9 to Embodiment 11. That is, from the viewpoint of use for sensors in the upcoming cloud society, an example of the method for communicating images captured by a camera is illustrated. Specifically, when the image size was set to QHD, the imaging frame rate to 30 fps, and the compression rate to $1/16$, the output bit rate from the camera was 9.25 Mbps. The images were communicated wirelessly, and the total power consumption of the camera and the wireless communication device was 309 milliwatts.

The power consumption of the camera includes that of the driving of the imaging element, signal processing, and overhead; the power consumption of the camera is 68 milliwatts, and the rest is the power consumption of the wireless communication device. In Embodiment 12, since the existing radio band is used, an optimum band from the viewpoint of the power consumption of wireless communication is not necessarily used. By reselecting the radio band or using a radio band that will possibly be developed in the future, the communication power consumption can be reduced still further. Thus, in Embodiment 12, images can be communicated wirelessly with relatively low power consumption. When the image data are large, in many cases wireless communication is theoretically difficult or is not practical because of the large power consumption of the wireless communication device. However, in Embodiment 12, since the volume of the image to be communicated can be compressed, that is, since the size of the output image from the camera is small, the image after captured can be communicated wirelessly. Furthermore, based on the technology described in Embodiment 9 to Embodiment 11, not only cameras but also electronic devices equipped with various sensors can be used with the cloud. Thus, it becomes possible for users to have the same experience by sharing the time even when they are in different places, and it also becomes possible, at a point at which information is obtained (an advertisement etc.), to compare this information to the information of oneself on the cloud, to give and receive data, etc.

Hereinabove, the present disclosure is described based on preferred Embodiments, but the present disclosure is not limited to these Embodiments.

The light control device according to the first aspect to the fourth aspect of the present disclosure may be configured as a shutter device. That is, the light control device described in Embodiment 1 and Embodiment 2 may be disposed so as to cover the entire light incidence side of the imaging device. Then, for example, the first electrode and the second electrode or the nanocarbon film may be arranged in a simple matrix configuration; thus, the light transmittance in a desired region of the light control device that functions as a shutter device can be controlled. That is, by adjusting the light transmittance by applying a voltage, blocked-up shadows can be prevented in partially dark places. Furthermore, blown-out highlights can be prevented in bright subjects such as snow mountains.

The light receiving element may be formed of an organic photoelectric conversion layer. When the organic photoelectric conversion layer is formed of, for example, a material that can be photoelectrically converted in response to green light, an organic material containing a rhodamine-based coloring matter, a merocyanine-based coloring matter, quinacridone, or the like may be given, for example. Alternatively, as the material that forms the organic photoelectric conversion layer, pentacene and a derivative thereof (TIPS-pentacene etc.), naphthacene and a derivative thereof (rubrene and hexapropylnaphthacene), thiophene and a derivative thereof (P3HT etc.), a fullerene and a derivative thereof (PCBM etc.), TCNQ, perylene and a derivative thereof, a porphyrin and a derivative of the porphyrin, acridine and a derivative thereof, coumarin and a derivative thereof, quinacridone and a derivative thereof, a cyanine and a derivative thereof, squarylium and a derivative thereof, an oxazine and a derivative thereof, xanthene triphenylamine and a derivative thereof, benzidine and a derivative thereof, a pyrazoline and a derivative thereof, styrylamine and a derivative thereof, a hydrazone and a derivative thereof, triphenylmethane and a derivative thereof, carbazole and a derivative thereof, a polysilane and a derivative thereof, thiophene and a derivative thereof, a polyamine and a derivative thereof, an oxadiazole and a derivative thereof, a triazole and a derivative thereof, a triazine and a derivative thereof, quinoxaline and a derivative thereof, phenanthroline and a derivative thereof, an aluminum quinoline and a derivative thereof, poly(paraphenylene vinylene) and a derivative thereof, polyfluorene and a derivative thereof, polyvinylcarbazole and a derivative thereof, a polythiol and a derivative thereof, polypyrrole and a derivative thereof, and polythiophene and a derivative thereof may be illustrated. Organic materials typified by these may be used singly, or may be used to be mixed or stacked in combination of two or more. In organic materials typified by these, a material having peak sensitivity in the wavelength band of each of red color, green color, and blue color may be selected, and thereby a light receiving element that forms a red imaging element, a green imaging element, or a blue imaging element can be formed.

Alternatively, the light control device (light control element) according to the first aspect to the fourth aspect of the present disclosure may be used for a display element and a display device. Specifically, the display element is formed of a light emitting element and a light control device disposed on the light incidence side of the light emitting element, and the light control device is formed of the light control device according to the first aspect to the fourth aspect of the present disclosure. Furthermore, the display device includes display elements arranged in a two-dimensional matrix configuration, the display element is formed of a light emitting element and a light control device disposed on the light incidence side of the light emitting element, and the light control device is formed of the light control device according to the first aspect to the fourth aspect of the present disclosure. A liquid crystal element and an organic EL element may be given as the light emitting element, and a liquid crystal display device and an organic EL display device may be given as the display device.

The light control device according to the first aspect to the fourth aspect of the present disclosure may be used for a head-mounted display (HMD). That is, the display is a head-mounted display including (a) an eyeglass-type frame to be mounted on the head of an observer and (b) an image display device attached to the frame, the image display device includes (A) an image formation device and (B) an optical device that the light emitted from the image formation device is incident on, is guided through, and is emitted from, and the light control device according to the first aspect to the fourth aspect of the present disclosure that adjusts the quantity of external light incident from the outside is disposed in a region of the optical device from which light is emitted.

Additionally, the present technology may also be configured as below.

[A01]«Light Control Device: First Aspect»

A light control device including:

stacked M (provided that M≥1) light control layers in each of which a first nanocarbon film, a first intermediate layer, a dielectric material layer, and a second intermediate layer are stacked; and a second nanocarbon film formed on the second intermediate layer included in an M-th light control layer, wherein a voltage is applied to the first nanocarbon film and the second nanocarbon film.

[A02] The light control device according to [A01], wherein a light transmittance in the light control layer is controlled by a voltage being applied to the first nanocarbon film and the second nanocarbon film.

[A03] The light control device according to [A01] or [A02], wherein when M is an odd number, the first nanocarbon films in odd positions are connected to a first interconnection and the first nanocarbon films in even positions and the second nanocarbon film are connected to a second interconnection, and when M is an even number, the first nanocarbon films in odd positions and the second nanocarbon film are connected to the first interconnection and the first nanocarbon films in even positions are connected to the second interconnection.

[A04] The light control device according to any one of [A01] to [A03], wherein the first nanocarbon film is formed of graphene, carbon nanotubes, or fullerenes and the second nanocarbon film is formed of graphene, carbon nanotubes, or fullerenes.

[A05] The light control device according to any one of [A01] to [A04], wherein a material that forms the first intermediate layer and the second intermediate layer is at least one material selected from the group consisting of titanium dioxide, titanium nitride, chromium oxide, amorphous silicon, magnesium fluoride, silicon nitride, and silicon oxide.

[B01]«Light Control Device: Second Aspect»

A light control device including:

a pair of electrodes; and a light control layer sandwiched by the pair of electrodes, wherein the light control layer has a stacked structure of a first dielectric material layer, a first intermediate layer, a first nanocarbon film doped with an impurity of a first conductivity type or not doped with an impurity, a second nanocarbon film doped with an impurity of a second conductivity type different from the first conductivity type or not doped with an impurity, a second intermediate layer, and a second dielectric material layer, and a voltage is applied to the pair of electrodes.

[B02] The light control device according to [B01], wherein a voltage is applied to the pair of electrodes to control the amount of charge generated in the first nanocarbon film and/or the second nanocarbon film, and thereby a light transmittance in the light control layer is controlled.

[B03] The light control device according to [B01] or [B02], wherein

N light control layers and (N+1) electrodes are provided, the N light control layers and the (N+1) electrodes are alternately stacked, and the electrodes in odd positions are connected to a first interconnection and the electrodes in even positions are connected to a second interconnection.

[B04] The light control device according to any one of [B01] to [B03], wherein the first conductivity type is an n-type and the second conductivity type is a p-type, and a voltage higher than a voltage applied to a second electrode facing the second nanocarbon film via the second dielectric material layer is applied to a first electrode facing the first nanocarbon film via the first dielectric material layer.

[B05] The light control device according to any one of [B01] to [B04], wherein the first nanocarbon film is formed of graphene, carbon nanotubes, or fullerenes and the second nanocarbon film is formed of graphene, carbon nanotubes, or fullerenes.

[B06] The light control device according to any one of [B01] to [B05], wherein a material that forms the first intermediate layer and the second intermediate layer is at least one material selected from the group consisting of titanium dioxide, titanium nitride, chromium oxide, amorphous silicon, magnesium fluoride, silicon nitride, and silicon oxide.

[C01]«Light Control Device: Third Aspect»

A light control device including:

a pair of electrodes; and a light control layer sandwiched by the pair of electrodes, wherein the light control layer has a stacked structure of a first dielectric material layer, a first intermediate layer, a nanocarbon film doped with an impurity or not doped with an impurity, a second intermediate layer, and a second dielectric material layer, and a voltage different from a voltage applied to the pair of electrodes is applied to the nanocarbon film.

[C02] The light control device according to [C01], wherein the impurity is of a p-type and a voltage higher than a voltage applied to the pair of electrodes is applied to the nanocarbon film.

[C03] The light control device according to [C01], wherein
the impurity is of an n-type and
a voltage lower than a voltage applied to the pair of electrodes is applied to the nanocarbon film.

[C04] The light control device according to any one of [C01] to [C03], wherein the nanocarbon film is formed of graphene, carbon nanotubes, or fullerenes.

[C05] The light control device according to any one of [C01] to [C04], wherein a material that forms the first intermediate layer and the second intermediate layer is at least one material selected from the group consisting of titanium dioxide, titanium nitride, chromium oxide, amorphous silicon, magnesium fluoride, silicon nitride, and silicon oxide.

[D01]«Light Control Device: Fourth Aspect»
A light control device including:
a pair of electrodes; and
a stacked structure body in which P (provided that P≥1) light control layers sandwiched by the pair of electrodes are stacked,
wherein a p-th light control layer (provided that 1≤p≤P) has a stacked structure of a first dielectric material layer, a first intermediate layer, a first nanocarbon film doped with an n-type impurity or not doped with an impurity, a second intermediate layer, a second dielectric material layer, a third intermediate layer, a second nanocarbon film doped with a p-type impurity or not doped with an impurity, and a fourth intermediate layer,
a third dielectric material layer is further formed on the fourth intermediate layer in a P-th light control layer, and
a voltage different from a voltage applied to the first nanocarbon film is applied to the second nanocarbon film.

[D02] The light control device according to [D01], wherein a voltage not more than a voltage applied to the second nanocarbon film and not less than a voltage applied to the first nanocarbon film is applied to the pair of electrodes.

[D03] The light control device according to [D01] or [D02], wherein the first nanocarbon films are connected to a first interconnection and the second nanocarbon film are connected to a second interconnection.

[D04] The light control device according to any one of [D01] to [D03], wherein the first nanocarbon film is formed of graphene, carbon nanotubes, or fullerenes and the second nanocarbon film is formed of graphene, carbon nanotubes, or fullerenes.

[D05] The light control device according to any one of [D01] to [D04], wherein a material that forms the first intermediate layer, the second intermediate layer, the third intermediate layer, and the fourth intermediate layer is at least one material selected from the group consisting of titanium dioxide, titanium nitride, chromium oxide, amorphous silicon, magnesium fluoride, silicon nitride, and silicon oxide.

[E01]«Imaging Element: First Aspect»
An imaging element including:
a light receiving element; and
a light control device disposed on a light incidence side of the light receiving element,
wherein the light control device includes
stacked M (provided that M≥1) light control layers in each of which a first nanocarbon film, a first intermediate layer, a dielectric material layer, and a second intermediate layer are stacked, and
a second nanocarbon film formed on the second intermediate layer included in an M-th light control layer, and
a voltage is applied to the first nanocarbon film and the second nanocarbon film.

[E02] The imaging element according to [E01], wherein a light transmittance in the light control layer is controlled by a voltage being applied to the first nanocarbon film and the second nanocarbon film.

[E03] The imaging element according to [E01] or [E02], wherein
when M is an odd number, the first nanocarbon films in odd positions are connected to a first interconnection and the first nanocarbon films in even positions and the second nanocarbon film are connected to a second interconnection, and
when M is an even number, the first nanocarbon films in odd positions and the second nanocarbon film are connected to the first interconnection and the first nanocarbon films in even positions are connected to the second interconnection.

[E04] The imaging element according to any one of [E01] to [E03], wherein the first nanocarbon film is formed of graphene, carbon nanotubes, or fullerenes and the second nanocarbon film is formed of graphene, carbon nanotubes, or fullerenes.

[E05] The imaging element according to any one of [E01] to [E04], wherein a material that forms the first intermediate layer and the second intermediate layer is at least one material selected from the group consisting of titanium dioxide, titanium nitride, chromium oxide, amorphous silicon, magnesium fluoride, silicon nitride, and silicon oxide.

[F01]«Imaging Element: Second Aspect»
An imaging element including:
a light receiving element; and
a light control device disposed on a light incidence side of the light receiving element,
wherein the light control device includes
a pair of electrodes, and
a light control layer sandwiched by the pair of electrodes,
the light control layer has a stacked structure of a first dielectric material layer, a first intermediate layer, a first nanocarbon film doped with an impurity of a first conductivity type or not doped with an impurity, a second nanocarbon film doped with an impurity of a second conductivity type different from the first conductivity type or not doped with an impurity, a second intermediate layer, and a second dielectric material layer, and
a voltage is applied to the pair of electrodes.

[F02] The imaging element according to [F01], wherein a voltage is applied to the pair of electrodes to control the amount of charge generated in the first nanocarbon film and/or the second nanocarbon film, and thereby a light transmittance in the light control layer is controlled.

[F03] The imaging element according to [F01] or [F02], wherein
N light control layers and (N+1) electrodes are provided,
the N light control layers and the (N+1) electrodes are alternately stacked, and
the electrodes in odd positions are connected to a first interconnection and the electrodes in even positions are connected to a second interconnection.

[F04] The imaging element according to any one of [F01] to [F03], wherein
the first conductivity type is an n-type and the second conductivity type is a p-type, and
a voltage higher than a voltage applied to a second electrode facing the second nanocarbon film via the second dielectric material layer is applied to a first electrode facing the first nanocarbon film via the first dielectric material layer.

[F05] The imaging element according to any one of [F01] to [F04], wherein the first nanocarbon film is formed of graphene, carbon nanotubes, or fullerenes and the second nanocarbon film is formed of graphene, carbon nanotubes, or fullerenes.

[F06] The imaging element according to any one of [F01] to [F05], wherein a material that forms the first intermediate layer and the second intermediate layer is at least one material selected from the group consisting of titanium dioxide, titanium nitride, chromium oxide, amorphous silicon, magnesium fluoride, silicon nitride, and silicon oxide.

[G01]«Imaging Element: Third Aspect»

An imaging element including:

a light receiving element; and a light control device disposed on a light incidence side of the light receiving element, wherein the light control device includes a pair of electrodes, and a light control layer sandwiched by the pair of electrodes, the light control layer has a stacked structure of a first dielectric material layer, a first intermediate layer, a nanocarbon film doped with an impurity or not doped with an impurity, a second intermediate layer, and a second dielectric material layer, and a voltage different from a voltage applied to the pair of electrodes is applied to the nanocarbon film.

[G02] The imaging element according to [G01], wherein the impurity is of a p-type and a voltage higher than a voltage applied to the pair of electrodes is applied to the nanocarbon film.

[G03] The imaging element according to [G01], wherein the impurity is of an n-type and a voltage lower than a voltage applied to the pair of electrodes is applied to the nanocarbon film.

[G04] The imaging element according to any one of [G01] to [G03], wherein the nanocarbon film is formed of graphene, carbon nanotubes, or fullerenes.

[G05] The imaging element according to any one of [G01] to [G04], wherein a material that forms the first intermediate layer and the second intermediate layer is at least one material selected from the group consisting of titanium dioxide, titanium nitride, chromium oxide, amorphous silicon, magnesium fluoride, silicon nitride, and silicon oxide.

[H01]«Imaging Element: Fourth Aspect»

An imaging element including:

a light receiving element; and a light control device disposed on a light incidence side of the light receiving element, wherein the light control device includes a pair of electrodes, and a stacked structure body in which P (provided that P≥1) light control layers sandwiched by the pair of electrodes are stacked, a p-th light control layer (provided that 1≤p≤P) has a stacked structure of a first dielectric material layer, a first intermediate layer, a first nanocarbon film doped with an n-type impurity or not doped with an impurity, a second intermediate layer, a second dielectric material layer, a third intermediate layer, a second nanocarbon film doped with a p-type impurity or not doped with an impurity, and a fourth intermediate layer, a third dielectric material layer is further formed on the fourth intermediate layer in a P-th light control layer, and a voltage different from a voltage applied to the first nanocarbon film is applied to the second nanocarbon film.

[H02] The imaging element according to [H01], wherein a voltage not more than a voltage applied to the second nanocarbon film and not less than a voltage applied to the first nanocarbon film is applied to the pair of electrodes.

[H03] The imaging element according to [H01] or [H02], wherein the first nanocarbon films are connected to a first interconnection and the second nanocarbon film are connected to a second interconnection.

[H04] The imaging element according to any one of [H01] to [H03], wherein the first nanocarbon film is formed of graphene, carbon nanotubes, or fullerenes and the second nanocarbon film is formed of graphene, carbon nanotubes, or fullerenes.

[H05] The imaging element according to any one of [H01] to [H04], wherein a material that forms the first intermediate layer, the second intermediate layer, the third intermediate layer, and the fourth intermediate layer is at least one material selected from the group consisting of titanium dioxide, titanium nitride, chromium oxide, amorphous silicon, magnesium fluoride, silicon nitride, and silicon oxide.

[J01] The imaging element according to any one of [E01] to [H05], wherein a color filter layer is disposed on a light incidence side of the light receiving element.

[J02] The imaging element according to [J01], wherein the color filter layer is disposed on a light incidence side of the light control device.

[J03] The imaging element according to any one of [E01] to [J02], further including a light blocking film.

[K01]«Imaging Device: First Aspect»

An imaging device including imaging elements arranged in a two-dimensional matrix configuration, wherein at least part of the imaging elements arranged in a two-dimensional matrix configuration include a light receiving element and a light control device disposed on a light incidence side of the light receiving element, the light control device includes stacked M (provided that M≥1) light control layers in each of which a first nanocarbon film, a first intermediate layer, a dielectric material layer, and a second intermediate layer are stacked, and a second nanocarbon film formed on the second intermediate layer included in an M-th light control layer, and a voltage is applied to the first nanocarbon film and the second nanocarbon film.

[K02] The imaging device according to [K01], wherein a light transmittance in the light control layer is controlled by a voltage being applied to the first nanocarbon film and the second nanocarbon film.

[K03] The imaging device according to [K01] or [K02], wherein when M is an odd number, the first nanocarbon films in odd positions are connected to a first interconnection and the first nanocarbon films in even positions and the second nanocarbon film are connected to a second interconnection, and when M is an even number, the first nanocarbon films in odd positions and the second nanocarbon film are connected to the first interconnection and the first nanocarbon films in even positions are connected to the second interconnection.

[K04] The imaging device according to any one of [K01] to [K03], wherein the first nanocarbon film is formed of graphene, carbon nanotubes, or fullerenes and the second nanocarbon film is formed of graphene, carbon nanotubes, or fullerenes.

[K05] The imaging device according to any one of [K01] to [K04], wherein a material that forms the first intermediate layer and the second intermediate layer is at least one material selected from the group consisting of titanium dioxide, titanium nitride, chromium oxide, amorphous silicon, magnesium fluoride, silicon nitride, and silicon oxide.

[L01]«Imaging Device: Second Aspect»

An imaging device including imaging elements arranged in a two-dimensional matrix configuration, wherein at least part of the imaging elements arranged in a two-dimensional matrix configuration include a light receiving element and a light control device disposed on a light incidence side of the light receiving element, the light control device includes a pair of electrodes and a light control layer sandwiched by the pair of electrodes, the light control layer has a stacked structure of a first dielectric material layer, a first intermediate layer, a first nanocarbon film doped with an impurity of a first conductivity type or not doped with an impurity, a second nanocarbon film doped with an impurity of a second conductivity type different from the first conductivity type or not doped with an impurity, a second intermediate layer, and a second dielectric material layer, and a voltage is applied to the pair of electrodes.

[L02] The imaging device according to [L01], wherein a voltage is applied to the pair of electrodes to control the amount of charge generated in the first nanocarbon film and/or the second nanocarbon film, and thereby a light transmittance in the light control layer is controlled.

[L03] The imaging device according to [L01] or [L02], wherein

N light control layers and (N+1) electrodes are provided, the N light control layers and the (N+1) electrodes are alternately stacked, and the electrodes in odd positions are connected to a first interconnection and the electrodes in even positions are connected to a second interconnection.

[L04] The imaging device according to any one of [L01] to [L03], wherein the first conductivity type is an n-type and the second conductivity type is a p-type, and a voltage higher than a voltage applied to a second electrode facing the second nanocarbon film via the second dielectric material layer is applied to a first electrode facing the first nanocarbon film via the first dielectric material layer.

[L05] The imaging device according to any one of [L01] to [L04], wherein the nanocarbon film is formed of graphene, carbon nanotubes, or fullerenes.

[L06] The imaging device according to any one of [L01] to [L05], wherein a material that forms the first intermediate layer and the second intermediate layer is at least one material selected from the group consisting of titanium dioxide, titanium nitride, chromium Oxide, Amorphous Silicon, Magnesium Fluoride, Silicon Nitride, and Silicon Oxide.

[M01]«Imaging Device: Third Aspect»

An imaging device including imaging elements arranged in a two-dimensional matrix configuration, wherein at least part of the imaging elements arranged in a two-dimensional matrix configuration include a light receiving element and a light control device disposed on a light incidence side of the light receiving element, the light control device includes a pair of electrodes and a light control layer sandwiched by the pair of electrodes, the light control layer has a stacked structure of a first dielectric material layer, a first intermediate layer, a nanocarbon film doped with an impurity or not doped with an impurity, a second intermediate layer, and a second dielectric material layer, and a voltage different from a voltage applied to the pair of electrodes is applied to the nanocarbon film.

[M02] The imaging device according to [M01], wherein the impurity is of a p-type and a voltage higher than a voltage applied to the pair of electrodes is applied to the nanocarbon film.

[M03] The imaging device according to [M01], wherein the impurity is of an n-type and a voltage lower than a voltage applied to the pair of electrodes is applied to the nanocarbon film.

[M04] The imaging device according to any one of [M01] to [M03], wherein the nanocarbon film is formed of graphene, carbon nanotubes, or fullerenes.

[M05] The imaging device according to any one of [M01] to [M04], wherein a material that forms the first intermediate layer and the second intermediate layer is at least one material selected from the group consisting of titanium dioxide, titanium nitride, chromium oxide, amorphous silicon, magnesium fluoride, silicon nitride, and silicon oxide.

[N01]«Imaging Device: Fourth Aspect»

An imaging device including imaging elements arranged in a two-dimensional matrix configuration, wherein at least part of the imaging elements arranged in a two-dimensional matrix configuration include a light receiving element and a light control device disposed on a light incidence side of the light receiving element, the light control device includes a pair of electrodes and a stacked structure body in which P (provided that P≥1) light control layers sandwiched by the pair of electrodes are stacked, a p-th light control layer (provided that 1≤p≤P) has a stacked structure of a first dielectric material layer, a first intermediate layer, a first nanocarbon film doped with an n-type impurity or not doped with an impurity, a second intermediate layer, a second dielectric material layer, a third intermediate layer, a second nanocarbon film doped with a p-type impurity or not doped with an impurity, and a fourth intermediate layer, a third dielectric material layer is further formed on the fourth intermediate layer in a P-th light control layer, and a voltage different from a voltage applied to the first nanocarbon film is applied to the second nanocarbon film.

[N02] The imaging device according to [N01], wherein a voltage not more than a voltage applied to the second nanocarbon film and not less than a voltage applied to the first nanocarbon film is applied to the pair of electrodes.

[N03] The imaging device according to [N01] or [N02], wherein the first nanocarbon films are connected to a first interconnection and the second nanocarbon film are connected to a second interconnection.

[N04] The imaging device according to any one of [N01] to [N03], wherein the first nanocarbon film is formed of graphene, carbon nanotubes, or fullerenes and the second nanocarbon film is formed of graphene, carbon nanotubes, or fullerenes.

[N05] The imaging device according to any one of [N01] to [N04], wherein a material that forms the first intermediate layer, the second intermediate layer, the third intermediate layer, and the fourth intermediate layer is at least one material selected from the group consisting of titanium dioxide, titanium nitride, chromium oxide, amorphous silicon, magnesium fluoride, silicon nitride, and silicon oxide.

[P01] The imaging device according to any one of [L01] to [N02], wherein the pair of electrodes are shared between imaging elements including the light control device

[P02] The imaging device according to any one of [L01] to [N05], wherein the pair of electrodes shared between imaging elements including the light control device are provided to be also shared with an imaging element not including the light control device is possible.

[P03] The imaging device according to any one of [K01] to [P02], wherein a color filter layer is disposed on a light incidence side of a light receiving element.

[P04] The imaging device according to [P03], wherein in the imaging element including the light control device, the color filter layer is disposed on a light incidence side of the light control device.

[P05] The imaging device according to any one of [K01] to [P04], wherein the imaging element further includes a light blocking film.

[P06] The imaging device according to any one of [K01] to [P05], wherein
the light control device is provided in imaging elements arranged on a row basis,
the light control device is provided in imaging elements arranged on a column basis, or
the light control device is provided in all the imaging elements.

[Q01] The imaging device according to any one of [K01] to [P06], further including a random pulse voltage generation and transmission device configured to generate a random pulse voltage on the basis of a signal processing algorithm and transmit the generated random pulse voltage to the imaging element including the light control device.

[Q02] The imaging device according to [Q01], wherein one random pulse voltage generation and transmission device is disposed for a plurality of imaging elements including the light control device.

[Q03] The imaging device according to [Q01] or [Q02], wherein the random pulse voltage has positive and negative polarities.

[Q04] The imaging device according to any one of [K01] to [P06], wherein a pulse voltage calculated on the basis of an output signal obtained by the imaging element including the light control device is applied.

[Q05] The imaging device according to any one of [K01] to [Q04], wherein image output signals from the imaging elements including the light control device are thinned out spatially and temporally, and thereby the image output signals are compressed.

[R01] The imaging device according to any one of [K01] to [P06], wherein
imaging elements arranged in a two-dimensional matrix configuration are provided on a first semiconductor chip,
a random pulse voltage generation and transmission device configured to generate a random pulse voltage and transmit the generated random pulse voltage to the imaging element including the light control device is provided on a second semiconductor chip,
the first semiconductor chip and the second semiconductor chip are stacked, and
the light control device and the random pulse voltage generation and transmission device are connected via a through-silicon via or via bumps.

[R02] The imaging device according to [R01], wherein the imaging element is of a back-side illumination type.

[R03] The imaging device according to any one of [K01] to [R02], wherein
a random pulse voltage generation and transmission device configured to generate a random pulse voltage and transmit the generated random pulse voltage to the imaging element including the light control device is provided, and
the light control device and the random pulse voltage generation and transmission device are connected by a connection line formed of a nanocarbon film or a transparent conductive material layer.

[R04] The imaging device according to any one of [K01] to [R03], wherein
imaging elements are arranged in a two-dimensional matrix configuration in a first direction and a second direction,
a first nanocarbon film extends in the first direction and is shared between imaging elements arranged in the first direction,
a second nanocarbon film extends in the second direction and is shared between imaging elements arranged in the second direction, and
a positive-polarity random pulse voltage is applied to the first nanocarbon film and a negative-polarity random pulse voltage is applied to the second nanocarbon film.

[R05] The imaging device according to [R04], wherein
an end portion of the first nanocarbon film extending in a first direction is patterned in a comb electrode configuration and
an end portion of the second nanocarbon film extending in a second direction is patterned in a comb electrode configuration.

[S01]«Light Transmittance Control Method for Light Control Device: First Aspect»
A light transmittance control method for a light control device (light control element) including:
stacked M (provided that M≥1) light control layers in each of which a first nanocarbon film, a first intermediate layer, a dielectric material layer, and a second intermediate layer are stacked; and
a second nanocarbon film formed on the second intermediate layer included in an M-th light control layer,
wherein, device light of a wavelength not less than a wavelength $\lambda_0$ is allowed to pass at a higher light transmittance than light of a wavelength less than the wavelength $\lambda_0$ by applying a prescribed voltage $V_0$ between the first nanocarbon film and the second nanocarbon film,
the method including controlling an effective light transmittance of the light control layer for light of a wavelength not less than the wavelength $\lambda_0$ by changing a duty ratio of the pulsed prescribed voltage $V_0$.

[S02] The light transmittance control method for a light control device according to [S01], wherein
when M is an odd number, the first nanocarbon films in odd positions are connected to a first interconnection and the first nanocarbon films in even positions and the second nanocarbon film are connected to a second interconnection, and
when M is an even number, the first nanocarbon films in odd positions and the second nanocarbon film are connected to the first interconnection and the first nanocarbon films in even positions are connected to the second interconnection.

[T01]«Light Transmittance Control Method for Light Control Device: Second Aspect»
A light transmittance control method for a light control device (light control element) including:
a pair of electrodes; and
a light control layer sandwiched by the pair of electrodes,
wherein the light control layer has a stacked structure of a first dielectric material layer, a first intermediate layer, a first nanocarbon film doped with an impurity of a first conductivity type or not doped with an impurity, a second nanocarbon film doped with an impurity of a second conductivity type different from the first conductivity type or not doped with an impurity, a second intermediate layer, and a second dielectric material layer, device light of a wavelength not less than a wavelength $\lambda_0$ is allowed to pass at a higher light transmittance than light of a wavelength less than the wavelength $\lambda_0$ by applying a prescribed voltage $V_0$ between the pair of electrodes, and the method including controlling an effective light transmittance of the light control layer for light of a wavelength not less than the wavelength $\lambda_0$ by changing a duty ratio of the pulsed prescribed voltage $V_0$.

[T02] The light transmittance control method for a light control device according to [T01], wherein N light control layers and (N+1) electrodes are provided, the N light control layers and the (N+1) electrodes are alternately stacked, and the electrodes in odd positions are connected to a first interconnection and the electrodes in even positions are connected to a second interconnection.

[T03] The light transmittance control method for a light control device according to [T01] or [T02], wherein the first conductivity type is an n-type and the second conductivity type is a p-type, and a voltage higher than a voltage applied to a second electrode facing the second nanocarbon film via the second dielectric material layer is applied to a first electrode facing the first nanocarbon film via the first dielectric material layer.

[V01]«Light Transmittance Control Method for Light Control Device: Third Aspect»

A light transmittance control method for a light control device (light control element) including:

a pair of electrodes; and a light control layer sandwiched by the pair of electrodes, wherein the light control layer has a stacked structure of a first dielectric material layer, a first intermediate layer, a nanocarbon film doped with an impurity or not doped with an impurity, a second intermediate layer, and a second dielectric material layer, device light of a wavelength not less than a wavelength $\lambda_0$ is allowed to pass at a higher light transmittance than light of a wavelength less than the wavelength $\lambda_0$ by applying a prescribed voltage $V_0$ between the pair of electrodes and the nanocarbon film, and the method including controlling an effective light transmittance of the light control layer for light of a wavelength not less than the wavelength $\lambda_0$ by changing a duty ratio of the pulsed prescribed voltage $V_0$.

[V02] The light transmittance control method for a light control device according to [V01], wherein the impurity is of a p-type and a voltage higher than a voltage applied to the pair of electrodes is applied to the nanocarbon film.

[V03] The light transmittance control method for a light control device according to [V01], wherein the impurity is of an n-type and a voltage lower than a voltage applied to the pair of electrodes is applied to the nanocarbon film.

[W01] A light transmittance control method for a light control device (light control element), the light control device including a pair of electrodes and a stacked structure body in which P (provided that P≥1) light control layers sandwiched by the pair of electrodes are stacked, in which device a p-th light control layer (provided that 1≤p≤P) has a stacked structure of a first dielectric material layer, a first intermediate layer, a first nanocarbon film doped with an n-type impurity or not doped with an impurity, a second intermediate layer, a second dielectric material layer, a third intermediate layer, a second nanocarbon film doped with a p-type impurity or not doped with an impurity, and a fourth intermediate layer, a third dielectric material layer is further formed on the fourth intermediate layer in a P-th light control layer, and light of a wavelength not less than a wavelength $\lambda_0$ is allowed to pass at a higher light transmittance than light of a wavelength less than the wavelength $\lambda_0$ by applying a prescribed voltage $V_0$ between the first nanocarbon film and the second nanocarbon film, the method including controlling an effective light transmittance of the light control layer for light of a wavelength not less than the wavelength $\lambda_0$ by changing a duty ratio of the pulsed prescribed voltage $V_0$.

[W02] The light transmittance control method for a light control device according to [W01], wherein a voltage not more than a voltage applied to the second nanocarbon film and not less than a voltage applied to the first nanocarbon film is applied to the pair of electrodes.

REFERENCE SIGNS LIST 100, 200, 200', $300_1$, $300_2$, 400 light control device
211, 212, 311, 312, 411,412 electrode
113, 113M, 213, 313, 413 light control layer
413' stacked structure body of light control layers
114, 214, 314, 414 first nanocarbon film
115, 215, 415 second nanocarbon film
116 dielectric material layer
216A, 316A, 416A first dielectric material layer
216B, 316B, 416B second dielectric material layer
416C third dielectric material layer
117A, 217A, 317A, 417A first intermediate layer
117B, 217B, 317B, 417B second intermediate layer
417C third intermediate layer
417D fourth intermediate layer
118, 218, 418 first interconnection
119, 219, 419 second interconnection
$20_1$, $20_2$ imaging element
21 light control device
22 silicon semiconductor substrate
23 interlayer insulating film
24 protective film
25 color filter layer (or planarization film)
26 condensing lens (on-chip lens)
27 light receiving element (photosensor, photodiode, or photoelectric conversion element)
28 light blocking film
29A interlayer insulating layer
29B protective film
31 vertical scan circuit
32 horizontal scan circuit
33 horizontal transfer circuit
41 stored charge detection circuit
42 voltage holding capacity
511 first semiconductor chip
512 imaging element 521 second semiconductor chip
522 random pulse voltage generation and transmission device
523 various circuits
531 through-silicon via (TSV)
532 pad unit
$R_1$, $R_0$, $G_1$, $G_0$, $B_1$, $B_0$ imaging element

The invention claimed is:
1. A light control device, comprising:
stacked M light control layers, wherein a first nanocarbon film, a first intermediate layer, a dielectric material layer, and a second intermediate layer are stacked in each of the stacked M light control layers, and wherein $M \geq 1$; and
a second nanocarbon film on the second intermediate layer included in an M-th light control layer of the stacked M light control layers, wherein
a voltage is applied to the first nanocarbon film and the second nanocarbon film,
a light transmittance in each of the stacked M light control layers is controlled by the voltage,
the first nanocarbon film in an odd position is connected to a first interconnection based on an odd numbered M,
the first nanocarbon film in an even position and the second nanocarbon film are connected to a second interconnection based on the odd numbered M,
the first nanocarbon film in the odd position and the second nanocarbon film are connected to the first interconnection based on an even numbered M,
the first nanocarbon film in the even position is connected to the second interconnection based on the even numbered M, and
the first nanocarbon film in the odd position is different from the first nanocarbon film in the even position.
2. A light control device, comprising:
a first electrode;
a second electrode; and
a light control layer sandwiched between the first electrode and the second electrode, wherein
the light control layer has a stacked structure of a first dielectric material layer, a first intermediate layer, a first nanocarbon film doped with an impurity of an n-type, a second nanocarbon film doped with an impurity of a p-type, a second intermediate layer, and a second dielectric material layer,
the first electrode faces the first nanocarbon film,
the first dielectric material layer is between the first electrode and the first nanocarbon film,
the second electrode faces the second nanocarbon film,
the second dielectric material layer is between the second electrode and the second nanocarbon film,
a first voltage is applied to the first electrode,
a second voltage is applied to the second electrode, and
the first voltage is higher than the second voltage.
3. The light control device according to claim 2, wherein
an amount of charge generated in at least one of the first nanocarbon film or the second nanocarbon film is based on the first voltage and the second voltage, and
a light transmittance in the light control layer is controlled based on the amount of charge.
4. The light control device according to claim 2, further comprising N light control layers and (N+1) electrodes, wherein
the (N+1) electrodes include a first set of electrodes and a second set of electrodes,
the N light control layers and the (N+1) electrodes are alternately stacked, and
the first set of electrodes in odd positions are connected to a first interconnection and the second set of electrodes in even positions are connected to a second interconnection.
5. A light control device, comprising:
a pair of electrodes; and
a light control layer sandwiched by the pair of electrodes, wherein
the light control layer has a stacked structure of a first dielectric material layer, a first intermediate layer, a nanocarbon film doped with an impurity, a second intermediate layer, and a second dielectric material layer,
a first voltage is applied to the nanocarbon film, and
a second voltage different from the first voltage is applied to the pair of electrodes.
6. A light control device, comprising:
a pair of electrodes; and
a stacked structure body in which P light control layers sandwiched by the pair of electrodes are stacked, wherein
a p-th light control layer of the P light control layers has a stacked structure of a first dielectric material layer, a first intermediate layer, a first nanocarbon film doped with an n-type impurity, a second intermediate layer, a second dielectric material layer, a third intermediate layer, a second nanocarbon film doped with a p-type impurity, and a fourth intermediate layer,
a third dielectric material layer is on the fourth intermediate layer in a P-th light control layer of the P light control layers,
a first voltage different from a second voltage is applied to the second nanocarbon film,
the second voltage is applied to the first nanocarbon film, and $1 \leq p \leq P$.
7. The light control device according to claim 6, wherein each of the first nanocarbon film and the second nanocarbon film comprises graphene.
8. An imaging element, comprising:
a light receiving element; and
a light control device on a light incidence side of the light receiving element,
wherein the light control device includes:
stacked M light control layers, wherein a first nanocarbon film, a first intermediate layer, a dielectric material layer, and a second intermediate layer are stacked in each of the stacked M light control layers, and wherein $M \geq 1$; and
a second nanocarbon film on the second intermediate layer included in an M-th light control layer of the stacked M light control layers, wherein
a voltage is applied to the first nanocarbon film and the second nanocarbon film,
a light transmittance in each of the stacked M light control layers is controlled by the voltage,
the first nanocarbon film in an odd position is connected to a first interconnection based on an odd numbered M,
the first nanocarbon film in an even position and the second nanocarbon film are connected to a second interconnection based on the odd numbered M, the first nanocarbon film in the odd position and the second nanocarbon film are connected to the first interconnection based on an even numbered M, the first nanocarbon film in the even position is connected to the second interconnection based on the even numbered M, and the first nanocarbon film in the odd position is different from the first nanocarbon film in the even position.

9. An imaging element, comprising:
a light receiving element; and
a light control device on a light incidence side of the light receiving element,
wherein the light control device includes:
a pair of electrodes, and
a light control layer sandwiched by the pair of electrodes,
wherein the light control layer has a stacked structure of a first dielectric material layer, a first intermediate layer, a first nanocarbon film doped with an impurity of a first conductivity type, a second nanocarbon film doped with an impurity of a second conductivity type different from the first conductivity type, a second intermediate layer, and a second dielectric material layer, and
wherein a voltage is applied to the pair of electrodes.

10. An imaging element, comprising:
a light receiving element; and
a light control device on a light incidence side of the light receiving element,
wherein the light control device includes:
a pair of electrodes; and
a light control layer sandwiched by the pair of electrodes,
wherein the light control layer has a stacked structure of a first dielectric material layer, a first intermediate layer, a nanocarbon film doped with an impurity, a second intermediate layer, and a second dielectric material layer,
wherein a first voltage is applied to the nanocarbon film, and
wherein a second voltage different from the first voltage is applied to the pair of electrodes.

11. An imaging element, comprising:
a light receiving element; and
a light control device on a light incidence side of the light receiving element,
wherein the light control device includes:
a pair of electrodes; and
a stacked structure body in which P light control layers sandwiched by the pair of electrodes are stacked,
wherein a p-th light control layer of the P light control layers has a stacked structure of a first dielectric material layer, a first intermediate layer, a first nanocarbon film doped with an n-type impurity, a second intermediate layer, a second dielectric material layer, a third intermediate layer, a second nanocarbon film doped with a p-type impurity, and a fourth intermediate layer,
wherein a third dielectric material layer is on the fourth intermediate layer in a P-th light control layer of the P light control layers,
wherein a first voltage different from a second voltage is applied to the second nanocarbon film, wherein the second voltage is applied to the first nanocarbon film, and wherein $1 \leq p \leq P$.

12. An imaging device, comprising:
a plurality of imaging elements in a two-dimensional matrix configuration,
wherein at least part of the plurality of imaging elements includes a light receiving element and a light control device on a light incidence side of the light receiving element,
wherein the light control device includes:
stacked M light control layers, wherein a first nanocarbon film, a first intermediate layer, a dielectric material layer, and a second intermediate layer are stacked in each of the stacked M light control layers, and wherein $M \geq 1$; and
a second nanocarbon film on the second intermediate layer included in an M-th light control layer of the stacked M light control layers, wherein
a voltage is applied to the first nanocarbon film and the second nanocarbon film,
a light transmittance in each of the stacked M light control layers is controlled by the voltage,
the first nanocarbon film in an odd position is connected to a first interconnection based on an odd numbered M,
the first nanocarbon film in an even position and the second nanocarbon film are connected to a second interconnection based on the odd numbered M,
the first nanocarbon film in the odd position and the second nanocarbon film are connected to the first interconnection based on an even numbered M,
the first nanocarbon film in the even position is connected to the second interconnection based on the even numbered M, and
the first nanocarbon film in the odd position is different from the first nanocarbon film in the even position.

13. An imaging device, comprising:
a plurality of imaging elements in a two-dimensional matrix configuration,
wherein at least part of the plurality of imaging elements includes a light receiving element and a light control device on a light incidence side of the light receiving element,
wherein the light control device includes:
a pair of electrodes; and
a light control layer sandwiched by the pair of electrodes,
wherein the light control layer has a stacked structure of a first dielectric material layer, a first intermediate layer, a first nanocarbon film doped with an impurity of a first conductivity type, a second nanocarbon film doped with an impurity of a second conductivity type different from the first conductivity type, a second intermediate layer, and a second dielectric material layer, and
wherein a voltage is applied to the pair of electrodes.

14. An imaging device, comprising:
a plurality of imaging elements in a two-dimensional matrix configuration,
wherein at least part of the imaging elements includes a light receiving element and a light control device on a light incidence side of the light receiving element, wherein the light control device includes:
a pair of electrodes; and
a light control layer sandwiched by the pair of electrodes,
wherein the light control layer has a stacked structure of a first dielectric material layer, a first intermediate layer, a nanocarbon film doped with an impurity, a second intermediate layer, and a second dielectric material layer,
wherein a first voltage different from a second voltage is applied to the nanocarbon film, and
wherein the second voltage is applied to the pair of electrodes.

15. An imaging device, comprising:
a plurality of imaging elements in a two-dimensional matrix configuration,
wherein at least part of the plurality of imaging elements includes a light receiving element and a light control device on a light incidence side of the light receiving element,
wherein the light control device includes:
a pair of electrodes; and
a stacked structure body in which P light control layers sandwiched by the pair of electrodes are stacked,
wherein a p-th light control layer of the P light control layers has a stacked structure of a first dielectric material layer, a first intermediate layer, a first nanocarbon film doped with an n-type impurity, a second intermediate layer, a second dielectric material layer, a third intermediate layer, a second nanocarbon film doped with a p-type impurity, and a fourth intermediate layer,
wherein a third dielectric material layer is on the fourth intermediate layer in a P-th light control layer of the P light control layers,
wherein a first voltage different from a second voltage is applied to the second nanocarbon film,
wherein the second voltage is applied to the first nanocarbon film, and wherein $P \geq 1$ and $1 \leq p \leq P$.

16. The imaging device according to claim 15, further comprising a random pulse voltage generation and transmission device configured to:
generate a random pulse voltage based on a signal processing algorithm; and
transmit the generated random pulse voltage to the plurality of imaging elements.

17. The imaging device according to claim 15 wherein a calculation of a pulse voltage is based on an output signal obtained by the plurality of imaging elements.

18. The imaging device according to claim 15, wherein
the plurality of imaging elements is on a first semiconductor chip,
the imaging device further comprises a random pulse voltage generation and transmission device configured to:
generate a random pulse voltage; and
transmit the generated random pulse voltage to the plurality of imaging elements,
the random pulse voltage generation and transmission device is on a second semiconductor chip,
the first semiconductor chip and the second semiconductor chip are stacked, and
the light control device and the random pulse voltage generation and transmission device are connected via a through-silicon via.

19. The imaging device according to claim 15, further comprising a random pulse voltage generation and transmission device configured to generate a random pulse voltage and transmit the generated random pulse voltage to the plurality of imaging elements, wherein
the light control device and the random pulse voltage generation and transmission device are connected by a connection line, and
the connection line comprises one of a nanocarbon film or a transparent conductive material layer.

20. The imaging device according to claim 15, wherein
the plurality of imaging elements are in the two-dimensional matrix configuration in a first direction and a second direction,
the first nanocarbon film extends in the first direction and is shared between a first set of imaging elements of the plurality of imaging elements in the first direction,
the second nanocarbon film extends in the second direction and is shared between a second set of imaging elements of the plurality of imaging elements in the second direction,
a positive-polarity random pulse voltage is applied to the first nanocarbon film, and
a negative-polarity random pulse voltage is applied to the second nanocarbon film.

* * * * *